(12) United States Patent
Takeuchi et al.

(10) Patent No.: US 7,161,281 B2
(45) Date of Patent: Jan. 9, 2007

(54) LESS-DUST-GENERATIVE PIEZOELECTRIC/ELECTROSTRICTIVE DEVICE AND MANUFACTURING METHOD

(75) Inventors: Yukihisa Takeuchi, Nishikamo-Gun (JP); Koji Kimura, Nagoya (JP); Tatsuo Kawaguchi, Motosu-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 176 days.

(21) Appl. No.: 10/678,849

(22) Filed: Oct. 3, 2003

(65) Prior Publication Data

US 2004/0070315 A1  Apr. 15, 2004

(30) Foreign Application Priority Data

| Oct. 10, 2002 | (JP) | ............................. 2002-297039 |
| Dec. 16, 2002 | (JP) | ............................. 2002-363736 |
| Aug. 11, 2003 | (JP) | ............................. 2003-207186 |

(51) Int. Cl.
   *H01L 41/08* (2006.01)
(52) U.S. Cl. ...................... 310/334; 310/322
(58) Field of Classification Search ............... 310/311, 310/322, 328, 334
   See application file for complete search history.

(56) References Cited

U.S. PATENT DOCUMENTS

| 3,597,642 | A | * | 8/1971 | Kurino ........................ 310/322 |
| 5,585,956 | A | * | 12/1996 | Lee et al. .................... 359/224 |
| 5,616,982 | A | * | 4/1997 | Um et al. .................... 310/328 |
| 5,631,764 | A | * | 5/1997 | Chae .......................... 359/224 |
| 5,682,260 | A | * | 10/1997 | Jeon .......................... 359/224 |
| 5,708,521 | A | * | 1/1998 | Jeon et al. .................. 359/224 |
| 6,222,303 | B1 | * | 4/2001 | Nakamura et al. ........... 310/328 |
| 6,278,223 | B1 | | 8/2001 | Sasaki et al. |
| 6,361,151 | B1 | | 3/2002 | Shigemura |
| 6,387,713 | B1 | * | 5/2002 | Hara ............................. 438/3 |
| 6,618,943 | B1 | * | 9/2003 | Ashe et al. ................. 29/890.1 |
| 6,720,715 | B1 | * | 4/2004 | Bicz ........................... 310/367 |
| 6,794,723 | B1 | * | 9/2004 | Takeuchi et al. ............ 257/415 |
| 2002/0140318 | A1 | * | 10/2002 | Takeuchi et al. ............ 310/320 |
| 2003/0001454 | A1 | * | 1/2003 | Takeuchi et al. ............ 310/311 |
| 2003/0098632 | A1 | * | 5/2003 | Takeuchi et al. ............ 310/328 |
| 2004/0104979 | A1 | * | 6/2004 | Takeuchi et al. .............. 347/68 |
| 2004/0201324 | A1 | * | 10/2004 | Takeuchi et al. ............ 310/328 |
| 2005/0102807 | A1 | * | 5/2005 | Takeuchi et al. ........... 29/25.35 |

FOREIGN PATENT DOCUMENTS

| EP | 0 936 684 | 8/1999 |
| EP | 1 432 048 | 6/2004 |
| JP | 03-243358 | 10/1991 |
| JP | 3-261379 | * 11/1991 ................. 310/311 |

(Continued)

*Primary Examiner*—Thomas M. Dougherty
(74) *Attorney, Agent, or Firm*—Burr & Brown

(57) ABSTRACT

There is disclosed a piezoelectric/electrostrictive device being less-particle-generative and capable of continuously realizing a stable displacement operation over a long period of time or being large in displacement amount and high in generative force and the like. This less-dust-generative piezoelectric/electrostrictive device 1 comprises a plurality of piezoelectric/electrostrictive elements 31 including a plurality of piezoelectric/electrostrictive members 4 and at least one pair of electrodes formed on the side surface of each piezoelectric/electrostrictive member 4, and the members are set up on a thick ceramic substrate 2. In this less-dust-generative matrix-type piezoelectric/electrostrictive device 1, a plurality of piezoelectric/electrostrictive elements 31 substantially having pillar shapes are set up in a matrix form. The ceramic substrate 2 is formed integrally with the piezoelectric/electrostrictive elements 31. The side surface of each piezoelectric/electrostrictive member 4 on which the electrodes 18, 19 are formed are formed as a fired, but unprocessed face.

14 Claims, 16 Drawing Sheets

FOREIGN PATENT DOCUMENTS

| | | | |
|---|---|---|---|
| JP | 10-244668 | * | 9/1998 |
| JP | 11-132769 | * | 5/1999 |
| JP | 11-207955 | * | 8/1999 |
| JP | 11-227189 | | 8/1999 |
| JP | 2000-25241 | * | 1/2000 |
| JP | 2000-124516 | * | 4/2000 |
| JP | 2000-324599 | * | 11/2000 |
| JP | 2000-337882 | * | 12/2000 |
| JP | 2004-195808 | * | 7/2004 |
| JP | 2005-150384 | * | 6/2005 |
| WO | 03/028123 | | 4/2003 |

* cited by examiner

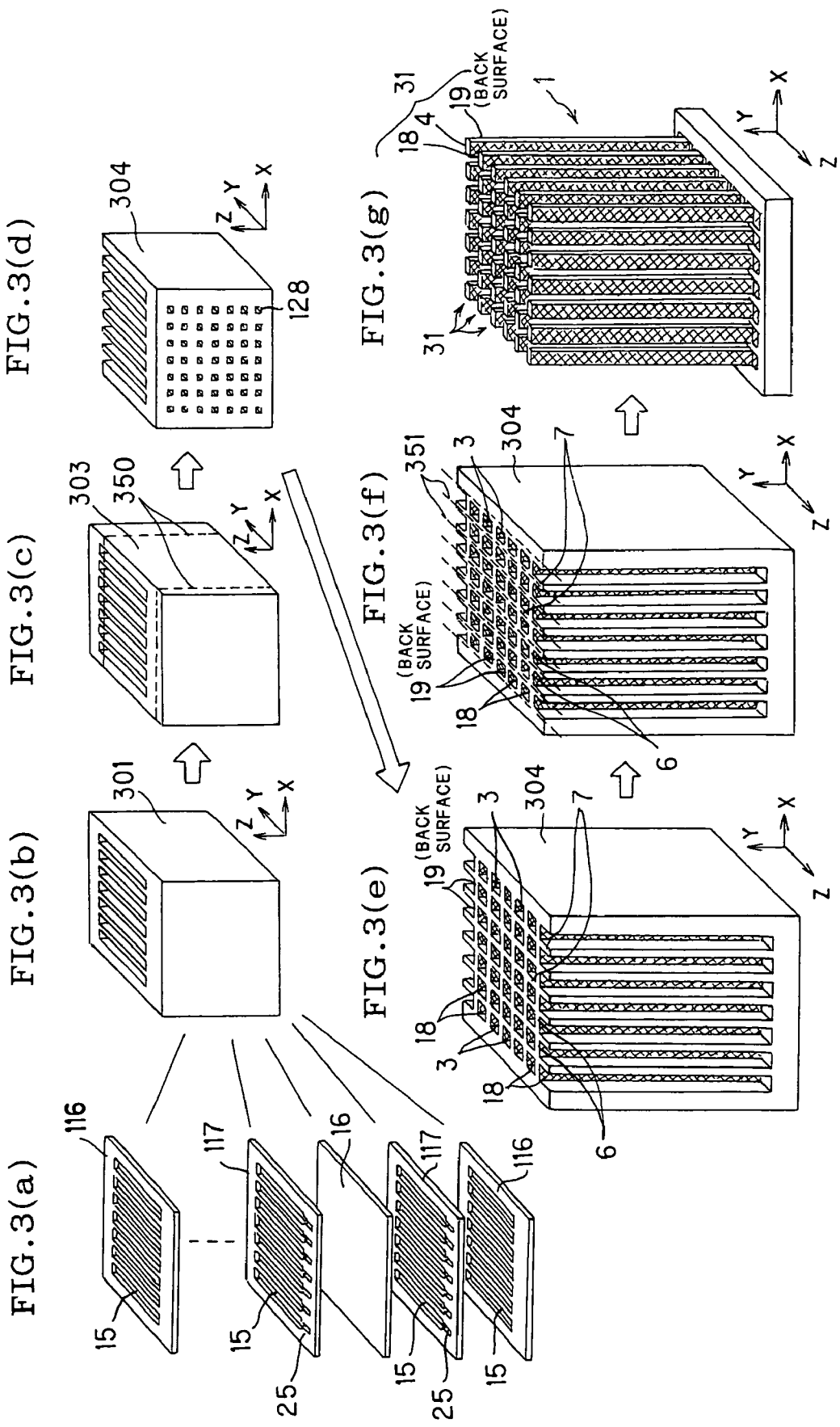

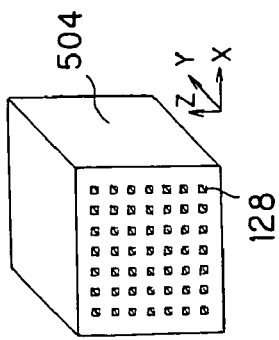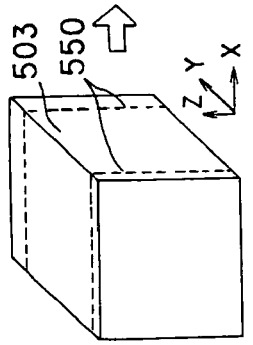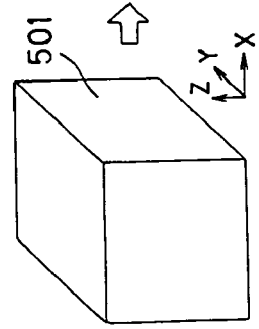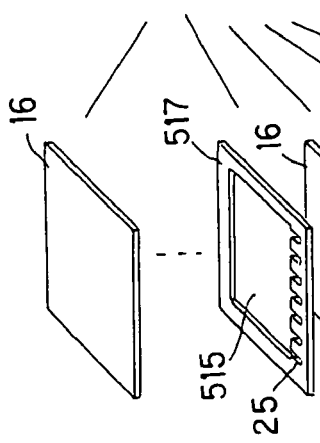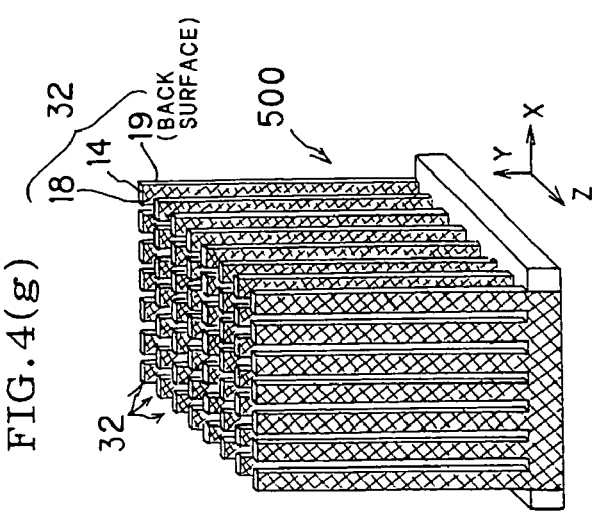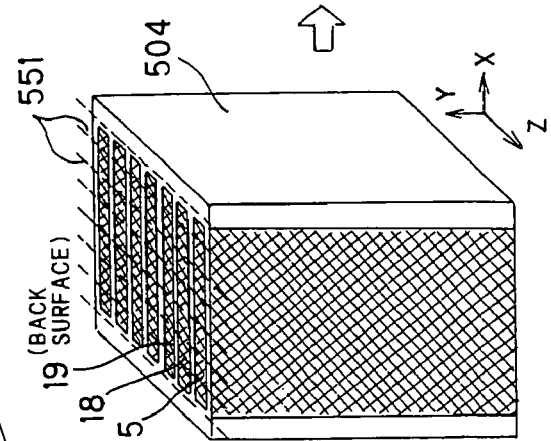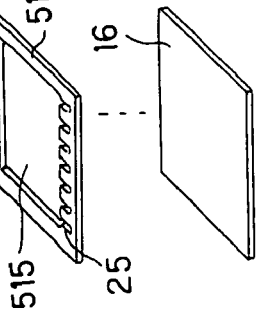

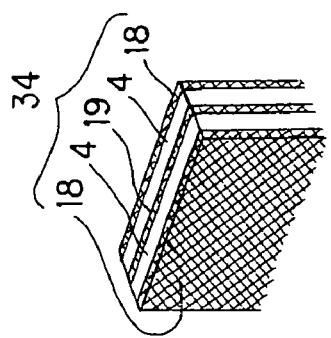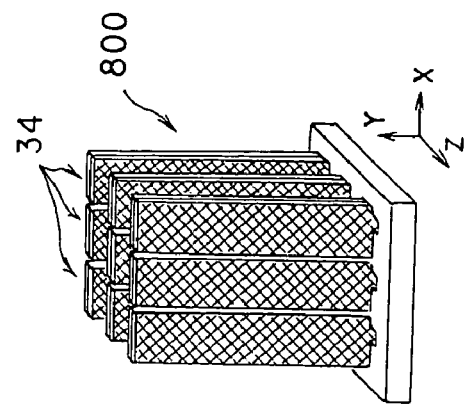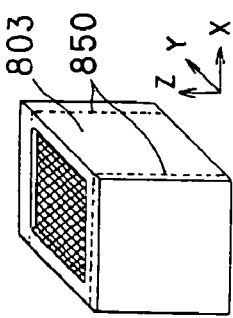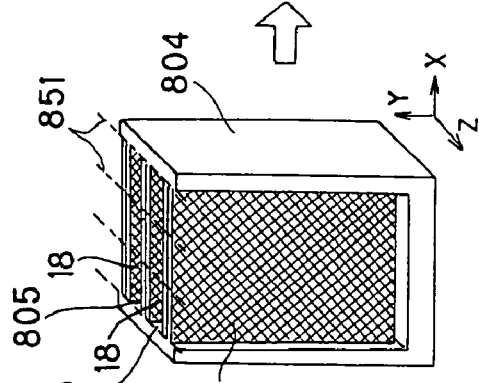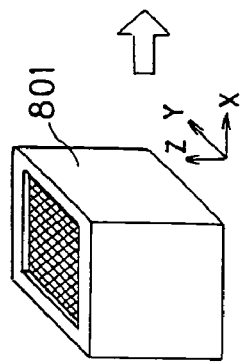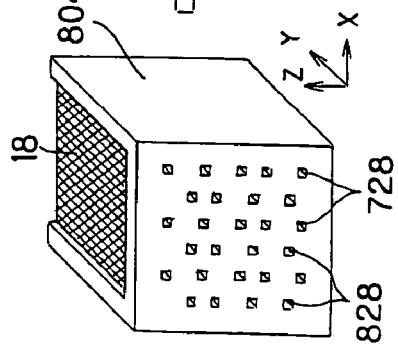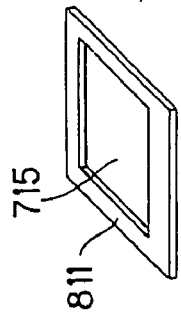

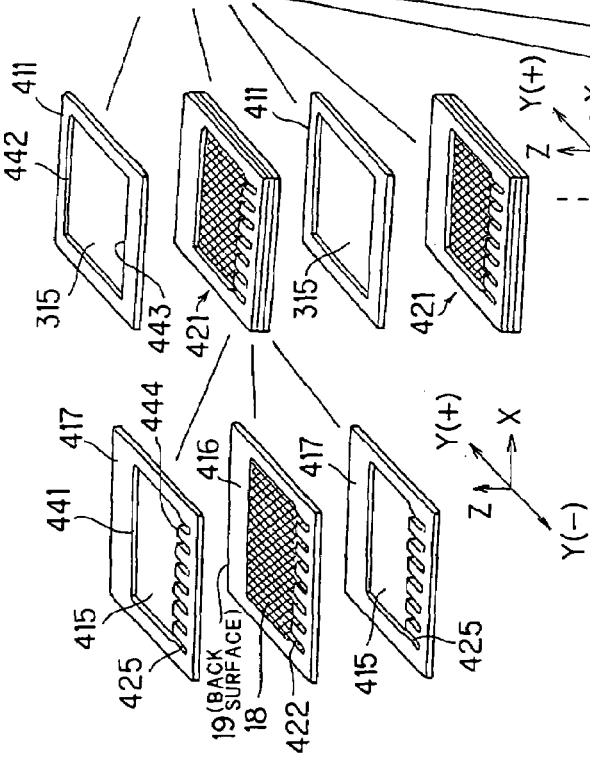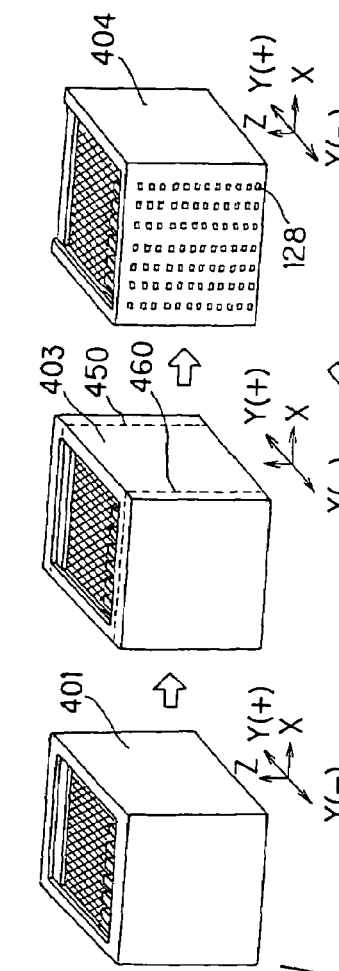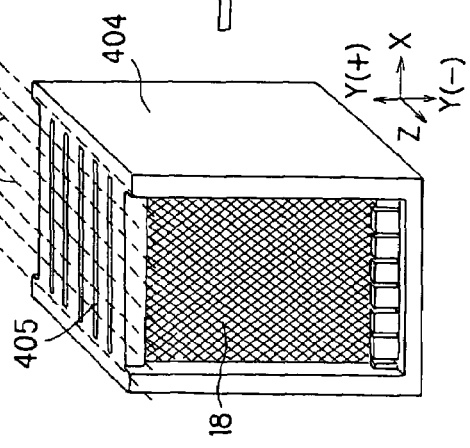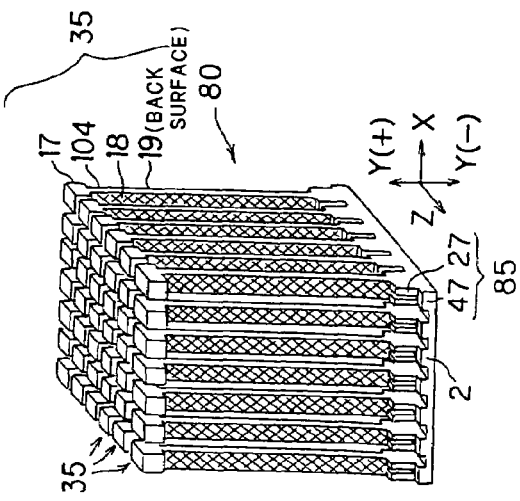

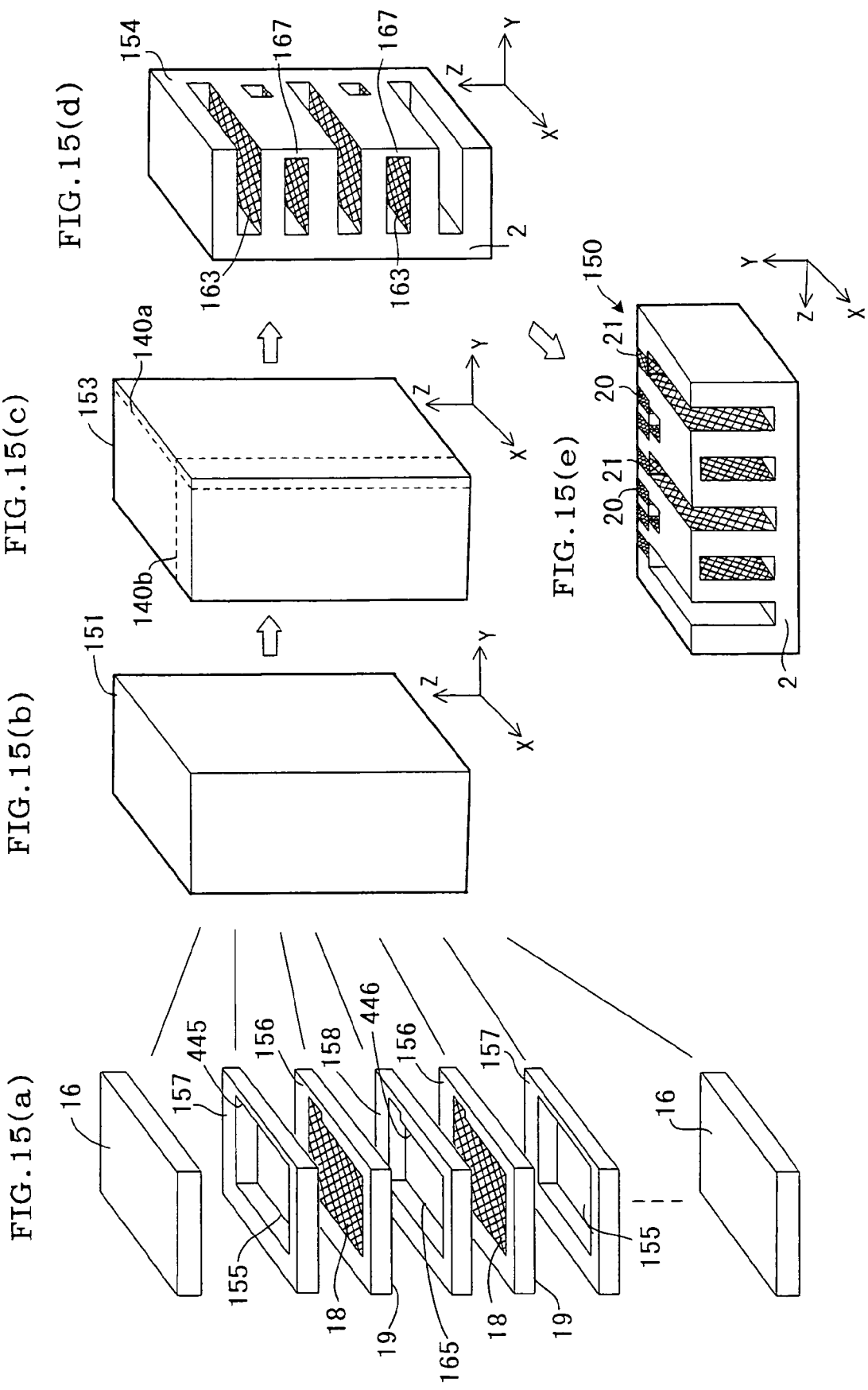

LESS-DUST-GENERATIVE PIEZOELECTRIC/ELECTROSTRICTIVE DEVICE AND MANUFACTURING METHOD

This application claims the benefit of Japanese Application 2002-297039, filed Oct. 10, 2002, Japanese Application 2002-363736, filed Dec. 16, 2002, and Japanese Application 2003-207186, filed Aug. 11, 2003, the entireties of which are incorporated herein by reference.

BACKGROUND OF THE INVENTION

1. Field of the Invention

The present invention relates to piezoelectric/electrostrictive devices which are applied to optical communication devices such as an optical switch, optical add-drop multiplexers, and variable optical attenuator, image display apparatuses such as a display and projector, mechanical driving apparatuses such as a micro-pump, droplet discharge apparatus, and precision gas flow rate control apparatus for a semiconductor manufacturing apparatus, or various types of sensors, and to a method for manufacturing the piezoelectric/electrostrictive device.

2. Description of the Related Art

In recent years, in fields of optics, precision machines, semiconductor manufacturing, and the like, there has been a demand for a displacement control element for adjusting an optical path length or position on the order of sub-microns. To meet the demand, development of piezoelectric/electrostrictive devices such as an actuator and sensor has been advanced, in which a strain caused in applying an electric field to a ferroelectric or antiferroelectric member is used based on an inverse piezoelectric effect or an electrostrictive effect. For the displacement control element using an electric field inductive strain, as compared with a conventional electromagnetic system by a servo motor, pulse motor, and the like, there are characteristics that micro displacement control is easy, mechanical/electrical energy conversion factor is high and power saving is achieved, and the elements can be mounted with super precision and can contribute to miniaturizing/lightening of products. It is considered that a field of application is steadily increasing.

For example, it has been proposed that the piezoelectric/electrostrictive device be used as an actuator for switching a transmission path of an input light (see WIPO Pamphlet WO 02/52327 A1). One example of the optical switch is shown in FIGS. 2(a), 2(b). An optical switch 200 shown in FIGS. 2(a), 2(b) includes an optical transmission section 201, optical path change section 208, and actuator section 211. In detail, the optical transmission section 201 includes an optical reflective surface 101 disposed in a part of a surface disposed opposite to the optical path change section 208, and optical transmission paths 202, 204, 205 disposed toward three directions starting from the optical reflective surface 101.

Moreover, the optical path change section 208 is disposed in the vicinity of the optical reflective surface 101 of the optical transmission section 201 in a movable state, and includes an optical introductory member 209 formed of a translucent property, and an optical reflective member 210 for totally reflecting light. Furthermore, the actuator section 211 is displaced in response to an external signal, and includes a mechanism for transmitting the displacement to the optical path change section 208.

For the optical switch 200, as shown in FIG. 2(a), the actuator section 211 operates in response to the external signals such as application of voltage. By the displacement of the actuator section 211, the optical path change section 208 is detached from the optical transmission section 201. A light 221 inputted in the optical transmission section 201 is totally reflected without being transmitted in the optical reflective surface 101 of the optical transmission section 201 in which a refractive index is adjusted to a predetermined value, and transmitted to the optical transmission path 204 on an output side.

On the other hand, conversely, when the actuator section 211 is brought into an inoperative state from this state, as shown in FIG. 2(b), the displacement of the actuator section 211 returns to an original state, and the optical introductory member 209 of the optical path change section 208 contacts the optical transmission section 201 in a distance which is not more than wavelength of the light. Therefore, the light 221 inputted in the optical transmission path 202 is brought to the optical introductory member 209 from the optical transmission section 201 by the optical introductory member 209, and is transmitted in the optical introductory member 209. The light 221 transmitted in the optical introductory member 209 reaches the optical reflective member 210, and is reflected by a reflective surface 102 of the optical reflective member 210. Accordingly, the light is transmitted to the optical transmission path 205 on an output side, different from the layer reflected by the optical reflective surface 101 of the optical transmission section 201.

Loss in switching is reduced in the above-described optical switch, and there has been a demand for an actuator in which large displacement amount and high generation force can be realized. However, the piezoelectric/electrostrictive device in which a plurality of uni-morph or bi-morph piezoelectric/electrostrictive elements heretofore known are arranged in a plane is based on a bending mode, and it has therefore been difficult to simultaneously satisfy a displacement amount and generative force.

Moreover, from this time, with an advance of construction of an optical network system which does not carry out optical/electric conversion, the number of circuits of a photonic router increases. On the other hand, the photonic router has been requested to be further miniaturized. Therefore, it has been requested that more optical switches be disposed as constituting elements of the photonic router per a certain area. However, the conventional piezoelectric/electrostrictive device includes a constitution in which the major surface of the piezoelectric/electrostrictive member is disposed substantially vertical to a bending displacement direction. Therefore, a device dimension (width or thickness) itself cannot help getting large in order to increase a generated displacement amount, and it is difficult to reduce a pitch and to arrange the elements in a high density. In the present specification, the term "major surface" means a surface showing an intended function as a device, a member or an element.

Additionally, with respect to high-density arrangement of the piezoelectric/electrostrictive elements, a proposal has heretofore been made in Japanese Patent No. 3058143. It is disclosed that an actuator shown in FIG. 1 of Japanese Patent No. 3058143 is a piezoelectric actuator optimum for an ink jet system recording apparatus and that pillar piezoelectric elements functioning as a driving mechanism are two-dimensionally arranged in a checkerboard form based on a piezoelectric transverse effect. Moreover, the piezoelectric actuator is assumed to have an effect that the number of ink jet nozzles per unit area can be increased in the recording apparatus of the ink jet system.

However, for the disclosed piezoelectric actuator, green sheets coated beforehand with common electrodes or application electrodes are stacked and fired, and thereafter a dicing saw is used to process a trench for separating/isolating the pillar piezoelectric elements. Therefore, there have been at least the following problems.

One of the problems is generation of particles. It has been considered that the particles are easily generated especially in a surface mechanically processed by the dicing saw. For a reason for this, the piezoelectric member including ceramic particles is processed as described above, and the probability of the presence of the transgranularly fractured crystal grains or the probability of the generation of cracks increases in the processed surface, that is, the whole surface constituting the piezoelectric element. As a result, the particles are easily detached by a repeated operation of the piezoelectric element over a long period.

When this piezoelectric actuator is used in an actuator section of the optical switch described above, the generated particles stick to the optical reflective surface of the optical transmission section, and propagation loss is caused in an unexpected portion by the reflection. There is also a possibility that the particles enter a gap between the optical change section and the optical reflective surface, and a trouble is caused in a contact operation of the optical path change section. These can be factors for unsteadily changing the optical path, and are not preferable.

A second problem is limit to arrangement density. The piezoelectric actuator includes a structure in which the electrode is contained beforehand in the piezoelectric element. Therefore, the structure is influenced by distortion at the time of the firing, a layer structure including the electrode and piezoelectric member of each of the separated/isolated piezoelectric element easily becomes nonuniform, and fluctuations of characteristics are caused among the elements. Moreover, in consideration of the firing distortion, the size (width or thickness) of the element itself cannot but increase. Therefore, even if the limit of the arrangement density is higher than that of the piezoelectric/electrostrictive device including a plurality of uni-morph or bi-morph type piezoelectric/electrostrictive elements heretofore known and two-dimensionally arranged, it is difficult to reduce the pitch and to arrange the elements in a higher density.

In the example of the piezoelectric actuator disclosed in Japanese Patent No. 3058143, the piezoelectric element has a width of 0.3 mm, the trench has a width of 0.209 to 0.718 mm, and a density is such that one piezoelectric element is substantially disposed per 1 $mm^2$. However, this cannot be said to be a sufficiently high density for meeting resolution required for an ink jet printer these days. This arrangement density cannot be satisfactory even in the optical switch in the example shown in FIGS. 2(a), 2(b).

A third problem is a limit of a displacement amount. In the disclosed piezoelectric actuator, the separated/isolated piezoelectric elements are formed by dicing saw processing. However, by restrictions in the processing, when the depth of the trench, that is, the height of the piezoelectric element increases, straightness of the structure easily deviates. When the piezoelectric devices are arranged in a high density, the distance between the piezoelectric elements disposed adjacent to each other is reduced, the deviation of the position accuracy of the piezoelectric element relatively increases. Therefore, the height of the piezoelectric element has to be necessarily limited to be small for the arrangement in the high density.

For the transverse effect type element in which the generated displacement amount depends on the height of the piezoelectric element, the obtained displacement amount is not sufficient with the limit to the height. Therefore, even when the generated displacement amount of the disclosed piezoelectric actuator is larger than that of the piezoelectric/electrostrictive device including the plurality of heretofore known uni-morph or bi-morph type piezoelectric/electrostrictive two-dimensionally arranged, the amount has not been satisfactory for the actuator of the ink jet system recording apparatus (ink jet printer) or the optical switch in recent years.

SUMMARY OF THE INVENTION

The present invention has been developed in consideration of the above-described situations. An object of the present invention is to provide a piezoelectric/electrostrictive device in which particles are inhibited from being generated and which continuously realizes a stable displacement operation over a long period, a piezoelectric/electrostrictive device which is large in displacement and high in generative force, and a piezoelectric/electrostrictive device which can be disposed in a high density, preferably to provide a piezoelectric/electrostrictive device including two or more of these capabilities, or to provide methods for manufacturing the devices.

Another object is to apply the piezoelectric/electrostrictive device to optical communication devices such as an optical switch, optical add-drop multiplexers, and variable optical attenuator, image display apparatuses such as a display and projector, mechanical driving apparatuses such as a precision gas flow rate control apparatus for a micropump, droplet discharge apparatus, and semiconductor manufacturing apparatus, or various types of sensors and to miniaturize these application apparatuses and to enhance capability and reliability over a long period. As a result of repeated researches, it has been found that the above-described objects can be achieved by the following means.

First, according to the present invention, there is provided a less-dust-generative piezoelectric/electrostrictive device in which a piezoelectric/electrostrictive element including a piezoelectric/electrostrictive member and at least one pair of electrodes formed on side surfaces of the piezoelectric/electrostrictive member is set up on a ceramic substrate and in which the ceramic substrate is formed integrally with the piezoelectric/electrostrictive element. The side surfaces on which the electrodes are formed are fired, but unprocessed surfaces.

In the less-dust-generative piezoelectric/electrostrictive device according to the present invention, the piezoelectric/electrostrictive element is preferably wired via a through hole or a via hole formed in the ceramic substrate. In a more concrete mode of wiring, an electrode terminal is formed on a surface on the opposite side of the surface on which the piezoelectric/electrostrictive element is set up in the ceramic substrate, and the electrode terminal and the electrode of the piezoelectric/electrostrictive element are wired via the through hole or the via hole formed in the ceramic substrate. According to this mode, a wiring operation for connecting a power source performed later is facilitated, problems associated with the wiring operation do not easily occur, and yield is further enhanced.

The term "fired, but unprocessed face" in the present specification means a surface which has been obtained by molding means such as sheet molding and press molding and which has been fired as such without being processed. The surface is distinguished from a surface which has been fired and subsequently subjected to processing such as cutting, incising, polishing, and grinding. According to the present invention, there is provided a less-dust-generative piezoelectric/electrostrictive device in which side surfaces of a piezoelectric/electrostrictive member are formed as fired, but unprocessed faces and at least one pair of electrodes are formed on the side surfaces.

In the present specification, the side surfaces (electrode formed surfaces) of the piezoelectric/electrostrictive member on which the electrodes are to be formed or have been formed will also be referred to as major surfaces of the piezoelectric/electrostrictive member. The side surfaces of the piezoelectric/electrostrictive element on which the electrodes are formed will also be referred to as the major surfaces of the piezoelectric/electrostrictive element. Among the side surfaces, the surfaces which are not the major surfaces will also be referred to as sub-surfaces. In the present specification, an upper direction or lower direction is a direction vertical to the surface of the ceramic substrate, and means a relative upper direction or lower direction, assuming the lower direction on the side of the ceramic substrate with respect to the piezoelectric/electrostrictive element. The lower direction does not mean a gravity direction.

Next, according to the present invention, in the less-dust-generative piezoelectric/electrostrictive device, the ceramic substrate is thick in the thickness, the piezoelectric/electrostrictive element has a pillar shape, and a plurality of piezoelectric/electrostrictive elements are set up in a matrix form on the ceramic substrate.

In the less-dust-generative matrix-type piezoelectric/electrostrictive device according to the present invention, an aspect ratio of the piezoelectric/electrostrictive element having the pillar shape is substantially 20 to 400.

In the present specification, the aspect ratio refers to a height/thickness or longitudinal/lateral dimension of a pillar member or a thin wall (piezoelectric/electrostrictive element or piezoelectric/electrostrictive member). The thickness refers to a minimum distance passed through an axial line in a transverse surface (short-direction section) of the pillar member or the thin wall. That is, in the preferable less-dust-generative matrix-type piezoelectric/electrostrictive device according to the present invention, a ratio of the thickness to the height is substantially 1:20 to 1:400.

Moreover, for the less-dust-generative matrix-type piezoelectric/electrostrictive device according to the present invention, in the transverse surface of the piezoelectric/electrostrictive element having the pillar shape, a distance between at least one pair of electrodes formed on the side surfaces of the piezoelectric/electrostrictive member constituting the piezoelectric/electrostrictive element is preferably 1 mm or less, more preferably 300 μm or less. Since at least one pair of (two) electrodes are formed, electrodes more than one pair of electrodes are sometimes formed. At this time, the interval between the electrodes means a distance between one electrode and another electrode disposed opposite to the one electrode.

Furthermore, in the less-dust-generative matrix-type piezoelectric/electrostrictive device according to the present invention, a ratio of the interval between one piezoelectric/electrostrictive element and another piezoelectric/electrostrictive element disposed adjacent to the one piezoelectric/electrostrictive element to the height of the piezoelectric/electrostrictive element is preferably substantially 1:20 to 1:400.

Additionally, in the less-dust-generative matrix-type piezoelectric/electrostrictive device according to the present invention, straightness of the axial line of the piezoelectric/electrostrictive element having the pillar shape is preferably substantially 30 μm or less.

The straightness and axial line mentioned in the present specification are described in Japanese Industry Standard B0621 "Definition and Display of Geometric Deviation". The straightness refers to a size of deviation of a linear member from a geometrically correct straight line. The axial line refers to a line connecting the center of a sectional contour line to another in transverse surfaces of objects designated as cylindrical or rectangular parallelepiped members in linear shapes. For the less-dust-generative matrix-type piezoelectric/electrostrictive device according to the present invention, the piezoelectric/electrostrictive element (piezoelectric/electrostrictive member) has the pillar shape, many of the devices have elongated rectangular parallelepiped members, and the straightness of the axial line is excessively small. This means that the piezoelectric/electrostrictive element (piezoelectric/electrostrictive member) of the less-dust-generative matrix-type piezoelectric/electrostrictive device according to the present invention has a shape excessively close to a geometrically correct rectangular parallelepiped shape not including warp or bend even with a large aspect ratio.

The less-dust-generative matrix-type piezoelectric/electrostrictive device according to the present invention preferably includes positional deviation inhibition means which holds an accuracy of position of the piezoelectric/electrostrictive element. For example, even when unexpected turbulence such as vibration and mechanical impact is applied, the positional deviation of the piezoelectric/electrostrictive element is reduced within a planned range, and accordingly the piezoelectric/electrostrictive element is easily vibrated in an intended direction and an operation point does not easily deviate. Even when the straightness drops of the manufactured piezoelectric/electrostrictive element drops because of residual stresses caused by fluctuations of materials and manufacturing processes (including a polarization treatment for use) and a displacement direction of the piezoelectric/electrostrictive member deviates because of unevenness of distortion caused during the driving operation of the piezoelectric/electrostrictive element, the piezoelectric/electrostrictive device including the positional deviation inhibition means holding the accuracy of the position of the piezoelectric/electrostrictive element can reduce the deviation.

The positional deviation inhibition means is not limited, but preferable examples of the means include a convex member disposed in at least a tip end of the piezoelectric/electrostrictive member in at least one of the piezoelectric/electrostrictive elements disposed adjacent to each other in the plurality of piezoelectric/electrostrictive elements set up on the ceramic substrate.

The convex member may also be bonded to the piezoelectric/electrostrictive member by a member separate from the piezoelectric/electrostrictive member, but the convex member is preferably a material which is integrated with the piezoelectric/electrostrictive member and is of the same type as that of the member. This is equal to a mode in which the piezoelectric/electrostrictive member includes the convex member in a part of the member. In any case, a device structure and manufacturing process are further simplified as compared with a case in which the positional deviation is inhibited by means such as addition of a separately disposed component attached later.

When the separately disposed component is added, a fixing or adjusting operation accompanying the addition occurs. Moreover, when components of different types of materials are used, there is a possibility of generation of a stress or breakage because of a difference in coefficient of thermal expansion. According to the positional deviation inhibition means, one piezoelectric/electrostrictive element is guided to a relative position determined by another piezoelectric/electrostrictive element disposed adjacent to the one piezoelectric/electrostrictive element. The plurality of piezoelectric/electrostrictive elements set up on the ceramic substrate are aligned/arranged at a high pitch accuracy in at least a tip end.

In the less-dust-generative matrix-type piezoelectric/electrostrictive device according to the present invention, the piezoelectric/electrostrictive element preferably includes a stair-like member in a root of the piezoelectric/electrostrictive member. This is because concentration of the stress onto an edge (tangent-line portion of two surfaces (element surface and substrate surface)) between the piezoelectric/electrostrictive element and ceramic substrate is alleviated, and mechanical strength of the piezoelectric/electrostrictive element is enhanced.

The less-dust-generative matrix-type piezoelectric/electrostrictive device according to the present invention is not limited. The piezoelectric/electrostrictive element preferably includes two or more layers of piezoelectric/electrostrictive members, and an electrode formed on opposite outer surfaces of the two or more layers of piezoelectric/electrostrictive members and between two or more layers of piezoelectric/electrostrictive members. The opposite outer surfaces of two or more layers of piezoelectric/electrostrictive members indicate exposed side surfaces (major surfaces) of two or more layers of piezoelectric/electrostrictive members. The electrode formed between two or more layers of piezoelectric/electrostrictive members indicates that one electrode is held/formed between the side surfaces of two layers of piezoelectric/electrostrictive members and that at least one or more electrodes are disposed. That is, any electrode is formed on the side surface of the piezoelectric/electrostrictive member. This also applies to other embodiments of the less-dust-generative cell-driving type piezoelectric/electrostrictive device according to the present invention.

Next, according to the present invention, in the less-dust-generative piezoelectric/electrostrictive device, the piezoelectric/electrostrictive element has a thin-wall shape, and two or more piezoelectric/electrostrictive elements are set up like comb teeth on the ceramic substrate. The device includes a cell formed by: the ceramic substrate; one piezoelectric/electrostrictive element; the other piezoelectric/electrostrictive element disposed adjacent to the one piezoelectric/electrostrictive element; and a lid section which connects the one piezoelectric/electrostrictive element to the other piezoelectric/electrostrictive element to provide the less-dust-generative piezoelectric/electrostrictive device of a cell driving type.

In the less-dust-generative cell-driving type piezoelectric/electrostrictive device according to the present invention, an aspect ratio of the piezoelectric/electrostrictive element having the thin wall shape is preferably substantially 2 to 40. Moreover, in the less-dust-generative cell-driving type piezoelectric/electrostrictive device further including a plurality of cells each of which is formed independently of the adjacent cell, a ratio of a distance between one cell and the other cell disposed adjacent to the one cell to a height of the piezoelectric/electrostrictive element is preferably substantially 1:2 to 1:100.

The less-dust-generative cell-driving type piezoelectric/electrostrictive device according to the present invention is not limited, but the piezoelectric/electrostrictive element includes: two or more layers of piezoelectric/electrostrictive members; and electrodes formed on opposite outer surfaces of the two or more layers of piezoelectric/electrostrictive members and between two or more layers of piezoelectric/electrostrictive members.

Next, according to the present invention, there is provided a method for manufacturing a less-dust-generative piezoelectric/electrostrictive device. The method for manufacturing the less-dust-generative piezoelectric/electrostrictive device according to the present invention is a method for manufacturing a piezoelectric/electrostrictive device in which a plurality of piezoelectric/electrostrictive elements each including a piezoelectric/electrostrictive member and at least one pair of electrodes formed on side surfaces of the piezoelectric/electrostrictive member are set up on a ceramic substrate. The ceramic substrate is integrally formed with the piezoelectric/electrostrictive element, and the side surfaces of the piezoelectric/electrostrictive member on which the electrodes are formed are fired, but unprocessed faces. The method includes the steps of: preparing a plurality of ceramic green sheets containing piezoelectric/electrostrictive materials as a major component; forming hole portions in a predetermined number of ceramic green sheets among the plurality of ceramic green sheets; stacking the ceramic green sheet in which the hole portion is formed upon the ceramic green sheet in which the hole portion is not formed to obtain a ceramic green laminate; integrally firing the ceramic green laminate; and subjecting the ceramic green laminate to predetermined processing. It is to be noted that in the present specification the ceramic green sheet will also be referred to simply as the sheet. In the present specification, the term "major component" means a component used for showing an intended function as a device, a member or an element.

Next, according to the present invention, there is provided a guide-attached matrix type piezoelectric/electrostrictive device including: a thick ceramic substrate; a plurality of piezoelectric/electrostrictive elements which are set up in a matrix form on the ceramic substrate and each of which includes a piezoelectric/electrostrictive member and at least one pair of electrodes formed on side surfaces of the piezoelectric/electrostrictive member to form a pillar shape and which are integrally formed with the ceramic substrate; and positional deviation inhibition means which holds an accuracy of position of the piezoelectric/electrostrictive element.

In the guide-attached matrix-type piezoelectric/electrostrictive device according to the present invention, the positional deviation inhibition means is not limited, but is preferably, for example, a convex member disposed in at least a tip end of the piezoelectric/electrostrictive member constituting at least one of the piezoelectric/electrostrictive elements disposed adjacent to each other among the plurality of piezoelectric/electrostrictive elements set up on the ceramic substrate. In the guide-attached matrix-type piezoelectric/electrostrictive device according to the present invention, the piezoelectric/electrostrictive element includes a stair-like member in a root of the piezoelectric/electrostrictive member.

Next, according to the present invention, there is provided a method for manufacturing a guide-attached matrix-type piezoelectric/electrostrictive device. The method for manufacturing the guide-attached matrix-type piezoelectric/electrostrictive device according to the present invention is a method for manufacturing the piezoelectric/electrostrictive device in which a plurality of piezoelectric/electrostrictive elements each including a piezoelectric/electrostrictive member and at least one pair of electrodes formed on side surfaces of the piezoelectric/electrostrictive member and each having a pillar shape are set up in a matrix form on a ceramic substrate and in which the ceramic substrate is formed integrally with the piezoelectric/electrostrictive elements and in which a convex member is disposed in at least a tip end of a piezoelectric/electrostrictive member constituting at least one of the piezoelectric/electrostrictive elements disposed adjacent to each other among the plurality of piezoelectric/electrostrictive elements. The method includes: a step E1 of preparing a plurality of ceramic green sheets each containing a piezoelectric/electrostrictive material as a major component therefor; a step E2 of forming one hole portion substantially having a square shape in a predetermined position of each of a predetermined number of ceramic green sheets among the plurality of ceramic green sheets to obtain frame-shaped ceramic green sheets Fa; a step E3 of forming one enlarged hole portion obtained by enlarging one side of the substantially square-shaped hole portion of the ceramic green sheet Fa in the predetermined position of each of the predetermined number of ceramic green sheets among the plurality of ceramic green sheets to obtain frame-shaped ceramic green sheets Fb; a step E4 of superposing the ceramic green sheet Fa upon one surface or opposite surfaces of the ceramic green sheet constituting later the piezoelectric/electrostrictive member to obtain a plurality of ceramic green laminate units; a step E5 of using the ceramic green sheet Fb as an outermost layer and alternately stacking the ceramic green sheets Fb upon the ceramic green laminate units to obtain a ceramic green laminate; a step E6 of firing/integrating the ceramic green laminate to obtain a ceramic laminate having a closed hole; a step E7 of cutting the ceramic laminate along one side forming the enlarged hole portion of the ceramic green sheet Fb or slightly on the side of the enlarged hole portion from the one side to obtain the ceramic laminate having an open hole obtained by opening one end of the closed hole; and a step E8 of forming a cut in a direction intersecting with a wall portion of the ceramic laminate in which the opened hole is to be formed and in a depth direction of the opened hole.

In the method for manufacturing the guide-attached matrix-type piezoelectric/electrostrictive device according to the present invention, a plurality of sub-hole portions which communicate with one hole portion in the predetermined number of ceramic green sheets Fa. The sub-hole portions can take a mode constituting a through hole on whose inner wall a conductive member is formed later, and this facilitates the wiring.

When the sub-hole portions are displacement, the method for manufacturing the guide-attached matrix-type piezoelectric/electrostrictive device according to the present invention preferably includes a step of cutting or polishing the ceramic laminate to open each of the sub-hole portions after obtaining the ceramic laminate. The sub-hole portion also preferably communicates with the end of the ceramic green sheet Fa. In this case, the step of cutting or polishing the ceramic laminate later is unnecessary.

The positional deviation inhibition means which holds the accuracy of the position of the piezoelectric/electrostrictive element or the stair-like member disposed in the root of the piezoelectric/electrostrictive member in the guide-attached matrix-type piezoelectric/electrostrictive device according to the present invention produces an effect similar to that of the positional deviation inhibition means or the stair-like member to be combined with the less-dust-generative matrix-type piezoelectric/electrostrictive device described above. That is, the positional deviation inhibition means or the stair-like member is preferably combined with the less-dust-generative matrix-type piezoelectric/electrostrictive device, but is not necessarily limited only to the less-dust-generative matrix-type piezoelectric/electrostrictive device. Simply the piezoelectric/electrostrictive device including the positional deviation inhibition means which holds the accuracy of the position of the piezoelectric/electrostrictive element can also be realized.

In the present specification, the position of the positional deviation inhibition means does not indicate a position where the piezoelectric/electrostrictive element is disposed in the ceramic substrate (the position of the root of the piezoelectric/electrostrictive member, i.e., a fixed portion). The position indicates a position of a top, tip end, or intermediate portion of the piezoelectric/electrostrictive element as seen from a bonded portion between the set-up piezoelectric/electrostrictive element and the ceramic substrate, that is, a position of a non-fixed portion of the piezoelectric/electrostrictive element. The positional deviation inhibition means refers to means for inhibiting deviation of this position. This means limits a positional fluctuation of the piezoelectric/electrostrictive element within a certain range, and the accuracy of the position of the piezoelectric/electrostrictive element is held.

Moreover, in the present specification, the sub-hole portion is described in contrast to a major hole portion constituting a space between the piezoelectric/electrostrictive elements later (at the time of completion of the piezoelectric/electrostrictive device). The major hole portion refers, for example, to the hole portion substantially having the square shape in the method for manufacturing the guide-attached matrix-type piezoelectric/electrostrictive device. The sub-hole portion is common to all the manufacturing methods described in the present specification in that the portion constitutes a through hole later, but naturally it is not meant that the sub-hole portion shows the same mode in the respective manufacturing methods, and the modes of the sub-hole portions can be determined by designs, respectively.

Furthermore, when it is described in the present specification that something is predetermined (predetermined number, position, interval, or portion), conditions (number, position, interval, portion, and the like) may be predetermined. The present invention is not specified by the defined conditions. The defined conditions are determined based on the design of the piezoelectric/electrostrictive device, and may also be determined for each object (e.g., one "predetermined number" and the other "predetermined number" may be either the same or different in the number).

BRIEF DESCRIPTION OF THE DRAWINGS

FIG. 1 is a diagram showing one embodiment of a less-dust-generative matrix-type piezoelectric/electrostrictive device according to the present invention.

FIG. 2 is a vertical sectional view showing an application example of a conventional piezoelectric/electrostrictive device.

FIGS. 3(a) to 3(g) are explanatory views showing one example of a method for manufacturing a less-dust-generative matrix-type piezoelectric/electrostrictive device according to the present invention;

FIGS. 4(a) to 4(g) are explanatory views showing one example of the method for manufacturing the less-dust-generative matrix-type piezoelectric/electrostrictive device according to the present invention;

FIGS. 7(a) to 7(f) are explanatory views showing one example of the method for manufacturing the less-dust-generative matrix-type piezoelectric/electrostrictive device according to the present invention, and FIG. 7(g) is a partially enlarged perspective view of the manufactured less-dust-generative matrix-type piezoelectric/electrostrictive device;

FIG. 8 is a diagram showing one embodiment of a guide-attached matrix-type piezoelectric/electrostrictive device according to the present invention.

FIGS. 13(a) to 13(g) are explanatory views showing one example of the method for manufacturing the guide-attached matrix-type piezoelectric/electrostrictive device according to the present invention;

FIGS. 15(a) to 15(e) are explanatory views showing one example of the method for manufacturing the less-dust-generative cell-driving type piezoelectric/electrostrictive device according to the present invention;

FIG. 19 is a diagram showing one embodiment of the less-dust-generative matrix-type piezoelectric/electrostrictive device according to the present invention, FIG. 20 is a diagram showing one embodiment of the less-dust-generative matrix-type piezoelectric/electrostrictive device according to the present invention.

Figure 1A:
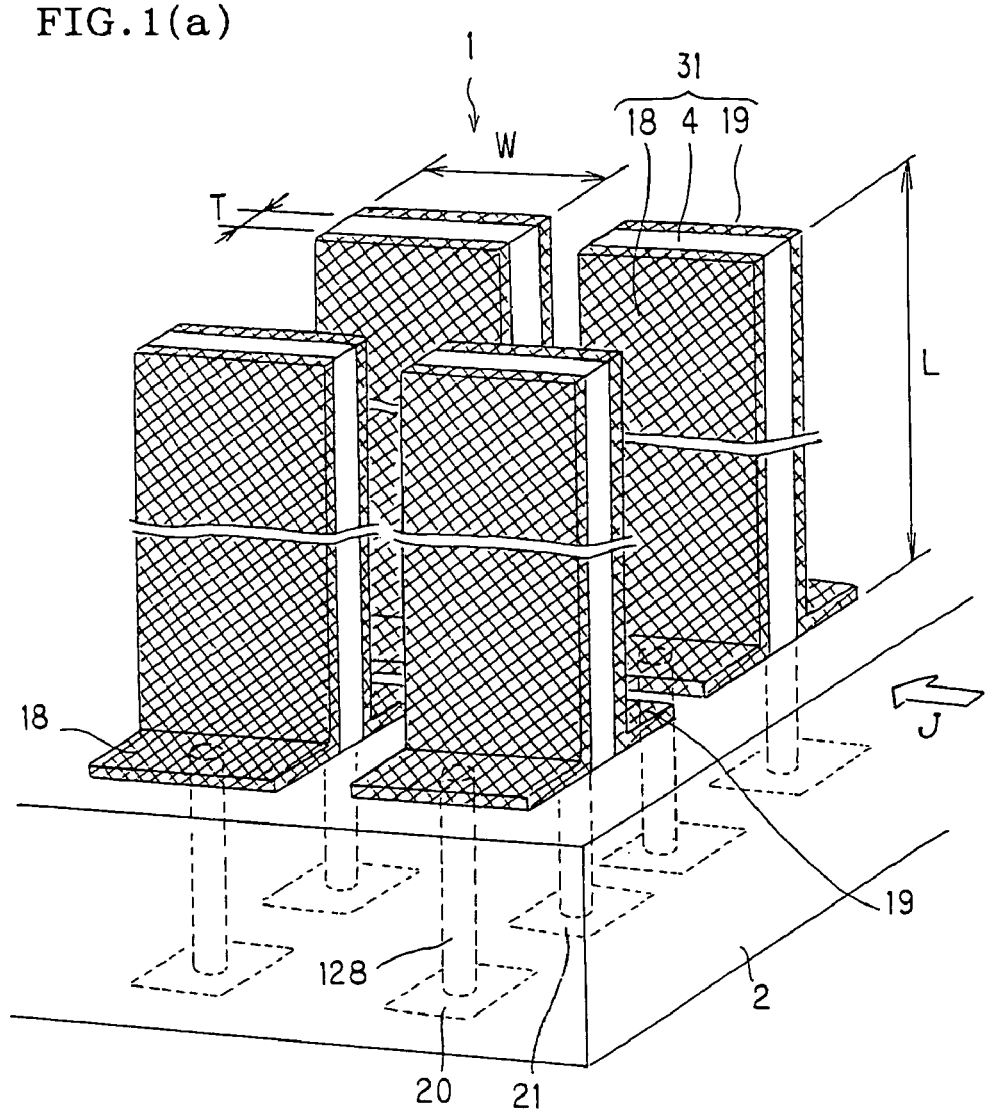
FIG. 1(a) is a perspective view.

The following referential numbers denote respectively a member, a part, or portion as specified herein below:

1, 500, 600, 800 . . . less-dust-generative matrix-type piezoelectric/electrostrictive device, 2 . . . ceramic substrate, 3, 5, 405, 805 . . . open hole, 4, 14, 24, 104, 164, 174 . . . piezoelectric/electrostrictive member, 605 . . . slit, 6 . . . wall portion P, 7 . . . wall portion Q, 15, 155, 165, 315, 415, 515, 715, 815 . . . hole, 16, 116, 117, 156, 157, 158, 411, 416, 417, 517, 616, 617, 716, 717, 718, 811, 816, 817, 818 . . . ceramic green sheet, 17, 917, 918, 919 . . . convex member, 18, 19 . . . electrode(s), 20, 21 . . . terminal(s) for electrode(s), 25, 425, 725, 726, 825, 826 . . . sub-hole, 27 . . . mountain-side member, 31, 32, 33, 34, 35, 36, 37 . . . piezoelectric/electrostrictive element, 47 . . . valley-side member, 57 . . . intermediate member, 61, 211 . . . actuator section, 64, 65, 66 . . . micro mirror, 67 . . . incident light, 68 . . . reflected light, 80 . . . guide-attached matrix-type piezoelectric/electrostrictive device, 85, 86, 87 . . . stair-like member, 101 . . . optical reflective surface, 102 . . . reflective surface, 120, 180, 190 . . . micro mirror array, 128, 228, 628, 728, 828 . . . through hole, 150, 170 . . . less-dust-generative cell-driving type piezoelectric/electrostrictive device, 151, 301, 401, 501, 601, 801 . . . ceramic green laminate, 153, 303, 403, 503, 603 . . . ceramic laminate, 154, 404, 504, 604, 804 . . . ceramic laminate, 163, 173 . . . cell, 167, 177 . . . lid section, 200 . . . optical switch, 201 . . . optical transmission section, 202, 204, 205 . . . optical transmission path, 208 . . . optical path change section, 209 . . . optical introductory member, 210 . . . optical reflective member, 218 . . . thin plate, 221 . . . light, 304 . . . honeycomb-shaped ceramic laminate, 350, 450, 460, 550, 650, 850 . . . cut line, 351, 451, 551, 851 . . . cut line, 421, 721, 821 . . . ceramic green laminate unit, 422, 622, 722, 822 . . . conductive film, and, 441, 442, 443, 444, 445, 446 . . . side.

DESCRIPTION OF THE PREFERRED EMBODIMENT

Embodiments will hereinafter concretely be described with respect to a piezoelectric/electrostrictive device and a method for manufacturing the device appropriately with reference to the drawings, but the present invention is not limited to these when interpreted, and can variously be changed, modified, or improved based on knowledge of any person skilled in the art without departing from the scope of the present invention. For example, the drawings show preferable embodiments of the present invention, but the present invention is not limited to information (such as shape, arrangement, and size) shown in the drawings. The method for manufacturing the piezoelectric/electrostrictive device (such as a less-dust-generative piezoelectric/electrostrictive device) of the present invention is preferable means for preparing the piezoelectric/electrostrictive device of the present invention, but the piezoelectric/electrostrictive device of the present invention is not limited to the device obtained by the method for manufacturing the piezoelectric/electrostrictive device of the present invention.

(1) Less-Dust-Generative Piezoelectric/Electrostrictive Device

First, a less-dust-generative piezoelectric/electrostrictive device according to the present invention will be described. According to the present invention, there is provided the less-dust-generative piezoelectric/electrostrictive device in which a piezoelectric/electrostrictive element including a piezoelectric/electrostrictive member and at least one pair of electrodes formed on side surfaces of the piezoelectric/electrostrictive member is set up on a ceramic substrate and in which the ceramic substrate is formed integrally with the piezoelectric/electrostrictive element. The piezoelectric/electrostrictive device is characterized in that the side surfaces of the piezoelectric/electrostrictive member on which the electrodes are formed are fired, but unprocessed faces.

The less-dust-generative piezoelectric/electrostrictive device according to the present invention is concretely illustrated by two types of piezoelectric/electrostrictive devices including a less-dust-generative matrix-type piezoelectric/electrostrictive device and a less-dust-generative cell-driving type piezoelectric/electrostrictive device described later mainly by a shape of the piezoelectric/electrostrictive element and a mode of the setting-up of the piezoelectric/electrostrictive element on the ceramic substrate.

(1-1) Less-Dust-Generative Matrix-Type Piezoelectric/Electrostrictive Device

Figure 1B:
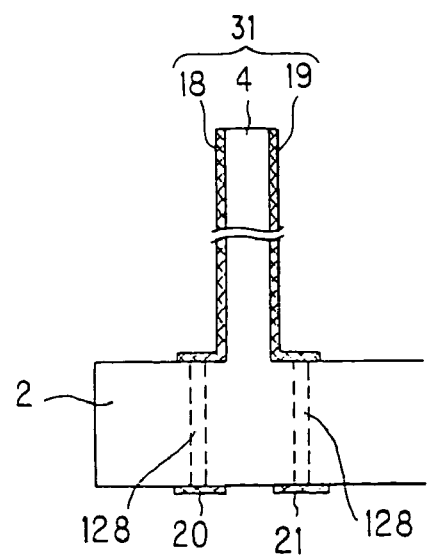
FIG. 1(b) is a side view of arrow J in FIG. 1(a)

A less-dust-generative matrix-type piezoelectric/electrostrictive device according to the present invention will hereinafter be described. FIG. 1(a) is a perspective view showing one embodiment of the less-dust-generative matrix-type piezoelectric/electrostrictive device according to the present invention, and FIG. 1(b) is a side view of arrow J in FIG. 1(a). For a shown less-dust-generative matrix-type piezoelectric/electrostrictive device 1, a plurality of piezoelectric/electrostrictive elements 31 each including a piezoelectric/electrostrictive member 4 and one pair of electrodes 18, 19 are formed on a ceramic substrate 2. When the piezoelectric/electrostrictive members 4 cause displacement on the ceramic substrate 2, the piezoelectric/electrostrictive elements 31 are driven in the piezoelectric/electrostrictive device. The less-dust-generative matrix-type piezoelectric/electrostrictive device 1 possesses essential characteristics common to the less-dust-generative piezoelectric/electrostrictive device according to the present invention described hereinafter and preferable characteristics of the less-dust-generative matrix-type piezoelectric/electrostrictive device according to the present invention.

1-1-a) Electrode Formation on Fired, But Unprocessed Face of Piezoelectric/Electrostrictive Member The essential characteristics common to the less-dust-generative piezoelectric/electrostrictive device according to the present invention are expressed in the points that the less-dust-generative piezoelectric/electrostrictive device 1 is produced according to the methods explained latter without subjecting the major surface of the piezoelectric/electrostrictive member 4 constituting the piezoelectric/electrostrictive element 31 as a driving section to any processing, and the major surface of the piezoelectric/electrostrictive member 4 is constituted of a fired, but unprocessed face. As a result, crystal particles having transgranularly fractured crystal grains do not exist in the major surface of the piezoelectric/electrostrictive member of the piezoelectric/electrostrictive element 31, and defects such as micro cracks generated accompanying the destruction hardly exist in the surface. Therefore, a front surface of the major surface has a uniform state and is homogeneous in surface phase, and there is hardly observed a difference in the distribution of the surface states. Furthermore, since the major surface is unprocessed, different from a mechanically processed surface, cut powder or residual abrasive grain cannot be generated.

Figure 2A:
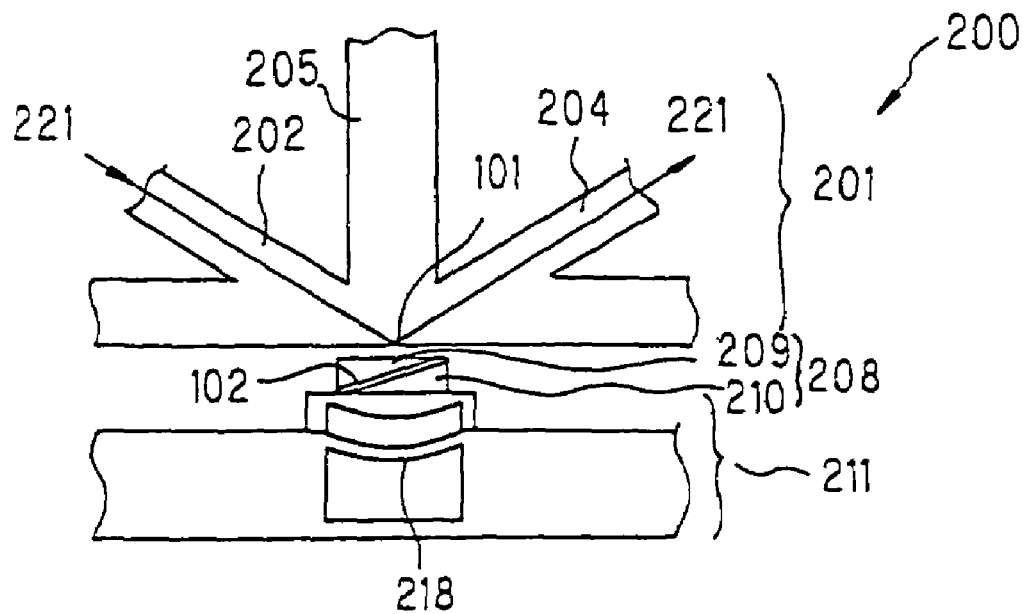
FIG. 2(a) shows an operation state of an actuator section in an optical switch according to the application example.
Figure 2B:
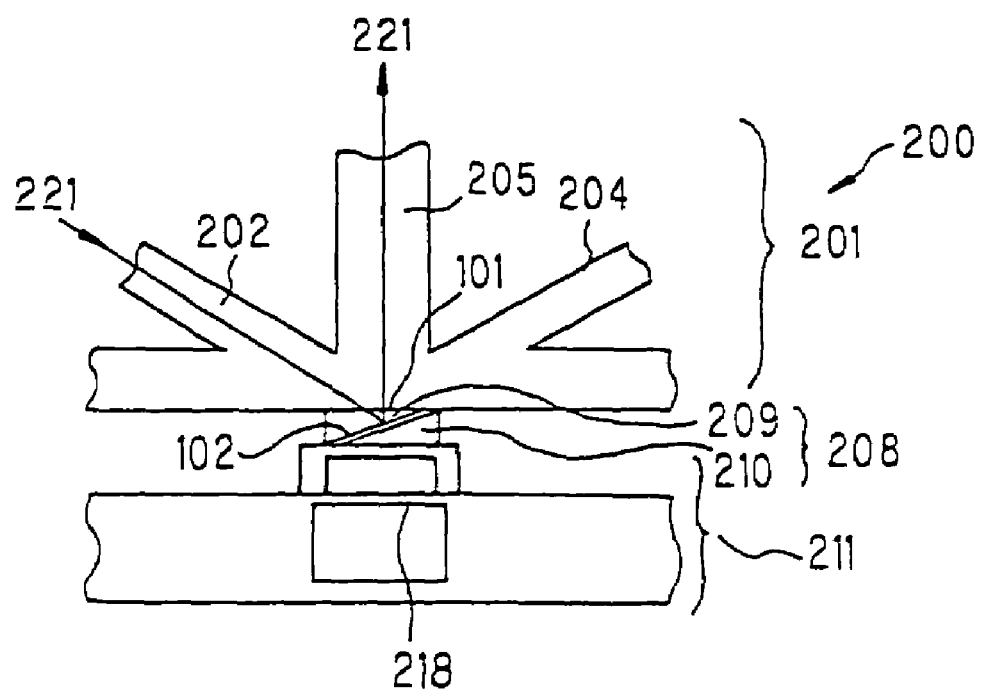
FIG. 2(b) shows an inoperative state of the actuator section in the optical switch according to the application example.

With respect to the major surface, these cut powder, residual abrasive grain, and detached or peeled crystal particles are inhibited from being generated. As a result, the particles are inhibited from being generated over a long period with respect to the piezoelectric/electrostrictive device. For example, when the device is used in an actuator section of an optical switch shown in FIGS. 2(a), 2(b), an optical reflective plate surface or an optical introductory member is not contaminated with the particles, and a reflection/transmission operation of light can correctly and securely be repeated. A switch operation of an optical path, which is a function of the optical switch, is continuously and steadily realized, and high reliability is fulfilled.

Furthermore, by an effect that the underlayer is the fired, but unprocessed face, the electrode formed on the major surface can maintain a stable adhesion state over the long period even by the driving of the piezoelectric/electrostrictive element.

Additionally, since there are no transgranularly fractured crystal grains in the electrode formed surface, strain generated at the time of application of a signal voltage is obtained from all the crystal particles. Moreover, there is little transmission loss of the strain, and electrode adhesion is satisfactory as described above. Therefore, a large value can be obtained with respect to any of the generated displacement, generative force, and generated charge of the piezoelectric/electrostrictive member 4 constituting the piezoelectric/electrostrictive element 31. Since the surface phase of the major surface of the piezoelectric/electrostrictive member 4 is homogeneous, a stress distribution is remarkably small. Even in a structure having a high aspect ratio described later, deformation of the piezoelectric/electrostrictive element 31 is small, and not only accuracy of dimension but also accuracy of pitch are easily maintained.

1-1-b) Piezoelectric/Electrostrictive Element having High Aspect Ratio

In general, for each piezoelectric/electrostrictive element constituting the piezoelectric/electrostrictive device, the piezoelectric/electrostrictive member causes the displacement represented by the following equation.

$$X_B = \frac{L}{T} \times d_{31} \times V \qquad \text{[Equation 1]}$$

On the other hand, the member generates a stress $F_B$ represented by the following equation.

$$F_B = W \times \frac{d_{31}}{S_{11}^E} \times V \quad \text{[Equation 2]}$$

That is, the displacement amount and generative force can separately be designed. In the equation, T denotes thickness of the piezoelectric/electrostrictive member, L denotes height, and W denotes width. The following is an elasticity compliance.

$$S_{11}^E \quad \text{[Equation 3]}$$

Therefore, as seen from these equations, for a shape of the piezoelectric/electrostrictive member, the thickness T is reduced, and the height L is increased, so that the displacement amount is advantageously compatible with the generative force. It has heretofore been very difficult to handle a plate-like member having a large aspect ratio (L/T), and it has been impossible to arrange the members with good precision. Additionally, piezoelectric constant $d_{31}$ (transverse effect) in Equations 1, 2 generally indicates a negative value. With the application of a voltage in a polarization direction of the piezoelectric/electrostrictive member, the piezoelectric/electrostrictive member is displaced in a direction in which the height L decreases, that is, the piezoelectric/electrostrictive element shrinks. Therefore, with the displacement of the piezoelectric/electrostrictive member in a direction in which the height L increases, that is, the piezoelectric/electrostrictive element stretches, a bias electric field is added in a polarization direction beforehand to contract the piezoelectric/electrostrictive member. Additionally, a field intensity applied to the piezoelectric/electrostrictive member is preferably reduced to drive the piezoelectric/electrostrictive element in a stretching direction.

For the less-dust-generative matrix-type piezoelectric/electrostrictive device 1, by a manufacturing method described later, the piezoelectric/electrostrictive elements 31 are formed integrally with the ceramic substrate 2, and the piezoelectric/electrostrictive member 4 constituting the piezoelectric/electrostrictive element 31 can be set to a higher aspect ratio. The less-dust-generative matrix-type piezoelectric/electrostrictive device according to the present invention has a preferable characteristic that the aspect ratio is constituted in a range of 20 to 400 (a part of the device is omitted from the device shown in FIGS. 1(a), 1(b) in the height direction thereof). Therefore, the less-dust-generative matrix-type piezoelectric/electrostrictive device 1 can develop a high piezoelectric capability, and obtains a large displacement amount and high generative force at a lower voltage, and it is possible to obtain a large charge with a low stress.

1-1-c) Piezoelectric/Electrostrictive Member superior in Straightness of Axial Line The less-dust-generative matrix-type piezoelectric/electrostrictive device 1 develops the preferable characteristic of the less-dust-generative matrix-type piezoelectric/electrostrictive device according to the present invention in that the device is molded so as to substantially set straightness of an axial line of the piezoelectric/electrostrictive member 4 constituting the piezoelectric/electrostrictive element 31 to about 30 μm or less. That is, the piezoelectric/electrostrictive member 4 constituting an elongated rectangular parallelepiped member has a geometrically correct shape very close to the rectangular parallelepiped shape without any deformation. Therefore, it is easy to exert the displacement amount or the generative force in an intended direction with an intended amount. There is also an advantage that the characteristic of the piezoelectric/electrostrictive element 31 can efficiently be used. Moreover, an operation point does not easily deviate at the time of the driving.

Furthermore, since the straightness of the axial line is superior, a distance between one piezoelectric/electrostrictive element 31 and the other piezoelectric/electrostrictive element 31 disposed adjacent to the one element is kept to be substantially constant in the vicinity of the bonded portion with respect to the ceramic substrate 2, in the vicinity of a top of the piezoelectric/electrostrictive element 31 itself (i.e., the vicinity of the operation point in many cases) or in an intermediate portion. Even in the mode having the high aspect ratio described above, for example, the elements do not contact each other, or do not mutually hinder driving operations. Therefore, it is possible to arrange the elements at a higher density. Additionally, even in the mode having the high aspect ratio, the element indicates high resistance as the actuator against reactions from operations such as pushing or tapping of an object, and does not easily cause damages such as breakage and crack.

1-1-d) Piezoelectric/Electrostrictive Elements capable of being Arranged at High Density In the less-dust-generative matrix-type piezoelectric/electrostrictive device 1 shown in FIG. 1(a), a plurality of piezoelectric/electrostrictive elements 31 are aligned/arranged in a two-dimensional matrix form, independently of one another, and integrally with the ceramic substrate 2 on one substantially solid thick ceramic substrate 2. A plurality of piezoelectric/electrostrictive elements 31 are not individually arranged or formed on the ceramic substrate 2. Moreover, an adhesive is not interposed in a portion which is a base point of displacement development of the piezoelectric/electrostrictive member 4 constituting the piezoelectric/electrostrictive element 31 in the structure. Therefore, needless to say, an initial accuracy of the dimension or pitch of the piezoelectric/electrostrictive element 31 is high. Phenomenon such as deterioration of an interposed material cannot occur, and therefore the high dimensional accuracy and piezoelectric/electrostrictive element characteristic can be maintained over the long period.

Additionally, the less-dust-generative matrix-type piezoelectric/electrostrictive device 1 is formed to be thin, and the thickness T of the piezoelectric/electrostrictive member 4 constituting the piezoelectric/electrostrictive element 31 is 300 μm or less. Furthermore, the device includes a structure in which the film-like electrodes 18, 19 are formed on the side surfaces (front surfaces) of the piezoelectric/electrostrictive member 4, and a distance between the pair of electrodes 18, 19 is 300 μm or less.

Therefore, in the less-dust-generative matrix-type piezoelectric/electrostrictive device 1, needless to say, when the pitch is 1 mm, or even when the pitch is 0.5 mm or less, it is possible to two-dimensionally arrange the piezoelectric/electrostrictive elements 31 on the ceramic substrate 2. The device also possesses the preferable characteristic of the less-dust-generative matrix-type piezoelectric/electrostrictive device according to the present invention that the piezoelectric/electrostrictive elements 31 including the piezoelectric/electrostrictive members 4 developing the large displacement amount and high generative force and having the high aspect ratio can be arranged at a density higher than ever before.

It is to be noted that in the less-dust-generative matrix-type piezoelectric/electrostrictive device 1, the piezoelectric/electrostrictive element is constituted of one layer of the piezoelectric/electrostrictive member. However, for the less-dust-generative matrix-type piezoelectric/electrostrictive device according to the present invention, in an application requiring the high generative force and mechanical strength, the piezoelectric/electrostrictive element is preferably constituted of two or more layers of piezoelectric/electrostrictive members. In this case, the thickness of one layer of the piezoelectric/electrostrictive member is 300 µm or less, that is, a distance between the one pair of electrodes is preferably 300 µm or less.

As described above, the mode example of the piezoelectric actuator heretofore disclosed in Japanese Patent No. 3058143 cannot be said to have an arrangement density sufficient for handling resolution which has been required in an ink jet printer in recent years. The arrangement density is not satisfactory even in one example of the mode of the optical switch shown in FIGS. 2(a), 2(b). However, in the less-dust-generative matrix-type piezoelectric/electrostrictive device 1, the respective piezoelectric/electrostrictive elements can be arranged at the high density as described above, and this can contribute to miniaturization of applied apparatuses.

Moreover, in the less-dust-generative matrix-type piezoelectric/electrostrictive device 1, even the piezoelectric/electrostrictive elements 31 having the high aspect ratios can be arranged at the high density. Concretely, for the arrangement density, a ratio of the interval between the piezoelectric/electrostrictive elements 31 disposed adjacent to each other to the height of the piezoelectric/electrostrictive element 31 is substantially 1:20 to 1:400.

As described above, since the major surface of the piezoelectric/electrostrictive member 4 is the fired, but unprocessed face, and the surface phase is homogeneous, the stress distribution is small. Moreover, because of the structure in which the piezoelectric/electrostrictive elements 31 are integrated with the ceramic substrate 2, deterioration does not easily occur with an elapse of time. Therefore, the accuracy of dimension of the piezoelectric/electrostrictive element 31 (piezoelectric/electrostrictive member 4) and the accuracy of pitch between two piezoelectric/electrostrictive elements 31 disposed adjacent to each other are maintained over the long period. The straightness of the axial line of the piezoelectric/electrostrictive element 31 is superior, that is, the piezoelectric/electrostrictive member 4 has the shape very close to the geometrically correct rectangular parallelepiped shape having no deformation. Therefore, each of the plurality of piezoelectric/electrostrictive elements 31 (piezoelectric/electrostrictive members 4) can be formed in the same direction with respect to the ceramic substrate 2 (e.g., all vertically to the ceramic substrate 2). Therefore, even when the piezoelectric/electrostrictive elements 31 having the high aspect ratios are arranged at the high density, the piezoelectric/electrostrictive elements 31 (piezoelectric/electrostrictive members 4) do not contact one another. Moreover, there is not a possibility that the elements operate with respect to operation points (e.g., of the piezoelectric/electrostrictive elements 31 disposed adjacent to each other) which are not original operation points, and cause erroneous operations.

The less-dust-generative matrix-type piezoelectric/electrostrictive device 1 in which the piezoelectric/electrostrictive elements 31 can be arranged at the high density is preferable as the actuator for use in an optical switch for an photonic router or a print head for the ink jet printer which will be developed in future.

In the less-dust-generative matrix-type piezoelectric/electrostrictive device according to the present invention, the matrix arrangement of the piezoelectric/electrostrictive electrodes is not limited to the arrangement in which the elements cross at right angles to one another as in the less-dust-generative matrix-type piezoelectric/electrostrictive device 1. An intersection angle may be either 30° or 45°, and is determined by purposes or applications. The word "thick" for the ceramic substrate is used to mean that the ceramic substrate does not function as a diaphragm. The ceramic substrate has a thickness to such an extent that the piezoelectric/electrostrictive element formed on the substrate is not deformed even under the generated stress.

Moreover, the matrix-like arrangement of the piezoelectric/electrostrictive elements is not especially limited, but a constitution represented by $2^M \times 2^N$ (M, N are 0 or integers of 1 or more) such as 16×16 (256 elements) and 32×32 (1024 elements) is preferable. For example, when a large-scale matrix-type piezoelectric/electrostrictive device is to be constituted, the device may entirely integrally be prepared. However, for example, to prepare the piezoelectric/electrostrictive device including 32×32 elements, four piezoelectric/electrostrictive devices including integrated 16×16 elements are combined. Like this constitution, a mode is also preferable in which the less-dust-generative matrix-type piezoelectric/electrostrictive device according to the present invention is used as a basic unit and a plurality of devices are combined.

1-1-e Others

The less-dust-generative matrix-type piezoelectric/electrostrictive device 1 has been illustrated above, and the essential characteristics in the less-dust-generative piezoelectric/electrostrictive device according to the present invention, and the preferable characteristics of the less-dust-generative matrix-type piezoelectric/electrostrictive device according to the present invention have been described. Additionally, for the less-dust-generative matrix-type piezoelectric/electrostrictive device according to the present invention, as shown by the less-dust-generative matrix-type piezoelectric/electrostrictive device 1 (see FIG. 1(a)), electrode terminals 20, 21 are formed on a surface of the ceramic substrate 2 opposite to the surface on which the piezoelectric/electrostrictive elements 31 are arranged. The electrode 18 and electrode terminal 20, and the electrode 19 and electrode terminal 21 extend through the ceramic substrate 2, and are wired via through holes 128 including conductive members (electrically conductive materials) formed on inner walls of the holes in a preferable mode. Since the electrode terminals 20, 21 are formed on the side opposite to the piezoelectric/electrostrictive elements 31 constituting a driving section, a power supply connection operation for applying an electric field later is facilitated, and yield drop caused by a manufacturing process can be prevented.

Moreover, the less-dust-generative matrix-type piezoelectric/electrostrictive device according to the present invention can possesses characteristics of a guide-attached matrix-type piezoelectric/electrostrictive device according to the present invention described later, and this mode is also preferable.

Furthermore, in the less-dust-generative matrix-type piezoelectric/electrostrictive device 1 shown in FIG. 1(a), or the less-dust-generative matrix-type piezoelectric/electrostrictive device shown in a drawing showing the manufacturing method described later (FIG. 3(g), and the like), the electrode is formed entirely over the side surface (major surface) of the piezoelectric/electrostrictive element (piezoelectric/electrostrictive member). However, the less-dust-generative matrix-type piezoelectric/electrostrictive device according to the present invention also preferably includes a mode in which the electrode is not formed, for example, in the vicinity of a tip end of the piezoelectric/electrostrictive element. In this case, the portion in which the electrode is not formed does not contribute to the displacement.

Figure 16:
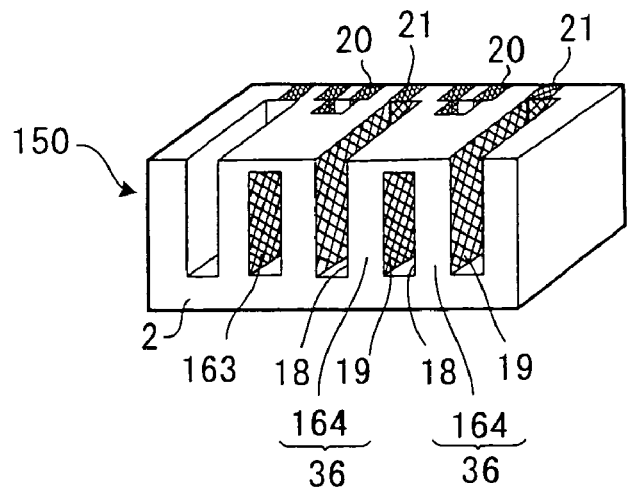
FIG. 16 is a perspective view showing one embodiment of the less-dust-generative cell-driving type piezoelectric/electrostrictive device according to the present invention.
Figure 17:
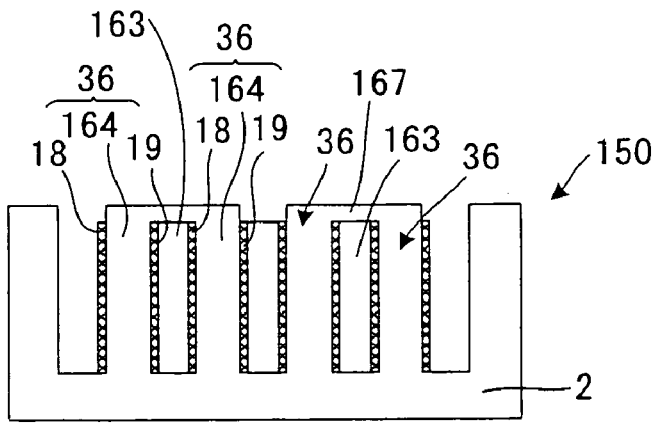
FIG. 17 is a sectional view showing the less-dust-generative cell-driving type piezoelectric/electrostrictive device shown in FIG. 16.

(1-2) Less-Dust-Generative Cell-Driving Type Piezoelectric/Electrostrictive Device Next, a less-dust-generative cell-driving type piezoelectric/electrostrictive device according to the present invention will be described. FIGS. 16 and 17 are diagrams showing one embodiment of the less-dust-generative cell-driving type piezoelectric/electrostrictive device according to the present invention, FIG. 16 is a perspective view, and FIG. 17 is a sectional view.

A shown less-dust-generative cell-driving type piezoelectric/electrostrictive device 150 is a piezoelectric/electrostrictive device in which a plurality of piezoelectric/electrostrictive elements 36 each including a piezoelectric/electrostrictive member 164 and one pair of electrodes 18, 19 are formed integrally with the ceramic substrate 2, and the piezoelectric/electrostrictive members 164 cause the displacement on the ceramic substrate 2 to drive the piezoelectric/electrostrictive elements 36. The piezoelectric/electrostrictive elements 36 have thin wall shapes, and are set up like comb teeth on the ceramic substrate 2. The ceramic substrate 2, one piezoelectric/electrostrictive element 36 and the other piezoelectric/electrostrictive element 36 disposed adjacent to the one piezoelectric/electrostrictive element 36, that is, two piezoelectric/electrostrictive elements 36 disposed adjacent to each other, and a lid section 167 connecting the piezoelectric/electrostrictive element 36 to the other element form a cell 163.

For example, an opening of the cell 163 of the less-dust-generative cell-driving type piezoelectric/electrostrictive device 150 (openings on a tip-end side of the piezoelectric/electrostrictive elements 36 set up like the comb teeth to form the cell 163) is closed by a plate-like member, and supply and discharge holes of solution are formed in a part of the sealed/cell surrounded by walls 163. Accordingly, it is possible to obtain a liquid discharge device in which the cell 163 is used as a pressurizing chamber. It is to be noted that in the less-dust-generative cell-driving type piezoelectric/electrostrictive device 150, for easy understanding of the description, the cell 163 is opened, and closed later by the plate-like member. However, in the less-dust-generative cell-driving type piezoelectric/electrostrictive device according to the present invention, the cell may be sealed/closed from the beginning. Here, the beginning means a time at which at least the ceramic substrate and the piezoelectric/electrostrictive elements disposed adjacent to each other integrally form the cell. It is possible to prepare the less-dust-generative cell-driving type piezoelectric/electrostrictive device including the sealed/cell surrounded by walls without attaching the plate-like member later. The sealed/cell surrounded by walls is preferably integrally formed also including the lid section connecting one piezoelectric/electrostrictive element to the other element.

In the obtained liquid discharge device, for example, when the piezoelectric/electrostrictive element 36 is expanded/contracted, for example, in a vertical direction, a volume of the cell 163 constituting the pressurizing chamber is changed, and solution charged in the cell 163 can be discharged. This liquid discharge device can be applied, for example, to the head of the ink jet printer, or a micro droplet discharge apparatus for use in the manufacturing of a DNA chip necessary for a mixing/reacting operation of a micro amount of solution or analysis of a genetic structure in a field of biotechnology, or in a coating step for manufacturing a semiconductor. The less-dust-generative cell-driving type piezoelectric/electrostrictive device 150 possesses the essential characteristics common to the less-dust-generative piezoelectric/electrostrictive devices according to the present invention described hereinafter, and the preferable characteristics of the less-dust-generative cell-driving type piezoelectric/electrostrictive device according to the present invention.

1-2-a) Electrode Formation on Fired, But Unprocessed Face of Piezoelectric/Electrostrictive Member In the same manner as in the less-dust-generative matrix-type piezoelectric/electrostrictive device 1 described above, the less-dust-generative cell-driving type piezoelectric/electrostrictive device 150 is prepared without subjecting the major surface of the piezoelectric/electrostrictive member 164 constituting the piezoelectric/electrostrictive element 36 to any processing in accordance with the manufacturing method example described later. In other words, the less-dust-generative cell-driving type piezoelectric/electrostrictive device 150 develops the essential characteristics of the less-dust-generative piezoelectric/electrostrictive device according to the present invention in that the major surface of the piezoelectric/electrostrictive member 164 is constituted of the fired, but unprocessed face.

As a result, the transgranularly fractured crystal grains do not exist in the major surface of the piezoelectric/electrostrictive member 164 of the piezoelectric/electrostrictive element 36, and the defects such as the micro cracks generated accompanying the destruction hardly exist in the surface. Therefore, the front surface of the major surface has the uniform state and is homogeneous in the surface phase, and there is hardly observed a difference in the distribution of the surface states. Furthermore, since the major surface is unprocessed, different from the mechanically processed surface, the cut powder or residual abrasive grain cannot be generated. With respect to the major surface, the cut powder, residual abrasive grain, and detached or peeled crystal particles are inhibited from being generated. As a result, the particles are inhibited from being generated over the long period with respect to the piezoelectric/electrostrictive device.

For example, when the liquid discharge device is made up of the less-dust-generative cell-driving type piezoelectric/electrostrictive device 150, and the discharge device is applied as the head of the ink jet printer, one may be free from the fear that the solution such as an ink charged in the cell 163 is contaminated with unintended particles. Therefore, the liquid discharge device is free from troubles such as clogging, and can attain high reliability, and contribute of enhancement and long-period stabilization of a quality level of printing of the ink jet printer.

1-2-b) Others

As effects by the major surfaces of the piezoelectric/electrostrictive member 164 on which the electrodes 18, 19 are formed being constituted of the fired, but unprocessed faces, the adhesion state of the electrodes is stabilized over the long period, transmission loss of strain is reduced, and stress distribution is minimized. These conform to the less-dust-generative matrix-type piezoelectric/electrostrictive device 1 described above.

When the less-dust-generative cell-driving type piezoelectric/electrostrictive device according to the present invention is used in the applications described above, such as the head of the ink jet printer and the micro droplet discharge device, the aspect ratio of the piezoelectric/electrostrictive element is preferably substantially 2 to 40. For the less-dust-generative cell-driving type piezoelectric/electrostrictive device 150, in conformity to the less-dust-generative matrix-type piezoelectric/electrostrictive device 1, the piezoelectric/electrostrictive element 36 can be formed in a mode having a higher aspect ratio. Therefore, it is easy to set the piezoelectric/electrostrictive element 36 (piezoelectric/electrostrictive member 164) forming the cell 163 to the aspect ratio in this range.

Figure 18:
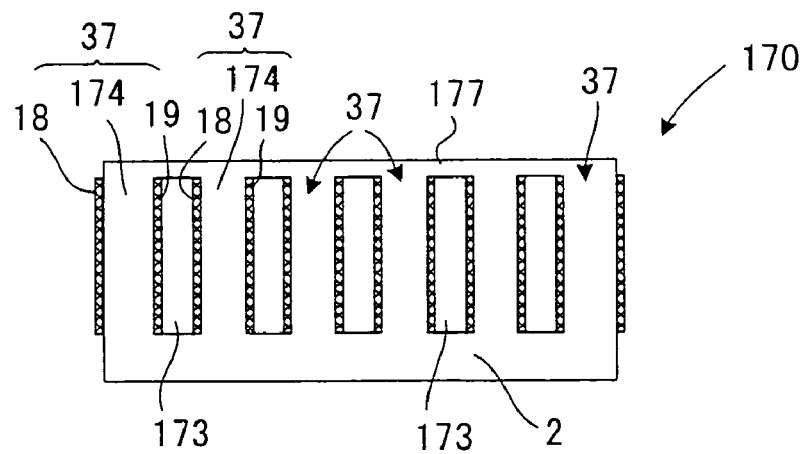
FIG. 18 is a sectional view showing another embodiment of the less-dust-generative cell-driving type piezoelectric/electrostrictive device according to the present invention.

In the less-dust-generative cell-driving type piezoelectric/electrostrictive device 150, as shown in FIGS. 16, 17, two cells 163 disposed adjacent to each other are formed independently of each other, but the less-dust-generative cell-driving type piezoelectric/electrostrictive device according to the present invention may also has a mode in which the cells are cells being surrounded by walls as in a less-dust-generative cell-driving type piezoelectric/electrostrictive device 170 shown in FIG. 18. The less-dust-generative cell-driving type piezoelectric/electrostrictive device 170 is formed by the ceramic substrate 2, a plurality of piezoelectric/electrostrictive elements 37 including piezoelectric/electrostrictive members 174 on which the electrodes 18, 19 are formed, and a lid section 177 connecting the plurality of piezoelectric/electrostrictive elements 37 to one another on a side opposite to the ceramic substrate 2. Two cells 173 disposed adjacent to each other share one piezoelectric/electrostrictive element 37, and are formed as cells surrounded by walls each other.

In the less-dust-generative cell-driving type piezoelectric/electrostrictive device according to the present invention, in the applications such as the head of the ink jet printer, the arrangement density represented by a ratio of the interval between the cells disposed adjacent to each other to the height of the piezoelectric/electrostrictive element constituting the cell is appropriately substantially 1:2 to 1:100. In the less-dust-generative cell-driving type piezoelectric/electrostrictive device 150, in conformity to the less-dust-generative matrix-type piezoelectric/electrostrictive device 1 described above, the piezoelectric/electrostrictive elements 36 forming the cells 163 can be arranged at the higher density. Therefore, it is easily to form two cells 163 disposed adjacent to each other independently of each other in this range of the arrangement density.

In the less-dust-generative cell-driving type piezoelectric/electrostrictive device 150, the piezoelectric/electrostrictive element is constituted of one layer of the piezoelectric/electrostrictive member, but in the less-dust-generative cell-driving type piezoelectric/electrostrictive device according to the present invention, in the application requiring the high generative force and mechanical strength, the piezoelectric/electrostrictive element is preferably constituted of two or more layers of piezoelectric/electrostrictive members. The thickness of one layer of piezoelectric/electrostrictive member is 300 μm or less, that is, a distance between the one pair of electrodes is preferably 300 μm or less.

(2) Manufacturing Method of Less-Dust-Generative Piezoelectric/Electrostrictive Device Next, a method for manufacturing the less-dust-generative piezoelectric/electrostrictive device according to the present invention will be described. According to the present invention, there is provided a method for manufacturing a less-dust-generative piezoelectric/electrostrictive device in which a plurality of piezoelectric/electrostrictive elements each including a piezoelectric/electrostrictive member and at least one pair of electrodes formed on side surfaces of the piezoelectric/electrostrictive member are set up on a ceramic substrate, and the ceramic substrate is integrally formed with the piezoelectric/electrostrictive element. Moreover, the side surfaces of the piezoelectric/electrostrictive member on which the electrodes are formed are fired, but unprocessed faces. In the method, a plurality of ceramic green sheets containing piezoelectric/electrostrictive materials as a major component are prepared, hole portions are formed in a predetermined number of ceramic green sheets among the plurality of ceramic green sheets, and the ceramic green sheet in which the hole portion is formed is superposed upon the ceramic green sheet in which the hole portion is not formed to obtain a ceramic green laminate. After firing/integrating the ceramic green laminate, a step of subjecting the laminate to predetermined processing is carried out.

Among the stacked ceramic green sheets, the ceramic green sheet in which the hole portion is not formed forms the piezoelectric/electrostrictive member constituting the piezoelectric/electrostrictive element while the surface of the sheet is kept as the fired, but unprocessed face. The hole portion of the ceramic green sheet in which the hole portion is formed constitutes later a space between the side surfaces (major surfaces) of the piezoelectric/electrostrictive member on which the electrodes are formed in two piezoelectric/electrostrictive elements disposed adjacent to each other among the plurality of piezoelectric/electrostrictive elements.

The method for manufacturing the less-dust-generative piezoelectric/electrostrictive device according to the present invention is a manufacturing method by a green sheet stacking method, and is characterized in a stacking direction of the ceramic green sheets. In the manufacturing method, the ceramic green sheets are stacked so that the ceramic green sheets constituting the piezoelectric/electrostrictive member can constitute the piezoelectric/electrostrictive member later while keeping the surface as the fired, but unprocessed face. Therefore, as described later, the stacking direction of the ceramic green sheets can be represented by a relationship with a direction related to the setting-up mode of the piezoelectric/electrostrictive element of the less-dust-generative piezoelectric/electrostrictive device which is a manufacturing object.

That is, for the method for manufacturing the less-dust-generative piezoelectric/electrostrictive device according to the present invention, in other words, the plurality of ceramic green sheets containing the piezoelectric/electrostrictive materials as major components are stacked to obtain the ceramic green laminate. After firing/integrating the ceramic green laminate, the step of subjecting the laminate to the predetermined processing is carried out. The plurality of ceramic green sheets include at least the ceramic green sheet constituting the piezoelectric/electrostrictive member later, and the ceramic green sheet including the hole portion constituting a space between the side surfaces (major surfaces) of the piezoelectric/electrostrictive member on which the electrodes are formed in two piezoelectric/electrostrictive elements disposed adjacent to each other among the plurality of piezoelectric/electrostrictive elements. The stacking direction of the plurality of ceramic green sheets is the arrangement direction of the plurality of piezoelectric/electrostrictive elements obtained later, and is the same as a direction toward the other adjacent piezoelectric/electrostrictive element from one piezoelectric/electrostrictive element. For the elements, the side surfaces (major surfaces) of the piezoelectric/electrostrictive members including the electrodes formed on the surfaces are disposed opposite to each other. The manufacturing method can be represented in this manner. The direction for stacking the plurality of ceramic green sheets represented in this manner is a direction toward the sheet to be stacked from the sheet onto which the sheet is to be stacked (or a reverse direction).

In this manner, the direction of the surface of the ceramic green sheet agrees with the setting-up direction (height direction) of the piezoelectric/electrostrictive element (piezoelectric/electrostrictive member) on the ceramic substrate obtained later. By this devise, without subjecting at least a portion constituting the major surface of the piezoelectric/electrostrictive member to any processing, that is, while keeping the portion constituting the major surface of the piezoelectric/electrostrictive member as the fired, but unprocessed face, it is possible to manufacture the piezoelectric/electrostrictive device.

The above-mentioned method has never been proposed before. In a conventional manufacturing method, for the individual piezoelectric/electrostrictive members divided from the ceramic green laminate obtained by laminating the ceramic green sheets, the side surfaces (electrode formed surfaces of the piezoelectric/electrostrictive member) are processed, and are not kept as the fired, but unprocessed faces.

In the less-dust-generative piezoelectric/electrostrictive device according to the present invention, the piezoelectric/electrostrictive element preferably includes two or more layers of piezoelectric/electrostrictive members, and electrodes formed on opposite outer surfaces of two or more layers of piezoelectric/electrostrictive members and between two or more layers of piezoelectric/electrostrictive members. However, to obtain this less-dust-generative piezoelectric/electrostrictive device, a necessary number of ceramic green sheets in which the hole portions are not disposed are stacked in two or more layers in contact with one another, and the ceramic green sheets in which the hole portions are disposed may be stacked on the opposite outer surfaces of the members.

In the method for manufacturing the less-dust-generative piezoelectric/electrostrictive device according to the present invention, a timing for forming the electrode on the fired, but unprocessed face is not limited except the electrode disposed between the piezoelectric/electrostrictive members in a case in which the piezoelectric/electrostrictive element is constituted of two or more layers of piezoelectric/electrostrictive members. When the piezoelectric/electrostrictive element is constituted of one layer of the piezoelectric/electrostrictive member, the electrode may also be formed beforehand in a predetermined position of the ceramic green sheet constituting the piezoelectric/electrostrictive member later before the stacking. Alternatively, the ceramic green sheets are stacked so that the ceramic green sheet constituting the piezoelectric/electrostrictive member later is held between the ceramic green sheets including the hole portions. Subsequently, the space is formed beforehand between the side surfaces (major surfaces) of the piezoelectric/electrostrictive members on which the electrodes are formed in two piezoelectric/electrostrictive elements disposed adjacent to each other among the plurality of piezoelectric/electrostrictive elements. In this case, in a stage in which the ceramic green laminate is obtained, a stage in which the ceramic green laminate is fired/integrated, or a final stage in which the less-dust-generative piezoelectric/electrostrictive device is completed (substantially excluding wirings), it is possible to form the electrodes. It is to be noted that with the piezoelectric/electrostrictive element including two or more layers of piezoelectric/electrostrictive members, and the electrodes formed on the opposite outer surfaces of two or more layers of piezoelectric/electrostrictive members and between two or more layers of piezoelectric/electrostrictive members, the electrode disposed between at least two or more layers of piezoelectric/electrostrictive members needs to be formed on the predetermined position of the ceramic green sheet constituting the piezoelectric/electrostrictive member before the stacking.

The methods for manufacturing the less-dust-generative piezoelectric/electrostrictive device according to the present invention will be explained in great detail for the methods manufacturing the less-dust-generative matrix-type piezoelectric/electrostrictive device or less-dust-generative cell-driving type piezoelectric/electrostrictive device described above.

(2-1) Method for manufacturing Less-Dust-Generative Matrix-Type Piezoelectric/Electrostrictive Device The method for manufacturing the less-dust-generative matrix-type piezoelectric/electrostrictive device according to the present invention will first be described hereinafter. The method for manufacturing the less-dust-generative matrix-type piezoelectric/electrostrictive device according to the present invention is a method for manufacturing a piezoelectric/electrostrictive device in which a plurality of piezoelectric/electrostrictive elements each including the piezoelectric/electrostrictive member and at least one pair of electrodes formed on the side surfaces of the piezoelectric/electrostrictive member and having a pillar shape are set up in the matrix form on the think-wall ceramic substrate, the ceramic substrate is formed integrally with the piezoelectric/electrostrictive element, and the side surfaces of the piezoelectric/electrostrictive member on which the electrodes are formed are the fired, but unprocessed faces. There are first to three manufacturing methods described hereinafter.

2-1-1) First Manufacturing Method

In a first method for manufacturing the less-dust-generative matrix-type piezoelectric/electrostrictive device according to the present invention, the ceramic green sheet constituting the piezoelectric/electrostrictive member later is stacked on the ceramic green sheet in which one hole portion is disposed to obtain the ceramic green laminate, the ceramic green laminate is fired/integrated, and subsequently subjected to the predetermined processing. The term "one hole portion" in the present specification means the portion constituting the space between the side surfaces (major surfaces) of the piezoelectric/electrostrictive member on which the electrodes are formed in two piezoelectric/electrostrictive elements disposed adjacent to each other among a plurality of piezoelectric/electrostrictive elements.

First, one mode of the first manufacturing method will be described. In one mode of the first method for manufacturing the less-dust-generative matrix-type piezoelectric/electrostrictive device according to the present invention, the manufacturing method includes a step B1 of preparing a plurality of ceramic green sheets each containing a piezoelectric/electrostrictive material as a major component; a step B2 of opening a predetermined position of each of a predetermined number of ceramic green sheets among the plurality of ceramic green sheets to obtain a frame-shaped ceramic green sheet in which one hole portion is formed; a step B3 of superposing at least the frame-shaped ceramic green sheet onto the predetermined number of ceramic green sheets in which any hole portion is not formed to obtain a ceramic green laminate including a closed hole; a step B4 of firing/integrating the ceramic green laminate to obtain a ceramic laminate including the closed hole; a step B5 of cutting the ceramic laminate to obtain the ceramic laminate including an open hole obtained by opening one end of the closed hole; and a step B6 of making a cut in a direction intersecting with a wall portion of the ceramic laminate in which the opened hole is to be formed and in a depth direction of the opened hole.

In the manufacturing method including the above-described steps B1 to B6, a plurality of sub-hole portions communicating with one hole portion are preferably formed in all or some of the predetermined number of ceramic green sheets each having the frame shape in which the predetermined position is opened to form one hole portion. The sub-hole portion can constitute a through hole on whose inner wall a conductive member is formed later, and the wiring is facilitated.

For the preferable mode of the first method for manufacturing the less-dust-generative matrix-type piezoelectric/electrostrictive device according to the present invention, the device is prepared in accordance with the steps B1 to B6 in this order as such, but the order is not limited. The order can appropriately be changed or the steps can simultaneously be carried out. When the steps are changed, a member to be treated in each step naturally accordingly changes.

The step of forming the electrodes is not included in s B1 to B6. This is because the first method for manufacturing the less-dust-generative matrix-type piezoelectric/electrostrictive device according to the present invention does not limit the timing for forming the electrodes. The steps B1 to B6 are the steps in a case in which the piezoelectric/electrostrictive element is constituted of one layer of piezoelectric/electrostrictive member. Therefore, for example, before the step B3, the electrodes may also be formed beforehand in the predetermined positions (positions disposed opposite to the hole portions) of the predetermined number of ceramic green sheets in which the hole portions are not formed. Alternatively, after the step B5, the electrode may also be formed in the ceramic laminate.

By the manufacturing method including the steps B1 to B6, the predetermined portion of the ceramic green sheet in which the predetermined position is not opened, that is, the hole portion is not disposed constitutes the wall portion forming the opened hole of the fired ceramic laminate. When the wall portion forms the electrode formed surface and is individually divided by predetermined cuts, the piezoelectric/electrostrictive elements integrally set up in the matrix form are obtained. The electrode formed surface of the piezoelectric/electrostrictive member constituting the piezoelectric/electrostrictive element is not subjected to any mechanical processing.

One example of schematic steps of the manufacturing method including the steps B1 to B6 is shown in FIGS. 4(a) to 4(g). This example will concretely be described hereinafter.

First, the predetermined number of ceramic green sheets containing the piezoelectric/electrostrictive materials described later as a major component are prepared (see a second manufacturing method described later). As the sheet, as shown in FIG. 4(a), a plurality of sheets 16 which are molded and whose outer shapes are processed by a predetermined processing method, and sheets 517 obtained by processing the molded sheets to dispose hole portions 515 substantially having square shapes and slit-shaped sub-hole portions 25 continued to the hole portions 515 are prepared by the predetermined number, respectively. Subsequently, these predetermined numbers of sheets 16, 517 are stacked and press-bonded to obtain a ceramic green laminate 501 (see FIG. 4(b)). For the stacking method, in this example, uppermost and lowermost layers are constituted of the sheets 16, the sheets 16 and 517 are assumed as one unit, and between the layers, the same number of sheets as the number of columns (rows) of the piezoelectric/electrostrictive device in which the piezoelectric/electrostrictive elements are arranged in the matrix form are superposed. It is to be noted that a sheet constituting one unit together with the sheet 517 may also be of a mode different from that of the sheet 16 of the uppermost or lowermost layer. For example, a sheet having a flat plate shape but having a different thickness may also be used. Furthermore, the term "one unit" in the present specification means not only a combination of the sheet 16 with the sheet 517, but also a unit comprising the sheet 517, sheet 16, and sheet 517. A plurality of the units may successively be stacked on one another via the sheet (not shown) including only the hole portion 515. The uppermost and lowermost layers may also be the sheets 517.

The ceramic green laminate 501 shown in FIG. 4(b) contains the piezoelectric/electrostrictive material which is the major component, and includes the closed holes and through holes 128 (see FIG. 4(d)) which exist in the laminate and are not shown in the drawing. The closed hole is constituted of the hole portion 515 of the sheet 517 held between two sheets 16. The through holes 128 are constituted of the sub-hole portions 25 disposed in the sheet 517. Moreover, the ceramic green laminate 501 is fired/integrated to obtain a ceramic laminate 503 (see FIG. 4(c)). It is to be noted that, needless to say, the closed hole and through hole are preferably connected to outside world via gas vent holes (see a second manufacturing method described later, further similarly a third manufacturing method described later).

Next, as shown in FIG. 4(c), an unnecessary portion is cut/removed along cut lines 550 to expose the through holes 128 as shown in FIG. 4(d) and to obtain a ceramic laminate 504 in which small open holes 5 are formed as shown in FIG. 4(e). It is to be noted that the open hole 5 is formed by opening one end surface of the closed hole by the cutting. The ceramic laminate 504 shown in FIG. 4(e) shows the state that the ceramic laminate 504 shown in FIG. 4(d) has been raised by 90°. In the ceramic laminate 504 shown in FIG. 4(d), the surface in which the through holes 128 are opened (front side in the drawing, XZ plane) forms the side surface, but in the ceramic laminate 504 shown in FIG. 4(e), the surface in which the through holes 128 are opened constitutes a lower surface.

Moreover, in the ceramic laminate 504 shown in FIG. 4(e), the electrodes 18, 19 are formed on the opposite surfaces of the wall portion in which the open holes 5 are formed. Additionally, a conductive film is also formed on an inner wall of the through hole 128.

Next, as shown in FIG. 4(f), the unnecessary portion is cut/removed along a cut line 551 to obtain individually divided piezoelectric/electrostrictive members 14 (piezoelectric/electrostrictive elements 32). Here, the unnecessary portion is a portion which does not constitute the piezoelectric/electrostrictive element 32. By a way of removing the unnecessary portion, the shape of the piezoelectric/electrostrictive element 32, and a distance (of an X-axis direction) between non-major-surfaces of the piezoelectric/electrostrictive elements 32 disposed adjacent to each other are determined. Thereafter, if necessary, a polarization treatment is carried out, and a less-dust-generative matrix-type piezoelectric/electrostrictive device 500 is completed (FIG. 4(g)).

It is to be noted that in the present example relating to the first manufacturing method, to simplify the description for ease of understanding, the sheet 16 and the sheet 517 including the sub-hole portions 25 are alternately stacked. In the obtained less-dust-generative matrix-type piezoelectric/electrostrictive device 500, the through holes 128 are substantially shared between two piezoelectric/electrostrictive elements 32 (electrodes 18, 19) disposed adjacent to each other in the sheet stacking direction. The electrodes 18, 19 which share the through holes 128 inevitably indicate the same potential at the time of the driving. Needless to say, the individual through holes 128 may separately be disposed with respect to the respective electrodes 18, 19 of each piezoelectric/electrostrictive element 32. On the other hand, in two or more piezoelectric/electrostrictive elements 32, the electrodes indicating the same potential at the time of the driving may share the through holes regardless of whether or not the piezoelectric/electrostrictive elements 32 are disposed opposite to each other.

For example, when to ceramic green laminate is prepared as follows, it is possible to obtain to less-dust-generative matrix-type piezoelectric/electrostrictive device including the separate through holes 128 with respect to the respective electrodes 18, 19 of each piezoelectric/electrostrictive element 32. First, a plurality of ceramic green laminate units each including the stacked sheet 16 between two sheets 517 is prepared. Subsequently, the sheet including only the hole portion 515 (the sheet 517 excluding the sub-hole portions 25) is stacked, laminated, and press-bonded between the ceramic green laminate units to constitute the ceramic green laminate.

Moreover, in the present example regarding the first manufacturing method, a density difference is made between a portion contacting the sheet 517 and a non-contact portion in the sheet 16. Concretely, when the density of the contact portion is increased, a contraction amount of the non-contact portion constituting the piezoelectric/electrostrictive element increases at the time of the firing, and flatness after the firing is enhanced. Therefore, combined use of these means is preferable. On the other hand, as compared with the second manufacturing method described later, a cut/removed amount at the time of the individual dividing of the piezoelectric/electrostrictive elements can be reduced, and this is advantageous in dust generation. In the present example of the first manufacturing method, in the same manner as in the second manufacturing method described later, when the shape of the hole portion 515 is changed, device characteristics can be changed, and there is a high degree of freedom in design change.

Subsequently, another mode of the first manufacturing method will be described. Another mode of the first manufacturing method of the less-dust-generative matrix-type piezoelectric/electrostrictive device according to the present invention is a method for preparing the less-dust-generative matrix-type piezoelectric/electrostrictive device in which the piezoelectric/electrostrictive element including a double layer structure is set up. The double layer structure indicates a structure in which two layers of piezoelectric/electrostrictive elements are disposed in one piezoelectric/electrostrictive element, and the electrodes are disposed on the opposite outer surfaces of two layers of piezoelectric/electrostrictive members and between two layers of piezoelectric/electrostrictive members. In this case, at least the electrode disposed between two layers of piezoelectric/electrostrictive members needs to be formed in the predetermined position in the ceramic green sheet constituting the piezoelectric/electrostrictive member later before the stacking. Timing for forming the other electrodes is not limited, but the electrodes are usually formed at the same timing as that for disposing the electrode between at least two layers of piezoelectric/electrostrictive members as described later.

In another mode of the first manufacturing method of the less-dust-generative matrix-type piezoelectric/electrostrictive device according to the present invention, the manufacturing method includes: a step D1 of preparing a plurality of ceramic green sheets each containing a piezoelectric/electrostrictive material as a major component; a step D2 of opening predetermined positions of the predetermined number of ceramic green sheets among the plurality of ceramic green sheets to obtain frame-shaped ceramic green sheets in each of which one hole portion is formed; a step D3 of forming an electrode in a position corresponding to one hole portion of frame-shaped ceramic green sheet with respect to the opposite surfaces of the predetermined number of ceramic green sheets among the plurality of ceramic green sheets; a step D4 of forming the electrode in the position corresponding to one hole portion of the frame-shaped ceramic green sheet with respect to one surface of the predetermined number of ceramic green sheets among the plurality of ceramic green sheets; a step D5 of disposing the surface of the ceramic green sheet including the electrode formed on one surface, on which the electrode is not formed, opposite to the ceramic green sheet including the electrodes formed on the opposite surfaces, superposing the ceramic green sheet including the electrode formed on one surface upon the ceramic green sheet including the electrodes formed on the opposite surfaces, and additionally stacking the frame-shaped ceramic green sheet to obtain a plurality of ceramic green laminate units; a step D6 of stacking the ceramic green laminate units to obtain a ceramic green laminate; a step D7 of firing/integrating the ceramic green laminate to obtain a ceramic laminate including a closed hole; a step D8 of cutting the ceramic laminate to obtain a ceramic laminate including an open hole obtained by opening one end of the closed hole; and a step D9 of making a cut in a direction intersecting with a wall portion in which the open hole of the ceramic laminate is formed and in a depth direction of the open hole.

In the manufacturing method including the above-described steps D1 to D9, to obtain the ceramic green laminate units, with respect to the ceramic green sheet including the electrodes formed on opposite surfaces and the ceramic green sheet including the electrode formed on one surface, a plurality of conductive films communicating with each electrode formed portion are formed. It is also preferable to form a plurality of sub-hole portions in the frame-shaped ceramic green sheet and the ceramic green sheet including the electrode formed on one surface. The sub-hole portions constitute the through holes later, the conductive films constitute the conductive members formed on the inner walls of the through hole later, and the wiring can be facilitated in this mode.

Furthermore, the conductive film of the ceramic green sheet on whose one surface the electrode is formed is disposed opposite to the position of the conductive film formed on a side on which a position projected in a thickness direction of the ceramic green sheet does not face the ceramic green sheet including the electrodes formed on the opposite surfaces. The projection position preferably deviates from the position of the conductive film formed on a side facing the ceramic green sheet including the electrodes formed on the opposite surfaces. In this case, the through hole is formed, for example, in a zigzag form, an effective electric field does not function between the conductive films formed on the inner walls of the through holes via the piezoelectric/electrostrictive member, and useless displacement does not occur in the ceramic substrate. It is to be noted that this preferable means is not limited to the manufacturing method including the steps D1 to D9, and includes second and third methods for manufacturing the less-dust-generative matrix-type piezoelectric/electrostrictive device according to the present invention described later. The means can be employed in common in preparing the less-dust-generative matrix-type piezoelectric/electrostrictive device in which the piezoelectric/electrostrictive element including two or more layers of piezoelectric/electrostrictive members is set up.

To prepare the device in accordance with the steps D1 to D9 in this order as such is a preferable mode of the first method for manufacturing the less-dust-generative matrix-type piezoelectric/electrostrictive device according to the present invention, but the number of steps or the order is not limited. For example, without forming the ceramic green laminate unit, after processing each sheet, the sheets may be stacked at one to obtain the laminate. The order can appropriately be changed or the steps can simultaneously be carried out. Instead of stacking the sheets on which the electrodes are formed and cutting or incising the obtained laminate, after cutting or incising the laminate excluding the electrode between two layers of piezoelectric/electrostrictive members, the electrodes may be formed. When the steps are changed in this manner, the member to be treated in each step naturally accordingly changes.

By the manufacturing method including the steps D1 to D9, the electrodes are formed on the opposite surfaces or one surface of the ceramic green sheet in which the predetermined position is not opened or any hole portion is not disposed. The electrode formed surface is not subjected to any mechanical processing, and is individually divided by the space obtained by one hole portion of the frame-shaped ceramic green sheet and the predetermined cut, so that the piezoelectric/electrostrictive elements integrally set up in the matrix form are obtained.

One example of schematic steps of the manufacturing method including the steps D1 to D9 are shown in FIGS. 6(a) to 6(f) and FIGS. 7(a) to 7(f). One example will concretely be described hereinafter.

Figure 6A:
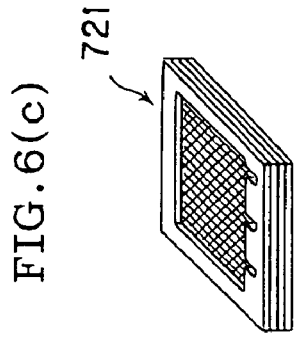
FIGS. 6(a) to 6(f) are explanatory views showing one example of the method for manufacturing the less-dust-generative matrix-type piezoelectric/electrostrictive device according to the present invention.
Figure 6B:
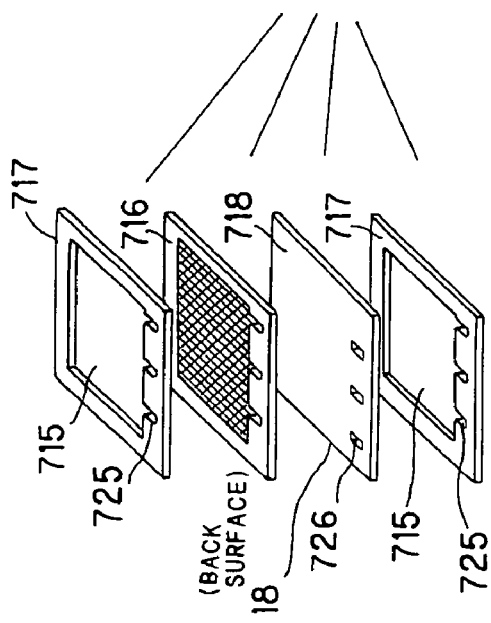

First, the predetermined number of ceramic green sheets containing the piezoelectric/electrostrictive material described later which is the major component are prepared (see the second manufacturing method described later). As the sheets, sheets 716, 717, 718 processed as shown in FIG. 6(b) are prepared by the predetermined number, respectively. For the sheet 716, the electrode 18 is formed on the surface in contact with the molded sheet 717 as shown in FIG. 6(a). Moreover, a conductive film 722 is formed in a position corresponding to a sub-hole portion 725 disposed in the sheet 717. On the other hand, although not shown, for the surface of the sheet 716 on the side of the surface of the sheet 718, the electrode 19 is formed. Moreover, the conductive film is formed in a position corresponding to sub-hole portions 726 disposed in the sheet 718. For the sheet 717, the molded sheet is processed by the predetermined processing method, and a hole portion 715 having substantially the square shape and slit-like sub-hole portions 725 continued to the hole portion 715 are disposed as shown. For the sheet 718, the molded sheet is processed by the predetermined processing method, and slit-like sub-hole portions 726 are disposed. Additionally, in the back surface (not shown), the electrode 18 and the conductive film having patterns in accordance with the hole portion of the sheet 717 to be stacked are formed. Among the above-described sheets, the sheets 716 and 718 constitute the piezoelectric/electrostrictive element later.

Figure 6C:
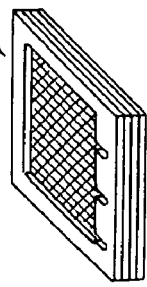

Subsequently, these sheets 716, 717, 718 are stacked and press-bonded to obtain a ceramic green laminate unit 721 (see FIG. 6(c)). In the stacking method, in this example, the uppermost and lowermost layers are constituted of the sheets 717, and between the layers, the sheets 716 and 718 are superposed upon each other.

Figure 6D:
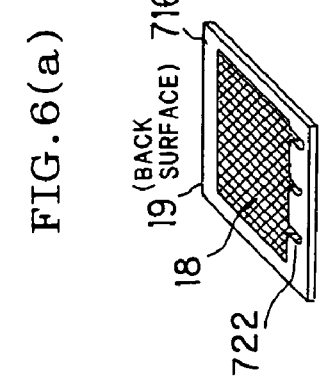
Figure 6E:
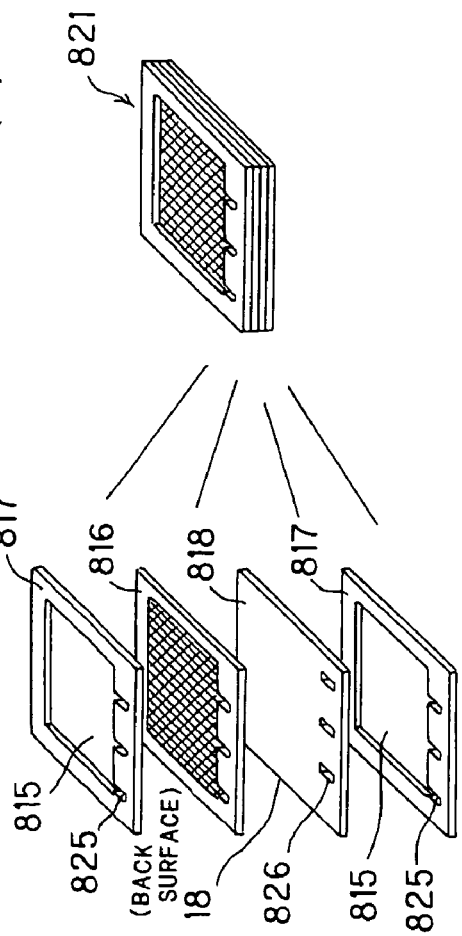
Figure 6F:
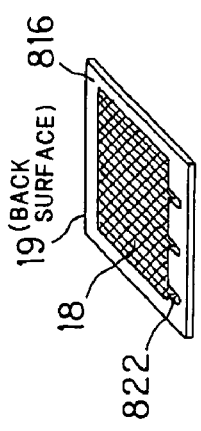

In the same manner as in the ceramic green laminate unit 721, a ceramic green laminate unit 821 (see FIG. 6(f)) is obtained by the following method. First, as the sheets, sheets 816, 817, 818 processed as shown in FIG. 6(e) are prepared by the predetermined number, respectively. For the sheet 816, the electrode 18 is formed on the surface in contact with the molded sheet 817 as shown in FIG. 6(d). Moreover, a conductive film 822 is formed in a position corresponding to a sub-hole portion 825 disposed in the sheet 817. On the other hand, although not shown, for the surface of the sheet 816 on the side of the surface of the sheet 818, the electrode 19 is formed. Moreover, the conductive film is formed in a position corresponding to sub-hole portions 826 disposed in the sheet 818. For the sheet 817, the molded sheet is processed by the predetermined processing method, and a hole portion 815 having substantially the square shape and slit-like sub-hole portions 825 continued to the hole portion 815 are disposed as shown. For the sheet 818, the molded sheet is processed by the predetermined processing method, and slit-like sub-hole portions 826 are disposed. Additionally, in the back surface (not shown), the electrode 18 and the conductive film having the patterns in accordance with the hole portion of the sheet 817 to be stacked are formed. Among the above-described sheets, the sheets 816 and 818 constitute the piezoelectric/electrostrictive element later. It is to be noted that the sub-hole portions 825 and 725 are formed in positions deviating from those of the sub-hole portions 826 and 726, respectively.

Subsequently, these sheets 816, 817, 818 are stacked and press-bonded to obtain the ceramic green laminate unit 821 (see FIG. 6(f)). In the stacking method, in this example, the uppermost and lowermost layers are constituted of the sheets 817, and between the layers, the sheets 816 and 818 are superposed upon each other.

Next, as shown in FIG. 7(a), separately prepared sheets 811 are used as the uppermost and lowermost layers, and between the layers, the ceramic green laminate units 721, 821 prepared beforehand are alternately stacked to obtain a ceramic green laminate 801 (see FIG. 7(b)). The number of stacked ceramic green laminate units 721, 821 may be determined by the number corresponding the number of columns (rows) of the piezoelectric/electrostrictive device in which the piezoelectric/electrostrictive elements are arranged in the matrix form. It is to be noted that the sheet 811 is equal to the sheet 717 in which the sub-hole portion 725 is not formed (also equal to the sheet 817 in which the sub-hole portion 825 is not formed). The sheet in which any hole portion is not disposed may also be used.

The ceramic green laminate 801 shown in FIG. 7(b) contains the piezoelectric/electrostrictive material which is the major component, and includes closed holes and through holes 728, 828 (see FIG. 7(d)) which exist in the laminate and are not shown in the figure. The closed holes are constituted of the hole portion 715 of the sheet 717 and the hole portion 815 of the sheet 817. The through holes 728, 828 are constituted of the sub-hole portion 715 disposed in the sheet 717 and the sub-hole portion 825 disposed in the sheet 817. Subsequently, the ceramic green laminate 801 is fired/integrated to obtain a ceramic laminate 803 (see FIG. 7(c)).

Subsequently, as shown in FIG. 7(c), the unnecessary portion is cut/removed along a cut line 850 to expose the through holes 728, 828 as shown in FIG. 7(d). Additionally, a ceramic laminate 804 in which small open holes 805 are formed as shown in FIG. 7(e) is obtained. It is to be noted that one end surface of the closed hole is opened by the cutting/removing to form the open hole 805. The ceramic laminate 804 shown in FIG. 7(e) shows the state that the ceramic laminate 804 shown in FIG. 7(d) has been raised by 90°. In the ceramic laminate 804 shown in FIG. 7(d), the surface in which the through holes 728, 828 are opened (front side in the drawing, XZ plane) forms the side surface, but in the ceramic laminate 804 shown in FIG. 7(e), the surface in which the through holes 728, 828 are opened constitutes the lower surface.

Subsequently, in the ceramic laminate 804 shown in FIG. 7(e), the unnecessary portion is cut/removed along cut lines 851 as shown to obtain individually divided piezoelectric/electrostrictive members 44. Here, the unnecessary portion is a portion which does not constitute the piezoelectric/electrostrictive element 34. By the way of removing the unnecessary portion, the shape of the piezoelectric/electrostrictive element 34, and the interval (of the X-axis direction) between non-major-surfaces of the piezoelectric/electrostrictive elements 34 disposed adjacent to each other are determined. Thereafter, if necessary, the polarization treatment is carried out, and a less-dust-generative matrix-type piezoelectric/electrostrictive device 800 is completed in which the piezoelectric/electrostrictive elements 34 each including two layers of piezoelectric/electrostrictive members 4 are arranged.

In the less-dust-generative matrix-type piezoelectric/electrostrictive device 800, as shown in FIG. 7(d), the through hole 728 is not disposed opposite to the through hole 828, and the through holes deviate from each other. This is because as described above the sub-hole portions 825 and 725 are formed in the deviating positions with respect to the sub-hole portions 826 and 726. Therefore, in the through hole portion, the effective electric field does not function on the piezoelectric/electrostrictive member, and the piezoelectric/electrostrictive member develops the displacement only in the piezoelectric/electrostrictive element portion. The through holes 828 and 728 shown in FIG. 7(d) are formed opposite to all the electrodes of the piezoelectric/electrostrictive elements 34 in FIG. 7(f), but a plurality of electrodes among the electrodes constantly indicate a common potential depending on an actual use mode in many cases. In this case, the electrodes constituting the common potential may be wired in one position or collectively for the predetermined number of through holes.

It is to be noted that FIG. 7(g) is an enlarged perspective view of a top of the manufactured piezoelectric/electrostrictive element 34. In the piezoelectric/electrostrictive element 34, the piezoelectric/electrostrictive members 4 are stacked, and the electrode 19 is formed between the members. Additionally, the electrodes 18 are formed on the opposite outer surfaces of two layers of piezoelectric/electrostrictive members 4.

In the less-dust-generative matrix-type piezoelectric/electrostrictive device 800, each of two layers of the piezoelectric/electrostrictive members 4 constituting the piezoelectric/electrostrictive element 34 can be formed to be thinner and higher, and it is therefore possible to develop a large displacement amount and high generative force at a lower voltage. On the other hand, the piezoelectric/electrostrictive element 34 is constituted of two layers of piezoelectric/electrostrictive members 4 superposed upon each other via the electrode 19, and the mechanical strength is secured. Therefore, the element can function as the piezoelectric/electrostrictive element having high capability and durability. Although not shown, the piezoelectric/electrostrictive element is also preferably constituted of three or more layers of piezoelectric/electrostrictive members. When the piezoelectric/electrostrictive element is formed in a multilayered structure including three or more layers of piezoelectric/electrostrictive members, conductive members are preferably substantially connected every other layer via a via-hole which is means for connecting the conductive member substantially every other layer.

Figure 11A:
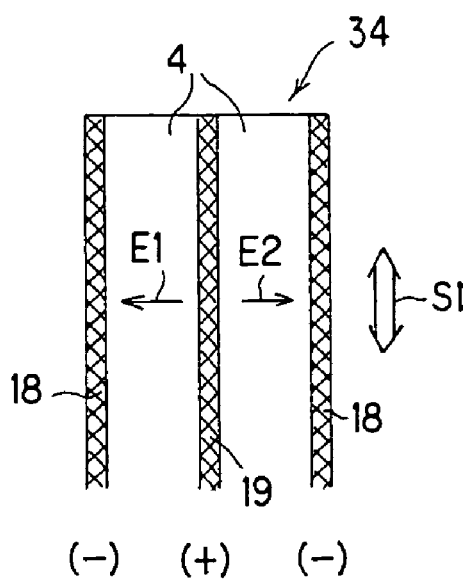
FIGS. 11(a), 11(b) are diagrams showing one embodiment of the less-dust-generative matrix-type piezoelectric/electrostrictive device according to the present invention, and are partially sectional views of a piezoelectric/electrostrictive element showing an example in which a driving direction of the piezoelectric/electrostrictive element changes by a polarization treatment of a piezoelectric/electrostrictive member.
Figure 11B:
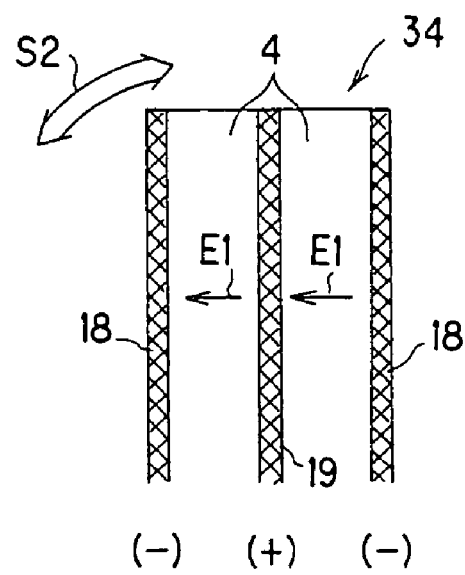

In the less-dust-generative matrix-type type piezoelectric/electrostrictive device 800, when a relation between the application direction of the electric field and a polarization direction of the piezoelectric/electrostrictive member 4 is changed, the mode of the displacement in the piezoelectric/electrostrictive element 34 can be changed. FIGS. 11(a), 11(b) show a tip end of the piezoelectric/electrostrictive element 34, and both show that the electric field is applied to the piezoelectric/electrostrictive member 4 assuming that the electrode 19 between two layers of piezoelectric/electrostrictive members 4 is +, and the electrode 18 is −. In FIG. 11(a), it is assumed that the polarization direction of one piezoelectric/electrostrictive member 4 in two layers of piezoelectric/electrostrictive members 4 is E1 and that that of the other piezoelectric/electrostrictive member 4 is E2. Therefore, the polarization and electric field directions agree with each other in two layers of piezoelectric/electrostrictive members 4, and two layers of piezoelectric/electrostrictive members 4 develop the displacement in the same direction. As a result, the piezoelectric/electrostrictive element 34 expands/contracts (expansion/contraction displacement type). On the other hand, in FIG. 11(b), it is assumed that both the polarization directions of two layers of piezoelectric/electrostrictive members 4 are E1. Therefore, in one of two layers of piezoelectric/electrostrictive members 4, the polarization direction agrees with the electric field direction, and in the other piezoelectric/electrostrictive member 4, the polarization direction is reverse to the electric field direction. Therefore, two layers of piezoelectric/electrostrictive members 4 develop the displacement in the opposite directions. As a result, a so-called bi-morph element is obtained in which the piezoelectric/electrostrictive element 34 bends (flexural displacement type).

Figure 12:
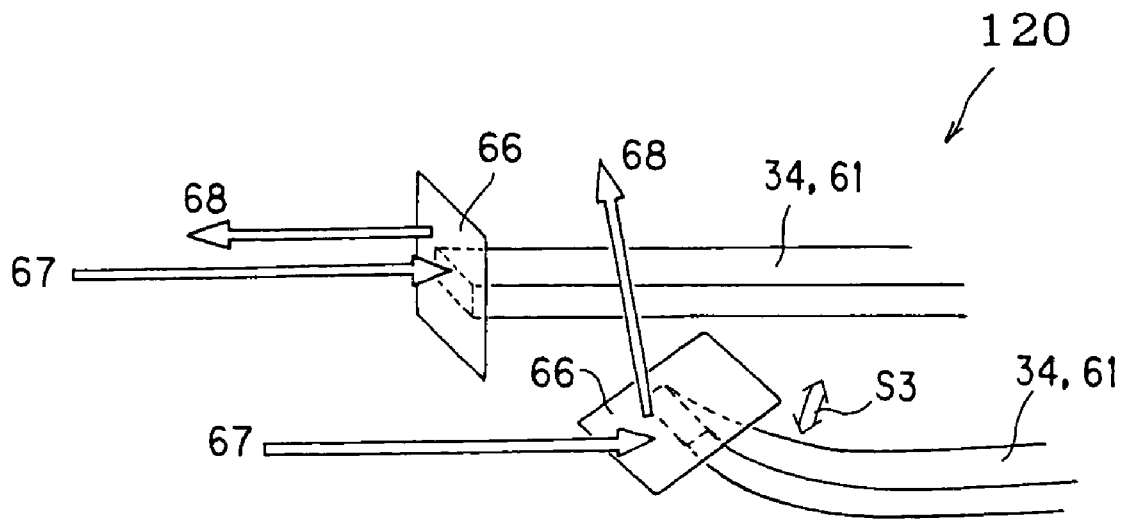
FIG. 12 is a diagram showing one embodiment of the less-dust-generative matrix-type piezoelectric/electrostrictive device according to the present invention, and is a perspective view showing an example of application as an actuator of a micro mirror array.

An application example of the less-dust-generative matrix-type type piezoelectric/electrostrictive device 800 in which the piezoelectric/electrostrictive element 34 bends is shown in FIG. 12. FIG. 12 is a partially enlarged diagram showing one example in which the less-dust-generative matrix-type type piezoelectric/electrostrictive device 800 is applied as an actuator of a micro mirror array. A shown micro mirror array 120 includes a micro mirror 66 and an actuator section 61. The less-dust-generative matrix-type type piezoelectric/electrostrictive device 800 is used as the actuator section 61 in the micro mirror array (only the piezoelectric/electrostrictive element 34 is shown in the figure).

In the micro mirror array 120 shown in FIG. 12, the micro mirror 66 forms a pair with a plurality of piezoelectric/electrostrictive elements 34 constituting the actuator section 61, and is formed or mounted in the tip end. The surface on a side opposite to the piezoelectric/electrostrictive element 34 is constituted of a mirror surface. The piezoelectric/ electrostrictive element 34 constituting the actuator section 61 bends in response to an external signal, the micro mirror 66 can be lifted upwards in the figure, and further an inclination angle of the micro mirror 66 can be adjusted. Through this operation, in the micro mirror array 120, a reflection angle can be changed with respect to light incident from a side opposite to the piezoelectric/electrostrictive element 34 (left side in the figure).

For example, when the micro mirror 66 is set vertically as shown, an incident light 67 is reflected by a slightly upper part of the micro mirror 66 and returns as a reflected light 68 in an incoming direction. When the micro mirror 66 is raised to change the angle, the incident light 67 is reflected by a slightly lower part of the micro mirror 66 and is directed as the reflected light 68 in a direction different from the incoming direction, and an optical path is changed.

Figure 19A:
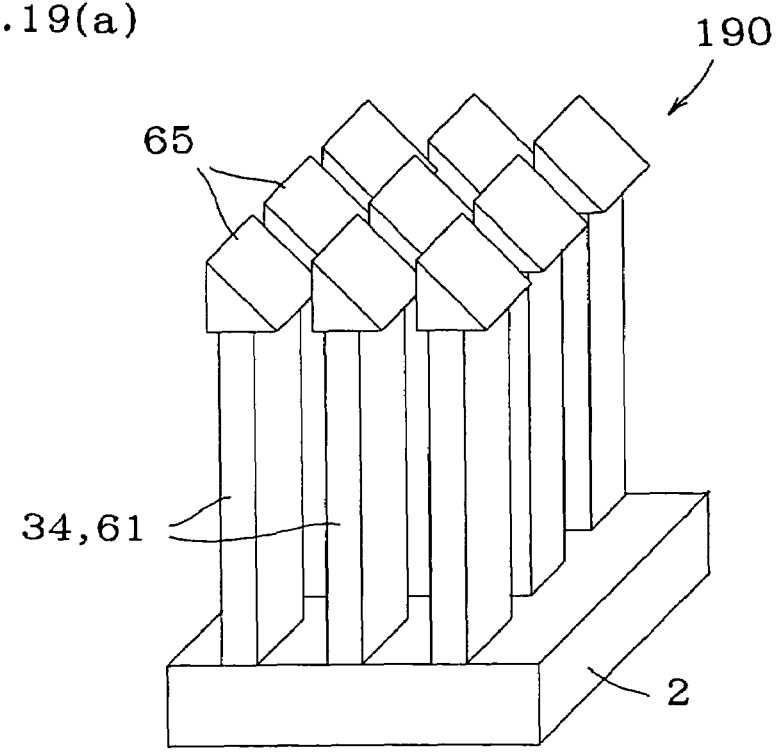
FIG. 19(a) is a perspective view showing another example of the application as the actuator of the micro mirror array.
Figure 19B:
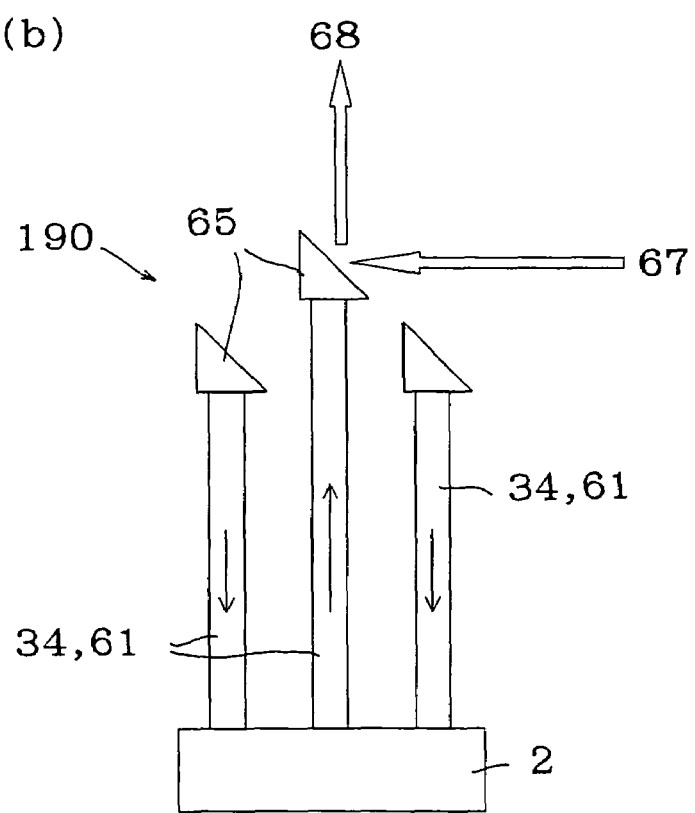
FIG. 19(b) is a side view.

Moreover, an application example of the less-dust-generative matrix-type type piezoelectric/electrostrictive device 800 in which the piezoelectric/electrostrictive element 34 expands/contracts is shown in FIGS. 19(*a*), 19(*b*). FIGS. 19(*a*), 19(*b*) show another example in which the less-dust-generative matrix-type type piezoelectric/electrostrictive device 800 is applied as the actuator of the micro mirror array, FIG. 19(*a*) is a perspective view, and FIG. 19(*b*) is a side view showing the function. A shown micro mirror array 190 includes micro mirrors 65, and actuator sections 61 set up on the ceramic substrate 2. The less-dust-generative matrix-type type piezoelectric/electrostrictive device 800 is used as the actuator section 61 in the micro mirror array.

In the micro mirror array 190 shown in FIGS. 19(*a*), 19(*b*), each of the micro mirrors 65 forms a pair with each of a plurality of piezoelectric/electrostrictive elements 34 constituting the actuator sections 61, and is formed or mounted in the tip end. An inclined surface on the side opposite to the piezoelectric/electrostrictive element 34 is constituted of the mirror surface. As shown in FIG. 19(*b*), the piezoelectric/electrostrictive element 34 constituting the actuator section 61 extends in response to the external signal, and can lift upwards the micro mirrors 65 in the figure. Through this operation, in the micro mirror array 190, the light incident upon the side (e.g., the right side in the figure) can be reflected at a desired angle.

For example, as shown in FIG. 19(*b*), when the mirror surface (inclined surface) of the micro mirror 65 is set at substantially 45° with respect to the incident light 67, the incident light 67 changes the direction substantially by 90° by the micro mirror 65, and is reflected as the reflected light 68 upwards in the figure. It is to be noted that in the shown example, the actuator section 61 in the middle in the figure extends, but another actuator section 61 may also be extended (upwards in the figure in the same manner) to change the optical path. The actuator sections 61 other than the extended actuator section are preferably contracted.

Figure 20A:
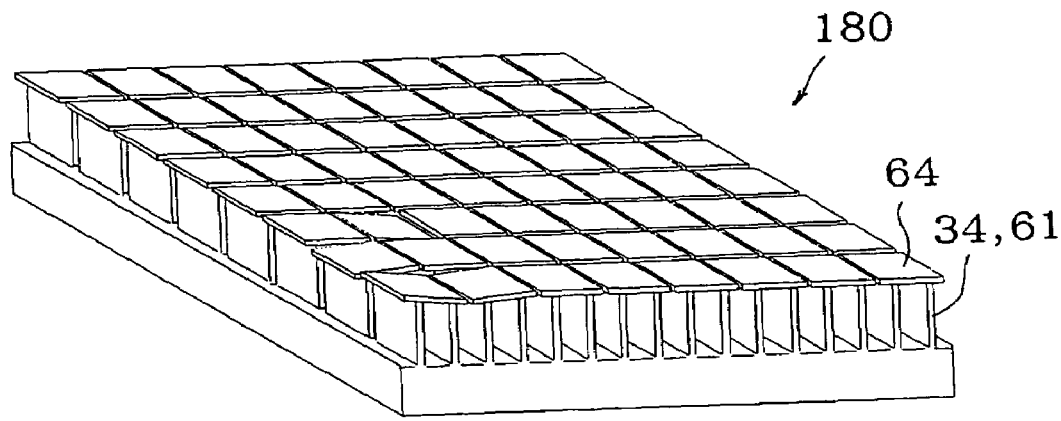
FIG. 20(a) is a perspective view showing still another example of the application as the actuator of the micro mirror array.
Figure 20B:
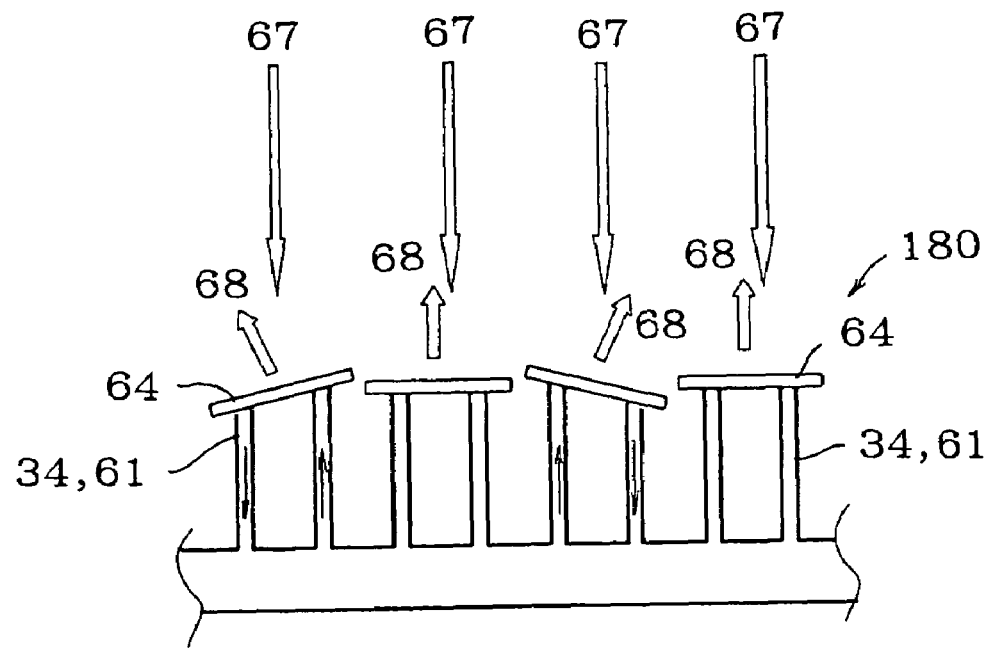
FIG. 20(b) is a side view.

Furthermore, another application example of the less-dust-generative matrix-type type piezoelectric/electrostrictive device 800 in which the piezoelectric/electrostrictive element 34 expands/contracts is shown in FIGS. 20(*a*), 20(*b*). FIGS. 20(*a*), 20(*b*) show still another example in which the less-dust-generative matrix-type piezoelectric/electrostrictive device 800 is applied as the actuator of the micro mirror array, FIG. 20(*a*) is a perspective view, and FIG. 20(*b*) is a side view showing the function. A shown micro mirror array 180 includes micro mirrors 64, and actuator sections 61 set up on the ceramic substrate 2, and the less-dust-generative matrix-type type piezoelectric/electrostrictive device 800 is used as the actuator section 61 in the micro mirror array.

In the micro mirror array 180 shown in FIGS. 20(*a*), 20(*b*), each of the micro mirrors 64 is combined with two piezoelectric/electrostrictive elements 34 disposed adjacent to each other among the plurality of piezoelectric/electrostrictive elements 34 constituting the actuator sections 61, and is formed or mounted in the tip end. The surface on the side opposite to the piezoelectric/electrostrictive element 34 is constituted of the mirror surface. As shown in FIG. 20(*b*), in the actuator section 61, one of two piezoelectric/electrostrictive elements 34 supporting the micro mirror 64 extends, and the other element contracts in response to the external signal. Accordingly, the angle of the mirror surface of the micro mirror 64 can be changed. For the micro mirror array 180, when the expansion/contraction amount of the piezoelectric/electrostrictive element 34 is changed, the inclination of the micro mirror 64 can be changed, and it is therefore possible to control the direction of the reflected light 68 with respect to the incident light 67. This micro mirror array 180 can preferably be applied to image display apparatuses such as a projection type display and projector.

It is to be noted that in the micro mirror arrays including the mechanisms of the micro mirror arrays 120, 180, 190, it is also possible to apply the device which does not include the piezoelectric/electrostrictive element of the double layer structure, such as the less-dust-generative matrix-type piezoelectric/electrostrictive device 1 (see FIG. 1(*a*)), to the actuator section 61. When at least the less-dust-generative matrix-type piezoelectric/electrostrictive device according to the present invention is applied to the actuator section, a problem that the quality level of the reflected light drops by the micro mirror contaminated with the particles does not easily occur for a long period, and high reliability is imparted to the micro mirror array.

Additionally, by the use of the less-dust-generative matrix-type type piezoelectric/electrostrictive device 800 including the piezoelectric/electrostrictive element of the double layer structure as the actuator section, an effect of enhancement of accuracy in positioning the micro mirror is brought about. In the micro mirror arrays such as the micro mirror arrays 120, 180, 190, when the reflection angle of the light is correctly changed, the micro mirror is preferably securely positioned. However, for example, in a conventional electrostatic actuator, a driving force is small, the positioning is limited by a size or weight of the micro mirror to be driven, and therefore the micro mirror needs to be thinned. As a result, the micro mirror is deflected, and problems such as the drop of the quality level of the reflected light are sometimes caused. By the use of the less-dust-generative matrix-type type piezoelectric/electrostrictive device 800 including the piezoelectric/electrostrictive element of the double layer structure shown in FIG. 11(*a*), 11(*b*), as compared with the piezoelectric/electrostrictive element of a single plate type, the mechanical strength is enhanced, and the displacement can occur with a higher generative force. Therefore, it is possible to drive the micro mirror which is high in rigidity and large in weight, and the quality level of the reflected light can satisfactorily be held.

Moreover, the less-dust-generative matrix-type type piezoelectric/electrostrictive device 800 obtained by the first manufacturing method can also be applied not only to the micro mirror array but also as the actuator for an integrated type of variable optical devices suitable for wavelength-division multiplexing (WDM) optical communication, such as a micro prism array and micro lens array. These follow the above-described micro mirror array, and can be prepared by forming or mounting micro optical components such as the micro prism and micro lens in the tip end of the piezoelectric/electrostrictive element. When the device is applied as the actuator for valve driving mechanisms for controlling a flow rate of precision gas, such as a mass flow controller, it is possible to realize the integrated type of precision gas flow rate controller suitable for a semiconductor manufacturing apparatus.

It is to be noted that the present example of the first manufacturing method is a method for preparing the less-dust-generative matrix-type piezoelectric/electrostrictive device in which the piezoelectric/electrostrictive elements of the double layer structure including two layers of piezoelectric/electrostrictive members are set up. However, the less-dust-generative matrix-type piezoelectric/electrostrictive device is not prepared or obtained only by the first manufacturing method, and can also be prepared by the second and third manufacturing methods described later.

By the present example of the first manufacturing method, there is not a possibility of disconnection between the electrodes 18, 19 of the piezoelectric/electrostrictive element and the conductive films 722, 822 (corresponding to the inner wall of the through hole), and conduction reliability is high. Since an electric field inductive strain in the through hole portion can be reduced, an inner stress at the time of the operation of the piezoelectric/electrostrictive device does not easily occur in the ceramic substrate, that is, interference between two piezoelectric/electrostrictive elements disposed adjacent to each other is remarkably reduced.

The first manufacturing method will hereinafter be described. For the processing means for forming the hole portion in the sheet, the processing means for cutting or removing the wall portion, the means for stacking the sheets, or the means for forming the electrodes in the first manufacturing method, a method conforming to the second manufacturing method described later can be employed.

2-1-2) Second Manufacturing Method

The second manufacturing method will hereinafter be described. In the second manufacturing method of the less-dust-generative matrix-type piezoelectric/electrostrictive device according to the present invention, the ceramic green sheet constituting the piezoelectric/electrostrictive member later is stacked on the ceramic green sheet in which a plurality of hole portions are disposed to obtain the ceramic green laminate. After firing/integrating the ceramic green laminate, the laminate is subjected to the predetermined processing. This manufacturing method is the same as the first manufacturing method in that the ceramic green sheet including the hole portion is stacked, but is different in that a plurality of hole portions are disposed instead of one hole portion.

The ceramic green sheet including the hole portions is a sheet defining the space between the side surfaces of the piezoelectric/electrostrictive members on which the electrodes are formed in two piezoelectric/electrostrictive elements disposed adjacent to each other among the plurality of piezoelectric/electrostrictive elements, and the hole portions form the space. When a plurality of hole portions are disposed and a solid portion is disposed between the hole portions, the ceramic green laminate is obtained and fired/integrated. In this process, the solid portion (corresponding to a wall portion Q in the ceramic green laminate) performs a function of a beam in the ceramic green laminate to inhibit the deformation by its own weight or the stress from the outside.

One mode of the second manufacturing method will hereinafter be described. For the second manufacturing method of the less-dust-generative matrix-type piezoelectric/electrostrictive device according to the present invention, the manufacturing method includes: a step A1 of preparing a plurality of ceramic green sheets containing, for example, the piezoelectric/electrostrictive materials which are the major components; a step A2 of disposing a plurality of hole portions having substantially rectangular shapes in predetermined positions with respect to the predetermined number of ceramic green sheets among the plurality of ceramic green sheets; a step A3 of stacking the predetermined number of ceramic green sheets in which at least the hole portion is disposed and those in which the hole portion is not disposed to obtain the ceramic green laminate including the closed hole; a step A4 of firing/integrating the ceramic green laminate to obtain the ceramic laminate including the closed hole; a step A5 of cutting the ceramic laminate to obtain a honeycomb-shaped ceramic laminate including the closed hole obtained by opening one end of the closed hole; and a step A6 of cutting/removing the wall portion Q intersecting with a wall portion P constituted of a ceramic green sheet portion in which the hole portion is not disposed in the wall portions forming the open hole of the honeycomb-shaped ceramic laminate.

The manufacturing method including the steps A1 to A6 is not limited, but it is preferable to a plurality of sub-hole portions communicating with a plurality of hole portions substantially having rectangular shapes in all or some of the predetermined number of ceramic green sheets in each of which the plurality of hole portions having substantially the rectangular shapes are formed in the predetermined positions. The sub-hole portions can constitute later the through holes including the conductive members formed on the inner walls of the holes, and the wiring is facilitated.

To dispose the sub-hole portions, after obtaining the ceramic laminate, the ceramic laminate preferably is cut or polished to open the sub-hole portions. The sub-hole portions preferably also communicate with the ends of the ceramic green sheets. In this case, the step of cutting or polishing the ceramic laminate later is unnecessary. This also applies to the first and third manufacturing methods.

To prepare the device in accordance with the steps A1 to A6 in this order as such is the preferable mode of the second method for manufacturing the less-dust-generative matrix-type piezoelectric/electrostrictive device according to the present invention, but the order is not limited. The order can appropriately be changed or the steps can simultaneously be carried out. When the steps are changed, the member to be treated in each step naturally accordingly changes.

The step of forming the electrodes is not included in the steps A1 to A6. This is because the second method for manufacturing the less-dust-generative matrix-type piezoelectric/electrostrictive device according to the present invention does not limit the timing for forming the electrodes. After stacking the sheets, and firing the laminate, the electrode may be formed on the wall portion P, and the wall portion Q may be cut/removed in order. Alternatively, after cutting/removing the wall portion Q, the electrode may be formed on the wall portion P. The steps A1 to A6 are the steps in the case in which the piezoelectric/electrostrictive element is constituted of one layer of piezoelectric/electrostrictive member. Therefore, after stacking the sheets on which the electrodes having predetermined shape patterns are formed, the laminate may be fired and cut/removed in order.

By the manufacturing method including the steps A1 to A6, the predetermined portion of the ceramic green sheet in which the hole portions are not disposed constitutes the electrode formed surface in the wall portion forming the open hole of the fired honeycomb-shaped ceramic laminate. Furthermore, the wall portion on which the electrode is not formed is cut/removed so as to obtain the piezoelectric/electrostrictive elements integrally set up in the matrix form. The electrode formed surface of the piezoelectric/electrostrictive element is not subjected to any mechanical processing.

One example of the schematic steps of the manufacturing method including the steps A1 to A6 is shown in FIGS. 3(a) to 3(g). This example is shown as a method for preparing the less-dust-generative matrix-type piezoelectric/electrostrictive device 1 shown in FIG. 1(a) (additionally, to simplify the description, the number of through holes is small). This example will concretely be described hereinafter.

First, the predetermined number of ceramic green sheets are prepared containing the piezoelectric/electrostrictive materials described later which are the major components. The ceramic green sheets can be prepared by a ceramic manufacturing method which has heretofore been known. For example, piezoelectric/electrostrictive material powder described later is prepared, a binder, solvent, dispersant, plasticizer, and the like are blended into the powder to obtain a desired composition, and slurry is prepared. After a defoaming treatment of the slurry, the ceramic green sheet can be formed by sheet molding methods such as a doctor blade method and reverse roll coater method.

For the sheets, as shown in FIG. 3(a), a plurality of sheets 16 molded and subjected to outer shape processing by the predetermined processing method, and sheets 116, 117 in which a plurality of elongated hole portions 15 are opened in the molded sheets are prepared by the predetermined number, respectively. Further in the sheets 117, the slit-shaped sub-hole portions 25 continued to the respective hole portions 15 are disposed as shown. Subsequently, the predetermined number of sheets 16, 116, 117 are stacked and press-bonded to obtain a ceramic green laminate 301 (see FIG. 3(b)). For the stacking method, in this example, the uppermost and lowermost layers are constituted of the sheets 116. Between the sheets, the uppermost and lowermost layers are constituted of the sheets 117, and the sheets 16 and 117 are alternately superposed upon each other. It is to be noted that during the stacking, although not shown, holes for positioning formed in the respective green sheets are used to perform the stacking.

The ceramic green laminate 301 shown in FIG. 3(b) contains the piezoelectric/electrostrictive material as a major component, and includes the closed holes which exist in the laminate and are not shown in the figure and through holes 128 (see FIG. 3(d)). The closed holes are constituted of the hole portions 15 of the sheet 117 held between two sheets 16. The through holes 128 are constituted of the sub-hole portions 25 disposed in the sheet 117. Moreover, the ceramic green laminate 301 is fired/integrated to obtain a ceramic laminate 303 (see FIG. 3(c)). At this time, to prevent the closed hole from being filled with binder decomposing gas at the time of the firing, it is preferable to dispose a gas vent hole which communicates with the outside. This prevents a structure from being cracked by a rise of an inner pressure. This also prevents problems that oxygen is not supplied inside and that a sintering defect is caused.

Next, as shown in FIG. 3(c), the unnecessary portion is cut/removed along a cut line 350 to obtain the honeycomb-shaped ceramic laminate 304 in which open holes 3 are formed as shown in FIGS. 3(d), 3(e). It is to be noted that one end surface of the closed hole is opened by the cutting/removing to form the open holes 3. The honeycomb-shaped ceramic laminate 304 shown in FIG. 3(e) shows the state that the honeycomb-shaped ceramic laminate 304 shown in FIG. 3(d) has been raised by 90°. In the honeycomb-shaped ceramic laminate 304 shown in FIG. 3(d), the surface in which the through holes 128 are opened (front side in the figure, XZ plane) forms the side surface, but in the honeycomb-shaped ceramic laminate 304 shown in FIG. 3(e), the surface in which the through holes 128 are opened constitutes the lower surface.

Moreover, in the honeycomb-shaped ceramic laminate 304 shown in FIG. 3(e), the electrodes 18, 19 are formed on wall portions parallel to at least one direction (XY plane direction) among the wall portions in which the open holes 3 are formed, that is, on the opposite surfaces of a wall portion P6 corresponding to the green sheet 16. Additionally, the conductive film is also formed on the inner wall of the through hole 128.

Next, as shown in FIG. 3(f), the unnecessary portions are cut/removed along cut lines 351 to obtain individually divided piezoelectric/electrostrictive members 4 (piezoelectric/electrostrictive elements 31). Here, the unnecessary portions are portions which do not constitute the piezoelectric/electrostrictive elements 31, and indicate a wall portion Q7 in a YZ plane direction intersecting with the XY plane direction) among the wall portions in which the open holes 3 of the honeycomb-shaped ceramic laminate 304 are formed. Thereafter, if necessary, the polarization treatment is carried out, and the less-dust-generative matrix-type piezoelectric/electrostrictive device 1 is completed (FIG. 3(g)).

It is to be noted that in the present example of the second manufacturing method, among the hole portions formed in the green sheets 117, the sub-hole portions 25 corresponding to the through hole do not communicate with the ends of the green sheets, but these sub-hole portions 25 may also be formed to communicate with the ends. In the latter case, when the ceramic laminate 303 is cut as shown in FIG. 3(c), a step of cutting the laminate to expose the through holes 128 on the side of the sub-hole portions 25 (front side in the figure) is unnecessary. This also applies to the first and third manufacturing methods.

Moreover, in the present example of the second manufacturing method, to simplify the description for ease of understanding, the sheet 16, and the sheet 117 including the sub-hole portion 25 are alternately stacked. In the obtained less-dust-generative matrix-type piezoelectric/electrostrictive device 1 (different from FIG. 1(a)), the through holes 128 are substantially shared between two piezoelectric/electrostrictive elements 31 (electrodes 18, 19) disposed adjacent to each other in the sheet stacking direction. The electrodes 18, 19 which share the through holes 128 inevitably indicate the same potential at the time of the driving. Needless to say, the individual through holes 128 may separately be disposed as is shown in FIG. 1(a) with respect to the respective electrodes 18, 19 of each piezoelectric/electrostrictive element 31. On the other hand, in two or more piezoelectric/electrostrictive elements 31, for the electrodes indicating the same potential at the time of the driving, the through holes may be used in common regardless of whether or not the piezoelectric/electrostrictive elements 31 are disposed opposite to each other.

For example, when the ceramic green laminate is prepared as follows, as shown in FIG. 1(a), it is possible to obtain the less-dust-generative matrix-type piezoelectric/electrostrictive device 1 including the separate through holes 128 with respect to the respective electrodes 18, 19 of each piezoelectric/electrostrictive element 31. First, a plurality of ceramic green laminate units each including the sheet 16 stacked between two sheets 117 are prepared, and the sheet 116 may be superposed, stacked, and press-bonded between the ceramic green laminate units.

In the present example of the second manufacturing method, the sheet 16 in which the hole portion 15 is not disposed is fired, and the electrodes 18, 19 are only formed. The both surfaces of the sheet are not subjected to any mechanical processing, and remain to be unprocessed/fired to constitute the major surfaces of the piezoelectric/electrostrictive member 4. Therefore, in the major surfaces of the piezoelectric/electrostrictive member 4 constituting the piezoelectric/electrostrictive element 31, a crack generation probability is excessively low, the transgranularly fractured crystal grains do not exist in the crystal particles of the piezoelectric/electrostrictive material of the major surface, and the cut powder or the residual abrasive grain is not generated.

Moreover, since the major surface of the piezoelectric/electrostrictive member 4 is hardly damaged, even a micro structure can easily be formed. Furthermore, concave/convex portions are small in the major surface of the piezoelectric/electrostrictive member 4, and the surface is homogeneous. When the electrodes 18, 19 are formed, adhesion between the electrodes 18, 19 and the piezoelectric/electrostrictive member 4 is satisfactory, and piezoelectric characteristics can more effectively be derived.

Moreover, in the present example of the second manufacturing method, in the obtained less-dust-generative matrix-type piezoelectric/electrostrictive device 1, the driving (displacement) direction of the piezoelectric/electrostrictive element 31 is a Y-axis direction (FIG. 3(g)), and is different from the stacking direction of the sheets 16, 116, 117 (Z-axis direction, FIG. 3(a)). That is, the driving of the piezoelectric/electrostrictive element 31 (displacement of the piezoelectric/electrostrictive member 4) does not depend on the number of stacked sheets 16, 116, 117, and depends on the whole shape of the sheets 16, 116, 117 and the shape of the hole portion 15 (Y-axis direction, FIG. 3(a)). Only a predetermined portion of the sheet 16 remains as the piezoelectric/electrostrictive member 4 constituting the piezoelectric/electrostrictive element 31, but the closed hole or the open hole 3 is formed later so that a plurality of piezoelectric/electrostrictive elements 31 can independently be individualized by the hole portions 15 of the sheets 116, 117. Therefore, the driving of the piezoelectric/electrostrictive element 31 depends on the hole portion 15.

That is, the shape of the piezoelectric/electrostrictive element 31 is substantially determined by the whole shape of the sheets 16, 116, 117 and the processed shape of the hole portion 15 of the sheets 116, 117. When a longitudinal direction of the hole portion 15 is increased, it is possible to form the piezoelectric/electrostrictive element 31 having a shape with the high aspect ratio. Therefore, the piezoelectric/electrostrictive element 31 having the large driving amount and driving force can easily be obtained.

Furthermore, in the present example of the second manufacturing method, the thicknesses of the sheets 16, 116, 117 can arbitrarily be selected, and a distance of a plurality of hole portions 15 formed in the sheets 116, 117 can arbitrarily be determined. Moreover, the thickness of the sheet 16 corresponds to that of the piezoelectric/electrostrictive member 4. For the piezoelectric/electrostrictive elements 31 (piezoelectric/electrostrictive members 4) arranged in the matrix form, the thickness of the sheet 117 corresponds to a distance between the piezoelectric/electrostrictive elements 31 disposed adjacent to each other while the major surfaces are disposed opposite to each other. In the sheets 116, 117, a distance between the hole portions 15 disposed adjacent to each other (depending on a cut/removed amount later) corresponds to that between the piezoelectric/electrostrictive elements 31 disposed adjacent to each other while sub-surfaces are disposed opposite to each other in the piezoelectric/electrostrictive elements 31 (piezoelectric/electrostrictive members 4) arranged in the matrix form. This means that the arrangement density of the piezoelectric/electrostrictive elements 31 in the prepared less-dust-generative matrix-type piezoelectric/electrostrictive device 1 can easily be enhanced or adjusted by the thickness of the sheets 16, 117 and the interval between the hole portions 15.

It is to be noted that each of the sheets 16, 116, 117 is not only one sheet of green sheet, but also a plurality of stacked green sheets. This is also applicable to the first and third manufacturing methods. FIG. 3 shows an example in which the sheets 16, 117 are alternately stacked as described above, but, for example, like the sheets 116, 117, 16, 117, 116, 117, 16, 117, 116, the sheets 117, 16, 117 are assumed as one set, the set is held by the sheets 116, and these may successively be stacked. In this mode, the through hole connected to each piezoelectric/electrostrictive element can independently be disposed for each piezoelectric/electrostrictive element.

It is to be noted that the manufacturing method including the steps A1 to A6 is the method for preparing the less-dust-generative matrix-type piezoelectric/electrostrictive device in which the piezoelectric/electrostrictive elements each including one layer of piezoelectric/electrostrictive member are set up. However, in the second method for manufacturing the less-dust-generative matrix-type piezoelectric/electrostrictive device according to the present invention, it is possible to prepare the less-dust-generative matrix-type piezoelectric/electrostrictive device in which the piezoelectric/electrostrictive elements each including two or more layers of piezoelectric/electrostrictive members, and electrodes formed on the opposite outer surfaces of two or more layers of the piezoelectric/electrostrictive members and between two or more layers of piezoelectric/electrostrictive members are set up.

For example, instead of stacking the sheets, firing the obtained ceramic green laminate, and forming the electrodes as in the manufacturing method including the steps A1 to A6, two or more sheets in which the hole portion is not disposed and which constitute the piezoelectric/electrostrictive member later are prepared, the electrode having the predetermined shape patterns are formed beforehand on the surface between the sheets and the opposite outer surfaces, these sheets are stacked, and the obtained ceramic green laminate is fired/integrated. Then, it is possible to prepare the piezoelectric/electrostrictive element including two or more layers of piezoelectric/electrostrictive members and the electrodes formed on the opposite outer surfaces of two or more layers of piezoelectric/electrostrictive members and between two or more layers of piezoelectric/electrostrictive members.

In the present example of the second manufacturing method, as described above, after obtaining the honeycomb-shaped ceramic laminate 304 in which the open holes 3 are constituted and which is not easily deformed by its own weight or by the stress from the outside, for the wall portions forming the open holes 3, the electrode formed surface (wall portion P6) constituting the major surface is left and the other wall portion (wall portion Q7) is cut/removed so as to obtain the piezoelectric/electrostrictive element 31. In other words, the laminate is constituted of the honeycomb-shaped member which is a strong framework before the cutting/removing. Immediately after the cutting/removing, the piezoelectric/electrostrictive element 31 is obtained (more strictly, while the wall portion Q7 is cut/removed, the piezoelectric/electrostrictive element 31 appears). Therefore, depending on the manufacturing process, the piezoelectric/electrostrictive element 31 is easily deformed or broken. Therefore, even when the piezoelectric/electrostrictive element 31 is formed in a pillar member having a higher aspect ratio, it is possible to obtain the superior piezoelectric/electrostrictive element including no bend or breakage and having a straightness of the axial line of 30 μm or less. The example can be applied to a case in which the sheet 16 is relatively thin or has a relatively large area.

In the second method for manufacturing the less-dust-generative matrix-type piezoelectric/electrostrictive device according to the present invention, when the hole portion and sub-hole portion are formed in the molded sheet, any method can be used such as a punching processing method, ultrasonic processing method, and blast method. It is to be noted that it is also possible to prepare a raw piezoelectric/electrostrictive sheet by press molding or cast molding instead of the so-called green sheet.

It is to be noted that the electrode and conductive film referred to in the description of the manufacturing method indicate conductors having conductivity and also include materials which are subjected to a heat treatment or the firing to indicate the conductivity. That is, the electrode and conductive film are referred to, also including those in green states.

Moreover, in the second method for manufacturing the less-dust-generative matrix-type piezoelectric/electrostrictive device according to the present invention, as the method for cutting/removing the wall portion Q to form the open hole and the processing method for cutting the ceramic laminate, any method such as slicing processing and wire saw processing can be used. The surfaces to be processed are not the surfaces on which the electrodes are formed, and the processed surfaces do not constitute the major surfaces for functioning the piezoelectric/electrostrictive element. Therefore, influences of the cut/removed or cut surfaces are small.

Above all, as more preferable cutting/removing or cutting processing methods, regarding the processing quality level (presence/absence of detached particles or cracks), there is a mechanical processing method using free abrasive grains, particularly a wire saw processing method. The surface to be processed by the cutting/removing or cutting is the sub-surface of the piezoelectric/electrostrictive member, and does not constitute the major surface on which the electrode is formed, and the influences is small. However, the less the detached particles from the surface or cracks formed thereon are, the more the dust generation is inhibited. Thus, it is preferable. It is to be noted that gaps such as the closed hole and open hole are filled with a resin capable of being removed later before the processing, and the breakage at the time of the processing is preferably prevented.

When the wire saw processing is carried out, regarding the generation of the cracks and surface states, a wire diameter is preferably in a range of about 30 to 200 μm, and a processing rate is preferably in a range of about 10 to 100 μm/min. With a higher linear speed of the wire, the rigidity of the wire increases, and uniform processing is preferably possible without any processing deflection. The linear speed of the wire is more preferably adjusted in a range of about 10 to 800 m/min in accordance with the wire diameter, processing width, material, and dimension for use. When the conditions are employed, in the less-dust-generative matrix-type piezoelectric/electrostrictive device 1, the major surface of the piezoelectric/electrostrictive member 4 is the fired, but unprocessed face, additionally the percentage of the transgranularly fractured crystal grains can be reduced even with respect to the surfaces other than the major surface which is the surface to be processed, and the particles are further inhibited from being generated.

In the present example of the second manufacturing method, in a method of positioning the ceramic green sheets 16, 116, 117 at the time of the stacking, for example, the sheets 16, 116, 117 are successively superposed in a frame substantially having the same inner shape as the outer shape of the sheets 16, 116, 117. Alternatively, guide pins are set up, and the sheets 16, 116, 117 are successively superposed via guide holes opened beforehand to position the sheets. Thereafter, the sheets can be heated/press-bonded to form the ceramic green laminate 301.

Moreover, as a method for forming the electrode on the side surface (major surface) of the piezoelectric/electrostrictive member in FIG. 3(*e*), sputtering, vacuum deposition, CVD, plating, coating, or spraying can be carried out. In this case, after masking is carried out not to cause short-circuit of one pair of electrodes, the electrode forming method is preferably carried out. As another method, for example, the electrodes are formed beforehand over the whole surface, and are disconnected by the mechanical processing such as grinding, or laser processing, so that one pair of electrodes can be formed.

2-1-3) Third Manufacturing Method

Subsequently, the third manufacturing method will be described. In the third manufacturing method of the less-dust-generative matrix-type piezoelectric/electrostrictive device according to the present invention, the ceramic green sheet in which a slit is disposed and which constitutes the piezoelectric/electrostrictive member later is stacked on the ceramic green sheet in which one hole portion is disposed to obtain the ceramic green laminate. After firing/integrating the ceramic green laminate, the laminate is subjected to the predetermined processing. This method is the same as the first manufacturing method in that the ceramic green sheet including one hole portion is stacked, but is different in that the slit is disposed beforehand in the ceramic green sheet constituting the piezoelectric/electrostrictive member later. This slit constitutes a space between the side surfaces (sub-surfaces) of the piezoelectric/electrostrictive member on which electrode is not formed in two piezoelectric/electrostrictive elements disposed adjacent to each other among the plurality of piezoelectric/electrostrictive elements.

One mode of the third manufacturing method will be described hereinafter. The third method for manufacturing the less-dust-generative matrix-type piezoelectric/electrostrictive device according to the present invention is, for example, a manufacturing method including: a step C1 of preparing a plurality of ceramic green sheets each containing the piezoelectric/electrostrictive material which is the major component; a step C2 of opening the predetermined position of each of the predetermined number of ceramic green sheets among the plurality of ceramic green sheets to obtain the frame-shaped ceramic green sheet in which one hole portion is formed; a step C3 of disposing the slits at predetermined intervals with respect to the predetermined number of ceramic green sheets among the plurality of ceramic green sheets; a step C4 of superposing at least the frame-shaped ceramic green sheet onto the ceramic green sheet in which the slit is formed to obtain a ceramic green laminate including the closed hole; a step C5 of firing/integrating the ceramic green laminate to obtain a ceramic laminate including the closed hole; and a step C6 of cutting the ceramic laminate in a direction crossing at right angles to the slit to open one end of the closed hole and to obtain the piezoelectric/electrostrictive elements independently of one another.

The manufacturing method including the steps C1 to C6 is not limited, but in the step C3, the electrode is formed beforehand on a position corresponding to one hole portion of the frame-shaped ceramic green sheet (step C2) with respect to the opposite surfaces of the predetermined number of ceramic green sheets in which the slits are to be disposed. The portion on which the electrode is formed (electrode formed surface) is individually divided by the slits to form a plurality of conductive films connected to the individually divided electrode formed portions. Additionally, a plurality of sub-hole portions communicating with one hole portion are preferably formed in the positions corresponding to the conductive films with respect to the frame-shaped ceramic green sheet. The sub-hole portion constitutes the through hole later, the conductive film can constitute the conductive member formed on the inner wall of the through hole, and the wiring is facilitated.

To prepare the device in accordance with the steps C1 to C6 in this order as such is the preferable mode of the third method for manufacturing the less-dust-generative matrix-type piezoelectric/electrostrictive device according to the present invention, but the order is not limited. The order can appropriately be changed or the steps can simultaneously be carried out. When the steps are changed, the member to be treated in each step naturally accordingly changes.

The step of forming the electrodes is not included in s C1 to C6. This is because the third method for manufacturing the less-dust-generative matrix-type piezoelectric/electrostrictive device according to the present invention does not limit the timing for forming the electrodes. For example, after forming the electrodes on the sheet, the slits may be formed, and the electrode may also be formed in the sheet subjected to slit processing. Alternatively, the sheets on which the electrodes are formed are stacked, and the laminate may be fired and cut. After stacking the sheets and firing and cutting the laminate, the electrode may also be formed.

By the manufacturing method including the steps C1 to C6, in the step C3, the slits are disposed beforehand in the ceramic green sheet. Accordingly, without subjecting the major surface to any mechanical processing, it is possible to obtain the individually divided piezoelectric/electrostrictive elements (piezoelectric/electrostrictive members) before the firing. Moreover, by the firing, the piezoelectric/electrostrictive elements are integrally set up in the matrix form. That is, different from the first and second manufacturing methods, in the third manufacturing method according to the present invention, the individually divided piezoelectric/electrostrictive members (piezoelectric/electrostrictive elements) can be obtained before the firing step.

One example of the schematic steps of the manufacturing method including the steps C1 to C6 is shown in FIGS. 5(a) to 5(f). This example will concretely be described hereinafter.

Figure 5A:
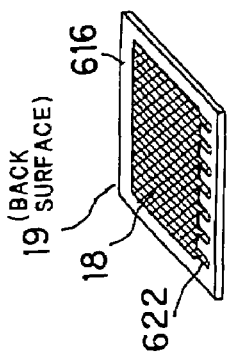
FIGS. 5(a) to 5(f) are explanatory views showing one example of the method for manufacturing the less-dust-generative matrix-type piezoelectric/electrostrictive device according to the present invention.
Figure 5B:
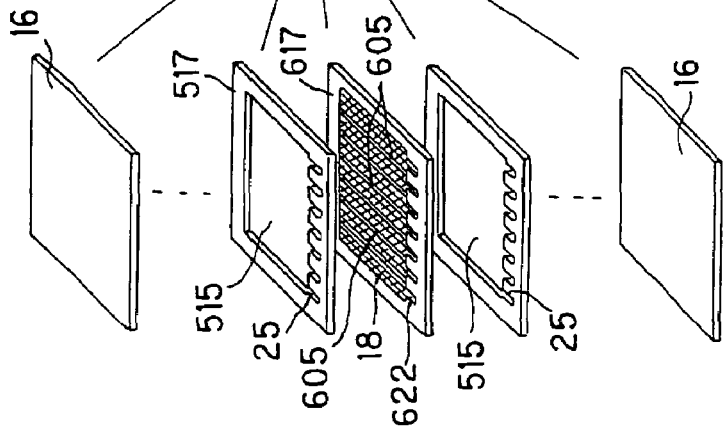

First, in conformity to the second manufacturing method, the predetermined number of ceramic green sheets containing the piezoelectric/electrostrictive material which is the major component are prepared. As the sheets, as shown in FIG. 5(b), in addition to the predetermined number of sheets 16 and 517 similar to those of the second manufacturing method, the predetermined number of sheets 617 are also prepared. For the sheet 617, first on the opposite major surfaces of the sheet 16, as shown in FIG. 5(a), the electrodes 18, 19 are formed. Moreover, a conductive film 622 constituting the conductive member after the firing is formed on a position corresponding to the sub-hole portion 25 disposed in the sheet 517 to obtain a sheet 616. Thereafter, as shown in FIG. 5(b), slits 605 are formed by the punching processing so as to constitute the individually divided piezoelectric/electrostrictive elements later. It is to be noted that the electrodes are distinguished from the conductive films in the description, but this is a distinction for the description, and portions of one conductor pattern are merely referred to in this manner for the sake of convenience.

Figure 5C:
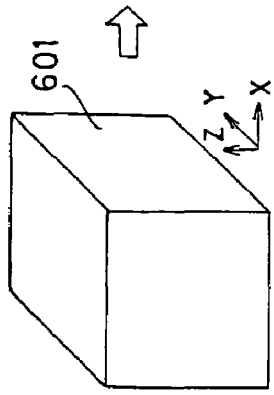

Moreover, these predetermined number of sheets 16, 517, 617 are stacked and press-bonded to obtain a ceramic green laminate 601 (see FIG. 5(c)). For the stacking method, in this example, the uppermost and lowermost layers are constituted of the sheets 16, the sheets 517 and 617 are assumed as one unit between the sheets 16, and the same number of sheets as the number of columns (rows) of the piezoelectric/electrostrictive device in which the piezoelectric/electrostrictive elements are arranged in the matrix form are superposed. The uppermost and lowermost layers may also be the sheets 517.

Figure 5D:
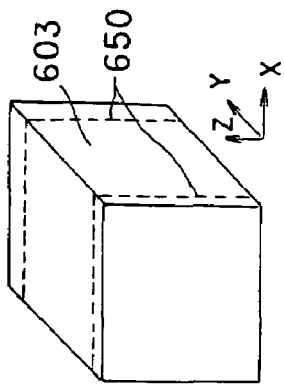
Figure 5E:
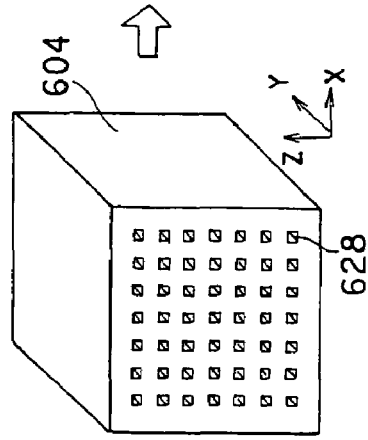

The ceramic green laminate 601 shown in FIG. 5(c) contains the piezoelectric/electrostrictive material which is the major component, and includes non-fired pillar members corresponding to the piezoelectric/electrostrictive elements (not shown) and through holes 628 (see FIG. 5(e)) on which the conductive film 622 is already formed. Moreover, the ceramic green laminate 601 is fired/integrated to obtain a ceramic laminate 603 (see FIG. 5(d)).

Figure 5F:
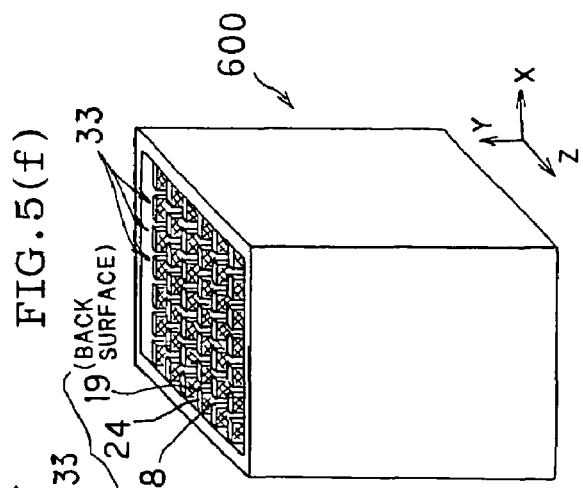

Next, as shown in FIG. 5(d), the unnecessary portion is cut/removed along a cut line 650 to expose the through holes 628 as shown in FIG. 5(e) and to obtain a ceramic laminate 604 in which piezoelectric/electrostrictive elements 33 are exposed (the piezoelectric/electrostrictive elements 33 are not shown in FIG. 5(e), and are shown in FIG. 5(f)). The ceramic laminate 604 is equal to the less-dust-generative matrix-type piezoelectric/electrostrictive device substantially to be obtained. If necessary, the polarization treatment is carried out, and a less-dust-generative matrix-type piezoelectric/electrostrictive device 600 is completed (FIG. 5(f)). It is to be noted that the less-dust-generative matrix-type piezoelectric/electrostrictive device 600 shown in FIG. 5(e) shows the state that the ceramic laminate 604 shown in FIG. 5(e) has been raised by 90°. In the ceramic laminate 604 shown in FIG. 5(e), the surface in which the through holes 628 are opened (front side in the figure, XZ plane) forms the side surface, but in the less-dust-generative matrix-type piezoelectric/electrostrictive device 600 shown in FIG. 5(f), the surface in which the through holes 628 are opened constitutes the lower surface.

It is to be noted that in the present example of the third manufacturing method, to simplify the description for ease of understanding, the sheet 617, and the sheet 517 including the sub-hole portions 25 are alternately stacked. In the obtained less-dust-generative matrix-type piezoelectric/electrostrictive device 600, the through holes 628 are substantially shared between two piezoelectric/electrostrictive elements 33 (electrodes 18, 19) disposed adjacent to each other in the sheet stacking direction. The electrodes 18, 19 which share the through holes 628 inevitably indicate the same potential at the time of the driving. Needless to say, the individual through holes 628 may separately be disposed with respect to the respective electrodes 18, 19 of each piezoelectric/electrostrictive element 33. In two or more piezoelectric/electrostrictive elements 33, the electrodes indicating the same potential at the time of the driving may share the through holes in common regardless of whether or not the piezoelectric/electrostrictive elements 33 are disposed adjacent to each other.

For example, when the ceramic green laminate is prepared as follows, it is possible to obtain the less-dust-generative matrix-type piezoelectric/electrostrictive device including the separate through holes 628 with respect to the respective electrodes 18, 19 of each piezoelectric/electrostrictive element 33. First, a plurality of ceramic green laminate units each including the sheet 617 stacked between two sheets 517 is prepared. Next, the sheet including only the hole portion 515 (the sheet 517 excluding the sub-hole portions 25) is superposed, stacked, and press-bonded between the ceramic green laminate units to constitute the ceramic green laminate.

The third manufacturing method according to the present invention is a further effective manufacturing method in inhibiting the particle generation because the major-surface of the piezoelectric/electrostrictive member is naturally the fired, but unprocessed face and the other side surface (sub-surface) excluding the top is the surface formed before the firing (non-processed surface after the firing). Since the electrode and conductive film of the piezoelectric/electrostrictive element (corresponding to the inner wall of the through hole) can be formed integrally of the conductive material, there is not a possibility of disconnection.

The first to third manufacturing methods have been described above with respect to the method for manufacturing the less-dust-generative matrix-type piezoelectric/electrostrictive device according to the present invention. Additionally, the less-dust-generative matrix-type piezoelectric/electrostrictive device prepared by the method for manufacturing the less-dust-generative matrix-type piezoelectric/electrostrictive device according to the present invention can be used in a state the piezoelectric/electrostrictive elements are set up in the matrix form on the ceramic substrate and are integrally formed. However, when the ceramic substrate is cut, the individual piezoelectric/electrostrictive elements are obtained, and it is also possible to use the obtained piezoelectric/electrostrictive element alone. That is, the method for manufacturing the less-dust-generative matrix-type piezoelectric/electrostrictive device according to the present invention can be applied as means for efficiently and collectively preparing a large number of individual piezoelectric/electrostrictive elements.

(2-2) Method for Manufacturing Less-Dust-Generative Cell-Driving Type Piezoelectric/Electrostrictive Device Next, a method for manufacturing a less-dust-generative cell-driving type piezoelectric/electrostrictive device according to the present invention will be described. The method for manufacturing the less-dust-generative cell-driving type piezoelectric/electrostrictive device according to the present invention is a method for manufacturing a piezoelectric/electrostrictive device in which two or more piezoelectric/electrostrictive elements each including the piezoelectric/electrostrictive member and at least one pair of electrodes formed on the side surfaces of the piezoelectric/electrostrictive member and each having a thin-wall shape are set up like comb teeth on the ceramic substrate. The device includes a cell formed by the ceramic substrate, the piezoelectric/electrostrictive elements disposed adjacent to each other, and a lid section connecting one piezoelectric/electrostrictive element to the other piezoelectric/electrostrictive element, and the side surfaces of the piezoelectric/electrostrictive member on which the electrodes are formed are the fired, but unprocessed faces.

For the method for manufacturing the less-dust-generative cell-driving type piezoelectric/electrostrictive device according to the present invention, since a preparation object is different, a content of the processing such as the cutting and the cutting/removing carried out after the firing of the ceramic green laminate obtained by stacking the ceramic green sheets differs. However, the method is the same as the first method for manufacturing the less-dust-generative matrix-type piezoelectric/electrostrictive device according to the present invention in that the ceramic green sheet constituting the piezoelectric/electrostrictive member later is stacked on the ceramic green sheet including one hole portion to obtain the ceramic green laminate, and the ceramic green laminate is fired/integrated and subsequently subjected to the predetermined processing.

One mode of the method for manufacturing the less-dust-generative cell-driving type piezoelectric/electrostrictive device according to the present invention will hereinafter be described. The method for manufacturing the less-dust-generative cell-driving type piezoelectric/electrostrictive device according to the present invention is, for example, a manufacturing method including: a step F1 of preparing a plurality of ceramic green sheets containing the piezoelectric/electrostrictive materials which are the major components; a step F2 of opening the predetermined positions of the predetermined number of ceramic green sheets in the plurality of ceramic green sheets to obtain frame-shaped ceramic green sheets in which at least one hole portion substantially having a square shape is formed; a step F3 of stacking at least the predetermined number of ceramic green sheets in which one hole portion is disposed and those in which one hole portion is not disposed to obtain the ceramic green laminate including the cell; and a step A4 of firing/integrating the ceramic green laminate to obtain the ceramic laminate including the cell.

By the manufacturing method, the predetermined portion of the ceramic green sheet without having one hole portion constitutes the wall portion having the thin-wall shape defining the cells in the fired ceramic laminate, and the electrode is formed on the wall portion to constitute the piezoelectric/electrostrictive element. Moreover, one hole portion formed in another ceramic green sheet in which one hole portion is disposed constitutes the cell. The electrode formed surface which is the piezoelectric/electrostrictive element is not subjected to any mechanical processing.

To prepare the device in accordance with the steps F1 to F4 in this order as such is the preferable mode of the method for manufacturing the less-dust-generative cell-driving type piezoelectric/electrostrictive device according to the present invention, but the order is not limited. The order can appropriately be changed or the steps can simultaneously be carried out. When the steps are changed, the member to be treated in each step naturally accordingly changes.

The step of forming the electrodes is not included in s F1 to F4. This is because the method for manufacturing the less-dust-generative cell-driving type piezoelectric/electrostrictive device according to the present invention does not limit the timing for forming the electrodes. The steps F1 to F4 are steps for the piezoelectric/electrostrictive element constituted of one layer of piezoelectric/electrostrictive member. Therefore, for example, before the step F3, the electrodes may also be formed beforehand on the predetermined positions (positions opposite to one hole portion) of the predetermined number of ceramic green sheets in which one hole portion is not formed. Alternatively, after the step F4, the electrodes may be formed on the opposite surfaces of the wall portion constituted of the ceramic green sheet portion in which the hole portion is not disposed among the wall portions forming the cell of the ceramic laminate.

One example of the schematic steps of the manufacturing method including the steps F1 to F4 is shown in FIGS. 15(a) to 15(e). The preparation object is the less-dust-generative cell-driving type piezoelectric/electrostrictive device 150 including two independent cells as shown in FIGS. 16 and 17. This will concretely be described hereinafter with reference to FIGS. 15(a) to 15(e). It is to be noted that in the following description, the step of forming the electrodes is carried out before stacking the sheets.

First, the predetermined number of ceramic green sheets containing the piezoelectric/electrostrictive material described later which is the major component are prepared. As shown in FIG. 15(a), the sheets to be prepared include a plurality of sheets 16 molded and subjected to the outer shape processing by the predetermined processing method, the predetermined number of sheets 157, 158 including hole portions 155, 165, respectively, which are openings substantially having the square shapes in the processed molded sheets as shown, and the predetermined number of sheets 156 including the electrodes 18, 19 on the predetermined positions of the molded sheets.

The hole portion 165 of the sheet 158 constitutes the independent cell later, and the hole portion 155 of the sheet 157 constitutes the space between two piezoelectric/electrostrictive elements which are disposed adjacent to each other but which do not form the cell. The sheets 158 and 157 have the same shape as that of the sheet 16. As understood from FIG. 15(a), for a side 446 of the hole portion 165 of the sheet 158, a part of a side 445 of the hole portion 155 of the sheet 157 is left and the side is moved so as to reduce an opening area. For the sheet 156 constituting the piezoelectric/electrostrictive element, the electrodes 18, 19 are formed on the opposite surfaces of the sheet in accordance with the shapes and positions of the opposed hole portions 155, 165 of the stacked sheets 157, 158.

Subsequently, these predetermined numbers of sheets 16, 156, 157, 158 are stacked and press-bonded to obtain a ceramic green laminate 151 (see FIG. 15(b)). For the stacking method, in this example, the uppermost and lowermost layers are constituted of the sheets 16, and between the layers, the sheets 157, 156, 158, 156, 157 constituting one unit are stacked by two units corresponding to the number of independent cells. It is to be noted that when the sheets 157 are continued, one sheet may be omitted. The thickness of each sheet is determined based on the designs such the size of the cell and the thickness of the piezoelectric/electrostrictive element having the thin-wall shape forming the cell, and the thickness of the sheet may be either the same or different. For example, when the liquid discharge device is prepared, the portions constituting the supply and discharge holes of the solution are preferably formed beforehand in the sheet.

The ceramic green laminate 151 shown in FIG. 15(b) includes the cell being surrounded by walls and disposed in the laminate (not shown), and the cell is constituted of the hole portion 155 of the sheet 157 held between the sheets 16 and 156 or the hole portion 165 of the sheet 158. Moreover, the ceramic green laminate 151 is fired/integrated to obtain a ceramic laminate 153 (see FIG. 15(c)). It is to be noted that in the same manner as in the method for manufacturing the less-dust-generative matrix-type piezoelectric/electrostrictive device according to the present invention, the cell surrounded by walls is, needless to say, connected to the outside via the gas vent hole.

Next, as shown in FIG. 15(c), the unnecessary portions are cut/removed along cut lines 140a, 140b, and a ceramic laminate 154 is obtained in which one end of the cell surrounded by walls is opened to expose cells 163 as shown in FIG. 15(d). The cut line 140a is drawn in a position where the portion corresponding to the hole portion 155 of the sheet 157 not forming the cell 163 is opened and the portion corresponding to the hole portion 165 of the sheet 158 forming the cell 163 is not opened because of left lid sections 167.

Subsequently, the electrode terminals 20, 21 connected to the electrodes 18, 19 are formed with respect to the ceramic laminate 154. If necessary, the polarization treatment is performed to complete the less-dust-generative cell-driving type piezoelectric/electrostrictive device 150 (FIG. 15(e)). The less-dust-generative cell-driving type piezoelectric/electrostrictive device 150 shown in FIG. 15(e) is laid by 90° and shown with respect to the ceramic laminate 154 shown in FIG. 15(d).

In the above-described method, the sheet 158 including the hole portion 165 constituting the cell 163 later, and the sheet 157 including the hole portion 155 which does not form the cell 163 are prepared. The sheets are stacked, the lid sections 167 are left at the time of the cutting, and the lid sections 167 are also manufactured integrally with the ceramic substrate 2 and piezoelectric/electrostrictive element. However, without using the sheet 158, only the sheet 157 including the hole portion 155 which does not form the cell 163 is stacked in addition to the sheets 16, 156, two end surfaces of the cell surrounded by walls are opened at the time of the cutting, and thereafter the lid sections may also be attached later. In this method, except the attaching of the lid sections, the device including the independent cell can be prepared substantially in the same process as that of the device in which the cell is not independent.

Moreover, in the less-dust-generative cell-driving type piezoelectric/electrostrictive device according to the present invention, the cell may also be sealed/closed. In the step shown in FIG. 15(c), the cutting/removing along the cut line 140b may not be carried out. Especially in the present example, the electrodes are formed before stacking the sheets. Therefore, the method is suitable for obtaining the less-dust-generative cell-driving type piezoelectric/electrostrictive device including the cell sealed/closed from the beginning.

It is to be noted that for the processing means for forming the hole portion in the sheet, the processing means for the cutting, the means for stacking the sheets, or the means for forming the electrodes, the method conforming to the method for manufacturing the less-dust-generative matrix-type piezoelectric/electrostrictive device according to the present invention can be employed.

The manufacturing method including the steps F1 to F4 is a method for preparing the less-dust-generative cell-driving type piezoelectric/electrostrictive device in which the piezoelectric/electrostrictive element including one layer of piezoelectric/electrostrictive member is set up. However, in the method for manufacturing the less-dust-generative cell-driving type piezoelectric/electrostrictive device according to the present invention, it is possible to prepare the less-dust-generative cell-driving type piezoelectric/electrostrictive device in which the piezoelectric/electrostrictive element is set up including two or more layers of piezoelectric/electrostrictive members and the electrodes formed on the opposite outer surfaces of two or more layers of piezoelectric/electrostrictive members and between two or more layers of piezoelectric/electrostrictive members.

For example, two or more sheets in which one hole portion constituting the piezoelectric/electrostrictive member later is not formed are prepared, the electrodes of the predetermined shape patterns are formed beforehand on the surface between the sheets and on the opposite outer surfaces, these sheets are stacked, and the obtained ceramic green laminate is fired/integrated and subjected to the predetermined processing. Then, it is possible to prepare the piezoelectric/electrostrictive element including two or more layers of piezoelectric/electrostrictive members and the electrodes formed on the opposite outer surfaces of two or more layers of piezoelectric/electrostrictive members and between two or more layers of piezoelectric/electrostrictive members.

(3) Guide-Attached Matrix Type Piezoelectric/Electrostrictive Device

Figure 8A:
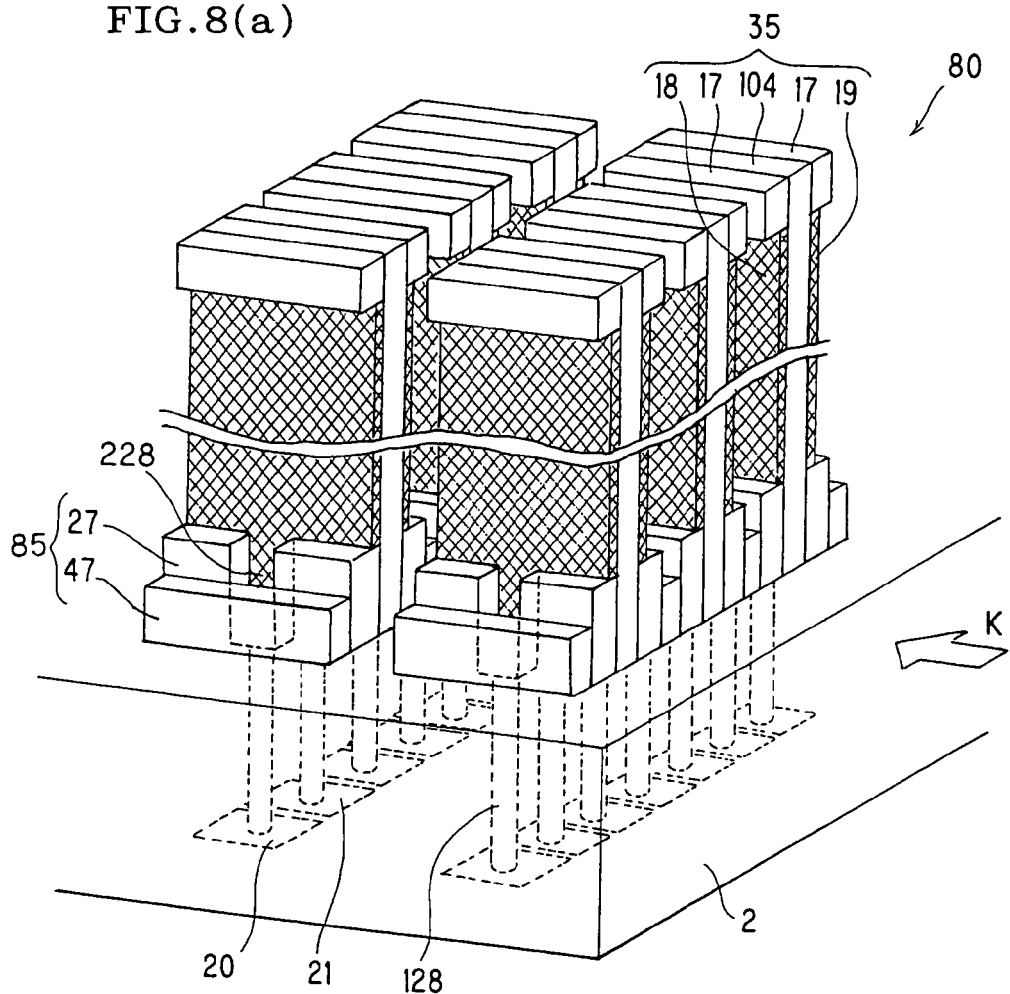
FIG. 8(a) is a perspective view.
Figure 8B:
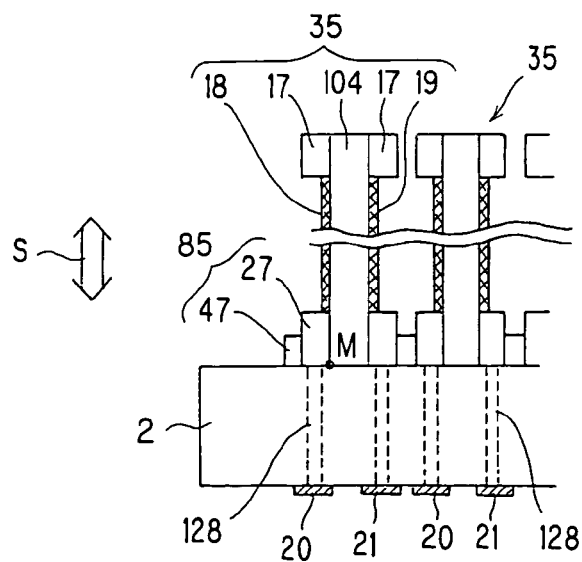
FIG. 8(b) is a side view of an arrow K in FIG. 8(a)

Next, a guide-attached matrix-type piezoelectric/electrostrictive device according to the present invention will be described. FIG. 8(a) is a perspective view showing one embodiment of the guide-attached matrix-type piezoelectric/electrostrictive device according to the present invention, and FIG. 8(b) is a side view of an arrow K in FIG. 8(a). As shown, a guide-attached matrix-type piezoelectric/electrostrictive device 80 is formed of a plurality of piezoelectric/electrostrictive elements 35 each including a piezoelectric/electrostrictive member 104 and one pair of electrodes 18, 19 on the ceramic substrate 2. When the piezoelectric/electrostrictive members 104 cause the displacement on the ceramic substrate 2, the piezoelectric/electrostrictive elements 35 are driven. The guide-attached matrix-type piezoelectric/electrostrictive device 80 includes the following essential characteristics and predetermined characteristics in the guide-attached matrix-type piezoelectric/electrostrictive device according to the present invention.

3-a) Positional Deviation Inhibition of Piezoelectric/Electrostrictive Element

The guide-attached matrix-type piezoelectric/electrostrictive device 80 develops the essential characteristic of the guide-attached matrix-type piezoelectric/electrostrictive device according to the present invention in that convex members 17 are disposed in the tip ends of the piezoelectric/electrostrictive members 104 constituting the plurality of piezoelectric/electrostrictive elements 35 set up on the ceramic substrate 2.

In one piezoelectric/electrostrictive element 35, two convex members 17 are disposed so as to hold the piezoelectric/electrostrictive member 104 in the tip end of the piezoelectric/electrostrictive member 104, and each convex member 17 forms the pillar member including the surface substantially parallel to the electrode formed surface. As understood from FIG. 8(b), as compared with a minimum interval (i.e., corresponding to a gap between the surfaces of the electrodes 18, 19 of two piezoelectric/electrostrictive elements 35 disposed adjacent to each other) between two piezoelectric/electrostrictive elements 35 disposed adjacent to each other in a case in which the convex members 17 are not disposed, the interval between the convex members 17 disposed opposite to each other of two piezoelectric/electrostrictive elements 35 disposed adjacent to each other is a minimum interval and is narrowed by the disposed convex members 17.

As a result, regardless of the driving operation, a range in which the position of one piezoelectric/electrostrictive element 35 can fluctuate is limited in a certain range by the other adjacent piezoelectric/electrostrictive element 35 without any contact between the electrode surfaces. When one piezoelectric/electrostrictive element 35 expands/contracts and is driven in a direction S in FIG. 8(b), a range of the fluctuation of the driving direction is limited in the certain range by the other adjacent piezoelectric/electrostrictive element 35 without any contact between the electrode surfaces. That is, one piezoelectric/electrostrictive element 35 is guided into a position in a relatively certain range determined by the convex member 17 of the element and that of the other adjacent piezoelectric/electrostrictive element 35 at the time of the driving and in a stationary state.

In general, a structure is formed in which a large number of pillar members formed of ceramic materials having the high aspect ratio are set up on a plane (e.g., the ceramic substrate surface) at narrow pitches. In this case, the pillar member warps by unevenness of sintering contraction or processing damage in processing the pillar member, and the accuracy of position is easily deteriorated.

Moreover, when the piezoelectric/electrostrictive element having the pillar mode with the high aspect ratio is driven, even slight unevenness is generated in the strain caused in the piezoelectric/electrostrictive element, or the driving direction is not achieved as intended also by disturbances such as vibration. When the driving direction is other than the intended direction, during the driving, positional fluctuations such as lateral vibration may occur in such a range that the electrode surfaces of two piezoelectric/electrostrictive elements disposed adjacent to each other contact each other. The operation point which is the top of the piezoelectric/electrostrictive element in many cases easily deviates.

The above-described problems which would occur easily occur, when larger displacement amount and higher generative force are required for the piezoelectric/electrostrictive device and the mode having the high aspect ratio is set. The reliability of the device easily drops. On the other hand, for the guide-attached matrix-type piezoelectric/electrostrictive device 80, the piezoelectric/electrostrictive element (piezoelectric/electrostrictive member) is set to the high aspect ratio, and the larger displacement amount and higher generative force are obtained at the lower voltage. Even in this case, the positional deviations at the driving time and in the stationary state of the piezoelectric/electrostrictive element are reduced, and the contact between the electrode surfaces of two piezoelectric/electrostrictive elements disposed adjacent to each other is not caused. The operation point for driving the piezoelectric/electrostrictive element is inhibited from deviating, and the above-described problem does not occur.

Moreover, for the guide-attached matrix-type piezoelectric/electrostrictive device 80, in the tip end of the piezoelectric/electrostrictive member 104, the convex members 17 are disposed so as to hold the piezoelectric/electrostrictive member 104. Each convex member 17 is the pillar member including the surface substantially parallel to the top of the piezoelectric/electrostrictive member 104. Therefore, when the piezoelectric/electrostrictive element 35 expands/contracts and is driven in the direction S (FIG. 8(b)), and the operation point corresponds to the top of the piezoelectric/electrostrictive element 35, the area of the operation point is enlarged, the erroneous operation does not easily occur, and the reliability of the piezoelectric/electrostrictive device is enhanced.

It is to be noted that for the guide-attached matrix-type piezoelectric/electrostrictive device 80, by the characteristics appearing in the shape including the convex member 17, the positional deviation of the piezoelectric/electrostrictive element is reduced, and the enhancement of capability and reliability can be realized. However, causes for the conventional problem, such as the residual stress inside the piezoelectric/electrostrictive element, are not eliminated. Moreover, the material, manufacturing process, polarization treatment, and processing method are preferably improved. The effect by these improvements can coexist with the effect brought about by the characteristic of the guide-attached matrix-type piezoelectric/electrostrictive device 80.

In the guide-attached matrix-type piezoelectric/electrostrictive device 80, as clearly shown in the manufacturing method described later, the convex members 17 can be prepared integrally with the piezoelectric/electrostrictive member 104. However, as means for obtaining the effect of the positional deviation inhibition, for example, a separate component may also be disposed between two piezoelectric/electrostrictive elements 35 disposed adjacent to each other. However, this means increases the number of components constituting the device, a position adjustment operation of the separate component with respect to the piezoelectric/electrostrictive element 35 occurs, and the number of manufacturing steps including a step for preparing the separate component further increases. From this viewpoint, the convex members 17 are preferably prepared integrally with the piezoelectric/electrostrictive member 104.

3-b) Stair-Like Member disposed in Root of Piezoelectric/Electrostrictive Member In the guide-attached matrix-type piezoelectric/electrostrictive device 80, as shown in FIGS. 8(a) and 8(b), each piezoelectric/electrostrictive element 35 includes a stair-like member 85 including a mountain-side member 27 and valley-side member 47 in a root of the piezoelectric/electrostrictive member 104. The stair-like member 85 alleviates stress concentration onto edges of the piezoelectric/electrostrictive element 35 and ceramic substrate 2 (M-point portion in FIG. 8(b) showing a section), and the mechanical strength of the piezoelectric/electrostrictive element 35 is enhanced. Even when the driving operation is repeated over a long period, it is possible to obtain the piezoelectric/electrostrictive device low in occurrence of the erroneous operation or trouble and high in reliability.

Additionally, in the guide-attached matrix-type piezoelectric/electrostrictive device 80, it is possible to form the electrode on the fired, but unprocessed face of the piezoelectric/electrostrictive member by the manufacturing method described later. That is, the less-dust-generative guide-attached matrix-type piezoelectric/electrostrictive device can be formed and this mode is preferable.

Furthermore, in the guide-attached matrix-type piezoelectric/electrostrictive device 80, as shown in FIG. 8(a), the electrode terminals 20, 21 are formed on the surface on the opposite side of the surface on which the piezoelectric/electrostrictive elements 35 are disposed via the ceramic substrate 2. The electrode 18 and electrode terminal 20, and the electrode 19 and electrode terminal 21 extend through the stair-like member 85 and a through hole 228 including a conductive member (conductive material) formed on the inner wall, and inside the ceramic substrate 2, and are wired via the through holes 128 including the conductive members formed on the inner walls. In this manner, the electrode terminals 20, 21 are formed beforehand on the side opposite to the piezoelectric/electrostrictive element 35 which is a driving section. Accordingly, a power supply connection operation for applying the electric field later is facilitated, and the yield drop caused by the manufacturing step can be prevented.

The guide-attached matrix-type piezoelectric/electrostrictive device 80 has been described above with respect to the mode including the essential characteristic and preferable characteristic in the guide-attached matrix-type piezoelectric/electrostrictive device of the present invention, but the guide-attached matrix-type piezoelectric/electrostrictive device according to the present invention is not limited to the mode of the guide-attached matrix-type piezoelectric/electrostrictive device 80. As in the less-dust-generative matrix-type type piezoelectric/electrostrictive device 800 described above, it is possible to take a mode in which two or more layers of piezoelectric/electrostrictive members are disposed in one piezoelectric/electrostrictive element. Another mode concerning the essential characteristic and preferable characteristic is also considered. Next, another mode of the characteristics will be illustrated and described.

In the guide-attached matrix-type piezoelectric/electrostrictive device according to the present invention, the convex member is disposed as the positional deviation inhibition means in the piezoelectric/electrostrictive member. However, the convex member may be disposed in at least the tip end of the piezoelectric/electrostrictive member in one of at least two piezoelectric/electrostrictive elements disposed adjacent to each other among a plurality of piezoelectric/electrostrictive elements set up on the ceramic substrate.

Figure 9A:
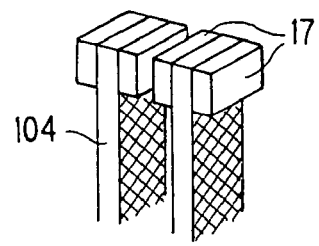
FIGS. 9(a) to 9(f) are diagrams showing one embodiment of the guide-attached matrix-type piezoelectric/electrostrictive device according to the present invention, and are perspective views showing various modes of a convex member.
Figure 9B:
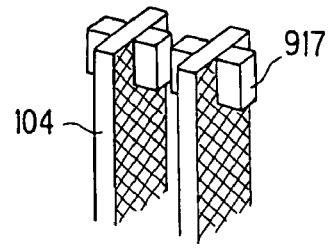
Figure 9C:
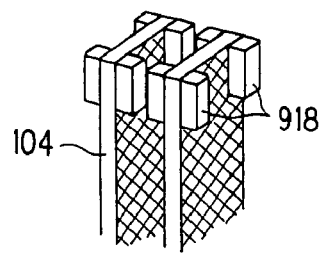
Figure 9D:
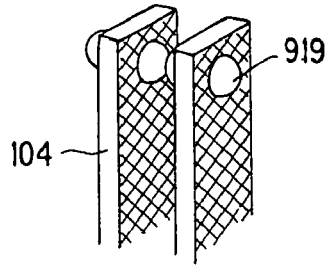
Figure 9E:
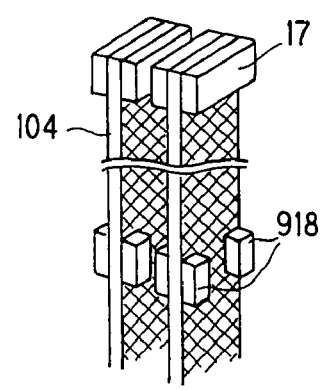
Figure 9F:
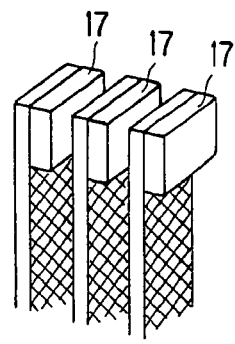

A mode for disposing the convex member is shown in FIGS. 9(a) to 9(f). FIG. 9(a) shows a most preferable mode in the guide-attached matrix-type piezoelectric/electrostrictive device 80. Additionally, to inhibit the positional deviation, the convex member may be disposed in at least the tip end of the piezoelectric/electrostrictive member. Therefore, as in convex members 917 shown in FIG. 9(b), and convex members 918 shown in FIG. 9(c), the member may be the same pillar member as the convex member 17 and may have a different shape. The member may have a semi-circular shape as in convex members 919 shown in FIG. 9(d). Furthermore, as shown in FIG. 9(e), convex members 918 may also be disposed in portions other than the tip end as shown in FIG. 9(e). This is because the positional deviation can be inhibited even in portions other than the tip end (such as an intermediate portion) of the piezoelectric/electrostrictive element (piezoelectric/electrostrictive member). The convex member may be disposed in one of at least two piezoelectric/electrostrictive elements disposed adjacent to each other. Therefore, the guide-attached matrix-type piezoelectric/electrostrictive device 80 may also include a mode in which one of two convex members 17 per piezoelectric/electrostrictive element is omitted (FIG. 9(f)). Even in this mode, it is possible to avoid the contact between the electrode surfaces.

Moreover, in the guide-attached matrix-type piezoelectric/electrostrictive device according to the present invention, for the individual piezoelectric/electrostrictive elements, the stair-like member is disposed in the root of the piezoelectric/electrostrictive member, but the stair-like member is not limited as long as the member has a stair-like shape, and the number of mountain-side members or valley-side members is not limited.

Figure 10A:
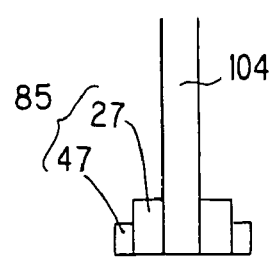
FIGS. 10(a) to 10(c) are diagrams showing one embodiment of the guide-attached matrix-type piezoelectric/electrostrictive device according to the present invention, and are side views showing various modes of a stair-like member.
Figure 10B:
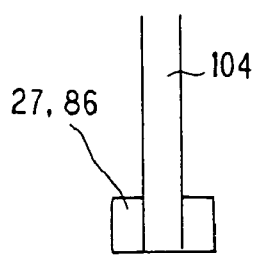
Figure 10C:
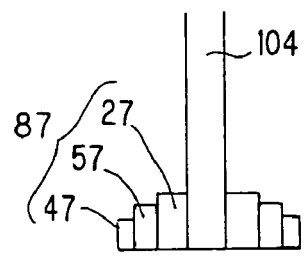

The mode for disposing the stair-like member is shown in FIGS. 10(a) to 10(c). FIG. 10(a) shows a most preferable mode shown in the guide-attached matrix-type piezoelectric/electrostrictive device 80. As understood from FIGS. 8(a), 8(b), the valley-side member 47 constitutes a part of the stair-like member in two piezoelectric/electrostrictive elements disposed adjacent to each other. In other words, two piezoelectric/electrostrictive elements share one valley-side member 47. Since the valley-side member has a function of determining a distance between two piezoelectric/electrostrictive elements disposed adjacent to each other, it is easy to determine the position for disposing the piezoelectric/electrostrictive element in the ceramic substrate (the position of the root of the piezoelectric/electrostrictive member). Additionally, in order to alleviate the stress concentration onto the edge portions of the piezoelectric/electrostrictive element and ceramic substrate, as shown in FIG. 10(*b*), a stair-like member 86 may be constituted of only the mountain-side member 27 (this also applies to the stair-like member constituted of only the valley-side member). As shown in FIG. 10(*c*), an intermediate member 57 may be disposed between the mountain-side member 27 and the valley-side member 47 to constitute a stair-like member 87 and, needless to say, four or more layers of members may also be disposed.

(4) Method for Manufacturing Guide-Attached Matrix-Type Piezoelectric/Electrostrictive Device Next, a method for manufacturing the guide-attached matrix-type piezoelectric/electrostrictive device according to the present invention will be described. The method for manufacturing the guide-attached matrix-type piezoelectric/electrostrictive device according to the present invention is a method for manufacturing a piezoelectric/electrostrictive device in which a plurality of piezoelectric/electrostrictive elements each including a piezoelectric/electrostrictive member and at least one pair of electrodes formed on side surfaces of the piezoelectric/electrostrictive member and each having a pillar shape are set up in a matrix form on a thick ceramic substrate and in which the ceramic substrate is formed integrally with the piezoelectric/electrostrictive elements and in which a convex member is disposed in at least a tip end of a piezoelectric/electrostrictive member in at least one of the piezoelectric/electrostrictive elements disposed adjacent to each other among the plurality of piezoelectric/electrostrictive elements.

The method for manufacturing the guide-attached matrix-type piezoelectric/electrostrictive device according to the present invention includes: a step E1 of preparing a plurality of ceramic green sheets each containing a piezoelectric/electrostrictive material as a major component; a step E2 of opening predetermined positions of a predetermined number of ceramic green sheets among the plurality of ceramic green sheets to obtain frame-shaped ceramic green sheets Fa in which one hole portion substantially having a square shape is formed; a step E3 of forming an electrode on a position corresponding to one hole portion of the ceramic green sheet Fa with respect to the opposite surfaces of the predetermined number of ceramic green sheets among the plurality of ceramic green sheets; a step E4 of opening the predetermined positions of the predetermined number of ceramic green sheets among the plurality of ceramic green sheets to obtain frame-shaped ceramic green sheets Fb in which an enlarged hole portion obtained by enlarging one side of one hole portion substantially having the square shape of the ceramic green sheet Fa is formed; a step E5 of superposing the ceramic green sheet Fa upon one surface or opposite surfaces of the ceramic green sheet including the electrodes formed on the opposite surfaces to obtain a plurality of ceramic green laminate units; a step E6 of using the ceramic green sheet Fb as an outermost layer and alternately stacking the ceramic green sheets Fb upon the ceramic green laminate units to obtain a ceramic green laminate; a step E7 of firing/integrating the ceramic green laminate to obtain a ceramic laminate including a closed hole; a step E8 of cutting the ceramic laminate along one side forming the enlarged hole portion of the ceramic green sheet Fb or slightly on the side of the enlarged hole portion from the one side to obtain the ceramic laminate including an open hole obtained by opening one end of the closed hole; and a step E8 of forming a cut in a direction intersecting with a wall portion of the ceramic laminate in which the closed hole is formed and in a depth direction of the closed hole.

In the method for manufacturing the guide-attached matrix-type piezoelectric/electrostrictive device according to the present invention, in the predetermined number of ceramic green sheets Fa in which a plurality of sub-hole portions communicating with one hole portion are to be formed, the plurality of sub-hole portions communicating with one hole portion are formed. Moreover, with respect to the opposite surfaces of the ceramic green sheet on which the electrodes are formed, the electrodes are preferably formed in positions corresponding to the sub-hole portions of the ceramic green sheet Fa. A mode can be taken in which the sub-hole portions and the electrodes formed in the positions corresponding to the sub-hole portions constitute later the through hole including the conductive member formed on the inner wall of the hole, and the wiring is facilitated.

To prepare the device in accordance with the steps E1 to E9 in this order as such is the preferable mode of the method for manufacturing the guide-attached matrix-type piezoelectric/electrostrictive device according to the present invention, but the order is not limited. The order can appropriately be changed or the steps can simultaneously be carried out. Instead of stacking the sheets on which the electrodes are formed and sintering, cutting, or incising the laminate, for example, it is possible to form slits beforehand in predetermined positions of the sheet on which the electrode is formed and the sheet Fa in which one hole portion is formed among the sheets to be stacked, stack the respective sheets, fire the laminate, and only cut the fired laminate. When the steps are changed in this manner, the member to be treated in each step naturally accordingly changes.

By the manufacturing method, the ceramic green sheet on which the electrode is formed constitutes the piezoelectric/electrostrictive element, and the ceramic green sheet itself constitutes the piezoelectric/electrostrictive member constituting the piezoelectric/electrostrictive element. A part of the ceramic green sheet Fa corresponding to a difference in area between one hole portion formed in the ceramic green sheet Fa and the enlarged hole portion formed in the ceramic green sheet Fb and including an enlarged side from the one hole portion is stacked on the ceramic green sheet on which the electrode is formed. Moreover, since the ceramic laminate obtained by stacking and firing the respective sheets is cut along the one side or on the side of the enlarged hole portion slightly from the one side, a part of the ceramic green sheet Fa remains in the end of the ceramic green sheet on which the electrode is formed to constitute the convex member disposed on the tip end of the piezoelectric/electrostrictive member.

One example of the schematic steps of the method for manufacturing the guide-attached matrix-type piezoelectric/electrostrictive device according to the present invention is shown in FIGS. 13(*a*) to 13(*g*). This example is shown as a method for preparing the guide-attached matrix-type piezoelectric/electrostrictive device 80 shown in FIG. 8(*a*). Therefore, there is shown a method capable of preparing the guide-attached matrix-type piezoelectric/electrostrictive device in which in addition to the convex member, the stair-like member is disposed in the root of the piezoelectric/electrostrictive member. This example will concretely be described.

First, the predetermined number of ceramic green sheets containing the piezoelectric/electrostrictive material described later are prepared. This sheet can be prepared by the ceramic manufacturing method which has heretofore been known. For example, piezoelectric/electrostrictive material powder as described later is prepared. A binder, solvent, dispersant, plasticizer, and the like are blended into the powder to obtain a desired composition, and slurry is prepared. After the defoaming treatment of the slurry, the sheet can be obtained by sheet molding methods such as a doctor blade method and reverse roll coater method.

Next, the molded sheets are processed by the predetermined processing method, and sheets 411, 416, 417 shown in FIGS. 13(*a*), 13(*b*) are prepared by the predetermined number, respectively. In the sheets 417, as shown, hole portions 415 substantially having the square shapes and slit-shaped sub-hole portions 425 continued to the hole portions 415 are disposed. For the sheet 416, the electrode 18 is disposed on one surface (front surface in the figure), and a conductive film 422 is formed on a position disposed opposite to the sub-hole portion 425 disposed in the sheet 417. On the other surface (back surface in the figure), although not shown, the electrode 19 is formed, and the conductive film is similarly formed on a position disposed opposite to the sub-hole portion 425. This sheet 416 constitutes the piezoelectric/electrostrictive element later.

A hole portion 315 substantially having the square shape is disposed in each sheet 411 as shown. For the shape of the hole portion 315, the hole portion 415 disposed in the sheet 417 and substantially having the square shape is enlarged in the Y-axis direction. That is, a side 442 of the hole portion 315 is obtained by enlarging a side 441 of the hole portion 415 in the Y-axis direction, and a side 443 of the hole portion 315 is obtained by enlarging a side 444 communicating with the sub-hole portion 425 in the hole portion 415 in the Y-axis (−Y) direction. A length of the side 442 expanded in the Y-axis direction with respect to the side 441 is determined by the shape of the convex member to be disposed. The difference in area between the sheet 417 and sheet 411 on the side of the side 441, in other words, a part of the sheet 411 seen from above when the sheet 417 is superposed upon the sheet 411 forms the convex member later. The length of the side 443 expanded in the Y-axis (−Y) direction with respect to the side 444 is determined by the shape of the stair-like member to be disposed. The expanded length of the Y-axis (−Y) direction indicates a difference in height between the mountain-side member and valley-side member.

Subsequently, these sheets 411, 416, 417 are stacked and press-bonded to obtain a ceramic green laminate 401 (see FIG. 13(*c*)). For the stacking method, in this example, as shown in FIGS. 13(*a*), 13(*b*), first, the sheet 416 is stacked so as to be held between the sheets 417 to obtain a ceramic green laminate unit 421. The ceramic green laminate unit 421 and sheet 411 are alternately stacked so that the uppermost and lowermost layers are constituted of the sheets 411. Needless to say, the sheets 411, 416, 417 may also be stacked at once. The number of laminates of the ceramic green laminate unit 421 may be determined by the number corresponding to the number of columns (rows) of the piezoelectric/electrostrictive device in which the piezoelectric/electrostrictive elements are arranged in the matrix form.

The ceramic green laminate 401 shown in FIG. 13(*c*) contains the piezoelectric/electrostrictive material which is the major component, and includes the closed holes and through holes 128 (see FIG. 13(*e*)) which exist in the laminate and are not shown in the figure. The closed holes are constituted of the hole portions 415 of the sheet 417. The through holes 128 are constituted of the sub-hole portions 425 disposed in the sheet 417. Moreover, the ceramic green laminate 401 is fired/integrated to obtain the ceramic laminate 403 (see FIG. 13(*d*)).

Next, as shown in FIG. 13(*d*), the unnecessary portions are cut/removed along cut lines 450, 460 to expose the through holes 128 as shown in FIG. 13(*e*), and a ceramic laminate 404 including thin open holes 405 is obtained as shown in FIG. 13(*f*). It is to be noted that one end surface of closed hole is cut/removed and accordingly opened to form the open holes 405. The cut line 450 extends vertically to the arrangement of the closed holes as shown (in parallel to the XZ plane), and extends on the side of the hole portion 315 of the sheet slightly from the side 442 of the sheet 411 constituting the ceramic green laminate 401 before the firing (front side in the figure). The cut line 460 extends vertically to the arrangement of the through holes 128 as shown (in parallel to the XZ plane), and extends on the side of the end surface of the ceramic laminate 403 from the side 443 of the sheet 411 constituting the ceramic green laminate 401 before the firing (front side in the figure).

It is to be noted that the ceramic laminate 404 shown in FIG. 13(*f*) shows the state that the ceramic laminate 404 shown in FIG. 13(*e*) has been raised by 90°. In the ceramic laminate 404 shown in FIG. 13(*e*), the surface in which the through holes 128 are opened (front side in the figure, XZ plane) forms the side surface, but in the ceramic laminate 404 shown in FIG. 13(*f*), the surface in which the through holes 128 are opened constitutes the lower surface.

Next, in the ceramic laminate 404 shown in FIG. 13(*f*), the unnecessary portions are cut/removed along cut lines 451 as shown to obtain the individually divided piezoelectric/electrostrictive elements 35 including the convex members 17 in the tip ends and the stair-like members 85 in the roots. Here, the unnecessary portions are portions which do not constitute the piezoelectric/electrostrictive elements 35. By the way of removing the unnecessary portion, the shape of the piezoelectric/electrostrictive element 35, and the interval (of the X-axis direction) between non-major-surfaces of the piezoelectric/electrostrictive elements 35 disposed adjacent to each other are determined. It is to be noted that the interval (of the Z-axis direction) between the major surfaces of the piezoelectric/electrostrictive elements 35 disposed adjacent to each other is determined beforehand by the thickness of the sheet 411. Thereafter, if necessary, the polarization treatment is carried out, and the guide-attached matrix-type piezoelectric/electrostrictive device 80 is completed in which the piezoelectric/electrostrictive elements 35 are arranged.

Figures 14A, 14B, 14C:
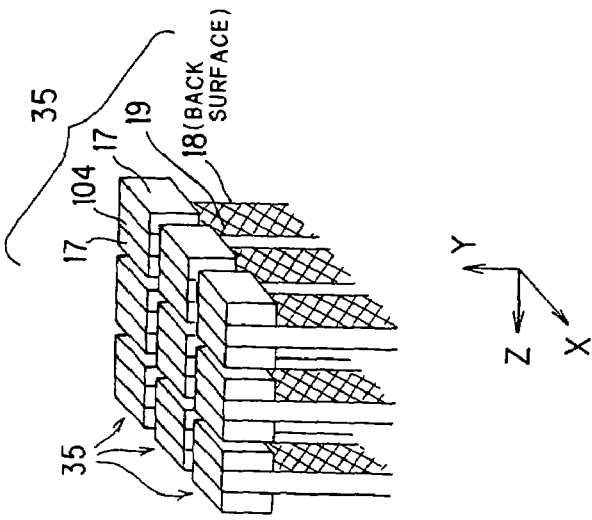
FIGS. 14(a) to 14(c) are perspective views of some of steps seen from another angle in the method for manufacturing the guide-attached matrix-type piezoelectric/electrostrictive device according to the present invention shown in FIGS. 13(a) to 13(g)

FIGS. 14(*a*) to 14(*c*) are diagrams showing the process of cutting the ceramic laminate 403 and incising the ceramic laminate 404 in the portions constituting the tip ends of the piezoelectric/electrostrictive elements 35 in an enlarged size and at a changed viewing angle. As shown in FIGS. 14(*a*), 14(*b*), the ceramic laminate 403 is cut vertically to the arrangement of the closed holes (in parallel to the XZ plane) so as to cut/remove a part of the sheet 411 constituting the ceramic green laminate 401 before the firing. In a cut surface, the closed holes are opened to form the open holes 405, the sheets 417 constituting the convex members 17 are cut from the tip ends of the sheets 416 constituting the piezoelectric/electrostrictive members 104, and a distance corresponding to the thickness of the sheet 411 corresponds to a gap G between the convex members 17 disposed opposite to each other. Moreover, as shown in FIGS. 14(*b*), 14(*c*), the ceramic laminate 404 is incised in a direction intersecting with the sheet 416 constituting the piezoelectric/electrostrictive member 104 and in a depth direction (Y-axis (−Y) direction) of the open hole 405.

In the present method, there is not a possibility of disconnection between the electrodes 18, 19 of the piezoelectric/electrostrictive element and the conductive film 421 (corresponding to the inner wall of the through hole), and conduction reliability is high. It is to be noted that in the stage of each sheet, the slit corresponding to the space between two piezoelectric/electrostrictive members (piezoelectric/electrostrictive elements) disposed adjacent to each other is disposed beforehand (the objects are the portion of the sheet 417 constituting the convex member later, and the sheet 416), and it is also possible to stack the sheets. In this case, it is not necessary to incise the ceramic laminate later. In the present method, the sub-hole portions 425 which are formed in the green sheet 417 and which constitute the through holes later do not communicate with the end of the green sheet, but the sub-hole portions 425 may be formed so as to communicate with the end. In this case, in the cutting of the ceramic laminate 403 shown in FIG. 13(*d*), the step of exposing the through holes 128 on the side of the sub-hole portion 425 (front side in the figure) is unnecessary.

In the manufacturing method, the surfaces of the sheet 416 on which the electrodes 18, 19 are formed are simply fired. The opposite surfaces of the sheet are not subjected to any mechanical processing, and remain to be unprocessed/fired to constitute the major surfaces of the piezoelectric/electrostrictive member 104. Therefore, in the major surfaces of the piezoelectric/electrostrictive member 104 constituting the piezoelectric/electrostrictive element 35, the crack generation probability is excessively low, the transgranularly fractured crystal grains do not exist in the crystal particles of the piezoelectric/electrostrictive material of the major surface, and the cut powder or the residual abrasive grain is not generated. That is, the obtained guide-attached matrix-type piezoelectric/electrostrictive device 80 is less-dust-generative.

In the method for manufacturing the guide-attached matrix-type piezoelectric/electrostrictive device according to the present invention, as the processing means for forming the hole portion in the sheet, any method can be used such as the punching processing method, ultrasonic processing method, and blast method. It is also possible to prepare the raw piezoelectric/electrostrictive sheet by press molding or cast molding instead of the so-called green sheet. As the processing method for the cutting/removing or the cutting, any method such as slicing processing, wire saw processing, laser processing, and water jet processing can be used. As the method for forming the electrode on the side surface (major surface) of the piezoelectric/electrostrictive member, sputtering, vacuum deposition, CVD, plating, coating, spraying, or screen printing can be carried out.

(5) Material

Subsequently, the materials for use in the piezoelectric/electrostrictive device according to the present invention will be described hereinafter.

First, the materials of the piezoelectric/electrostrictive member and the ceramic substrate, that is, the piezoelectric/electrostrictive materials will be described. The piezoelectric/electrostrictive material is not limited as long as the material produces electric field inductive strains such as a piezoelectric effect and electrostrictive effect. The material may be either crystalline or amorphous. Moreover, it is also possible to use a semiconductor ceramic, ferroelectric ceramic, or antiferroelectric ceramic. The material may appropriately be selected and employed in accordance with the application. The material may or may not require the polarization processing.

Furthermore, the material is not limited to the ceramic, and piezoelectric materials including polymer molecules of polyvinylidene fluoride (PVDF), or compound materials of the polymer molecules and ceramics may also be used. Additionally, in this case, from a viewpoint of heat resistance of a polymeric material, instead of firing and forming the element, a heat treatment of the polymeric material at a thermal hardening degree is carried out to form the element.

Concretely, for ceramic materials, examples of a piezoelectric or electrostrictive ceramic include ceramics containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, bismuth neodymium titanate (BNT), potassium sodium niobate, and strontium bismuth tantalite alone or as a mixture thereof or a solid solution thereof.

The ceramic is preferably the major component occupying 50 wt % or more in the ceramic constituting the piezoelectric/electrostrictive member or in the ceramic substrate component. Especially, the material has high electromechanical coupling coefficient and piezoelectric constant, and a stabilized material composition is easily obtained even through the firing step. Therefore, it is preferable to use a material containing: lead zirconate titanate (PZT-based); bismuth neodymium titanate (BNT-based); lead magnesium niobate (PMN-based); lead nickel niobate (PMN-based); a mixture or solid solution of lead zirconate, lead titanate, and lead magnesium niobate; or a mixture or solid solution of lead zirconate, lead titanate, and lead nickel niobate; or sodium bismuth titanate which is the major component.

It is to be noted that an average particle diameter of ceramic crystal grains is preferably 0.05 to 2 μm in the design in which the mechanical strength of the piezoelectric/electrostrictive member as a displacement generation section is regarded as important. This is because the mechanical strength of the piezoelectric/electrostrictive member which is the displacement generation section is enhanced. In the design in which expansion/contraction characteristics of the piezoelectric/electrostrictive member as the displacement generation section, the average particle diameter of crystal grains is preferably 1 to 7 μm. This is because high piezoelectric characteristics are obtained.

The material of a conductor for use in the electrode, through hole, and via-hole is not especially limited as long as the material is solid at room temperature. Examples of the material include: a single metal unit; an alloy; insulating ceramics such as zirconium oxide, hafnium oxide, titanium oxide, and cerium oxide and the single metal unit; and a mixture with the alloy without any problem. For the formation before the firing of the piezoelectric/electrostrictive member, more preferably, there are used: high-melting noble metals such as platinum, palladium, and rhodium; electrode materials containing alloys such as silver-palladium, silver-platinum, and platinum palladium as a major component; a mixture of platinum with basic materials or piezoelectric/electrostrictive materials; and cermet materials.

The material of the convex member or stair-like member preferably has a coefficient of thermal expansion close to that of the piezoelectric/electrostrictive member, especially contains a ceramic, and is preferably integrated with the piezoelectric/electrostrictive member by the firing, but may be the ceramic which is the same as or different from that of the piezoelectric/electrostrictive member. For example, it is possible to use stabilized zirconium oxide, aluminum oxide, magnesium oxide, titanium oxide, spinel, mullite, aluminum nitride, silicon nitride, glass, a mixture of these, and the like.

The piezoelectric/electrostrictive device and the method for manufacturing the device of the present invention have been described above. The piezoelectric/electrostrictive device mentioned in the present invention refers to a unit which uses the strain induced by the electric field to perform a considerable function, and includes an actuator, sensor, and the like in which the piezoelectric/electrostrictive element is used as the constituting element. In a narrow sense, the present invention is not limited to a piezoelectric/electrostrictive device which uses a piezoelectric effect for generating a strain amount substantially proportional to the applied electric field, or an electrostrictive effect for generating a strain amount substantially proportional to square of the applied electric field. The present invention also includes a piezoelectric/electrostrictive device which uses phenomena such as polarization reverse seen in general ferroelectric materials and phase transition between anti-ferroelectric phase and ferroelectric phase seen in an anti-ferroelectric material. Therefore, even when piezoelectric characteristics are simply described in the present specification, it should be understood that the characteristics based on these phenomena be included. It is appropriately determined based on properties of materials for use in the piezoelectric/electrostrictive member of the piezoelectric/electrostrictive element constituting the piezoelectric/electrostrictive device whether or not to carry out the polarization treatment. Therefore, when it is described in the present specification that the polarization treatment is carried out, it should be understood that a presumption is that the material requiring the polarization treatment be the object.

As described above in detail, a less-dust-generative piezoelectric/electrostrictive device according to the present invention realizes a continuously stable displacement operation over a long period while particles are inhibited from being generated. Above all, in a less-dust-generative matrix-type piezoelectric/electrostrictive device according to the present invention, in addition to inhibition of generation of particles, a plurality of piezoelectric/electrostrictive elements can be arranged at a super high density independently of one another. The device contributes to miniaturization of apparatuses to which the present invention is applied. Since the piezoelectric/electrostrictive element (piezoelectric/electrostrictive member) can be formed in an element having a high aspect ratio, it is possible to develop piezoelectric capabilities that a displacement amount is large, generative force is high, and a large amount of charges are generated.

On the other hand, for a guide-attached matrix-type piezoelectric/electrostrictive device of the present invention, a less-dust-generative mode is not essential. Excluding this effect, an effect similar to the above can be produced, and it is possible to inhibit the particles from being generated depending on the manufacturing method. When the piezoelectric/electrostrictive device according to the present invention is applied to optical communication devices such as an optical switch, optical add-drop multiplexers, and variable optical attenuator, image display apparatuses such as a display and projector, precision gas flow rate control apparatuses for a droplet discharge apparatus, micro-pump, and semiconductor manufacturing apparatus, or various types of sensors, it is possible to enhance reliabilities of these apparatuses over a long period and to miniaturize the apparatuses and to enhance the capabilities of the apparatuses.

What is claimed is:

1. A less-dust-generative piezoelectric/electrostrictive device comprising:
a thick ceramic substrate; and
a plurality of pillar shaped piezoelectric/electrostrictive elements which are formed integrally with the ceramic substrate and which extend upwardly from the ceramic substrate to form at least a 2×2 matrix, each of said piezoelectric/electrostrictive elements comprising a piezoelectric/electrostrictive member and at least one pair of electrodes formed on side surfaces of the piezoelectric/electrostrictive member,
wherein the side surfaces of the piezoelectric/electrostrictive member on which the electrodes are formed are fired, but unprocessed faces.

2. The less-dust-generative matrix-type piezoelectric/electrostrictive device according to claim 1, wherein an aspect ratio of the piezoelectric/electrostrictive element having the pillar shape is in a range of about 20 to 400.

3. The less-dust-generative matrix-type piezoelectric/electrostrictive device according to claim 2, wherein a distance between at least one pair of electrodes formed on side surfaces of the piezoelectric/electrostrictive member constituting the piezoelectric/electrostrictive element is 300 μm or less in a transverse surface of the piezoelectric/electrostrictive element having the pillar shape.

4. The less-dust-generative matrix-type piezoelectric/electrostrictive device according to claim 3, wherein a ratio of a distance between one piezoelectric/electrostrictive element and the other piezoelectric/electrostrictive element disposed adjacent to the piezoelectric/electrostrictive element to a height of the one piezoelectric/electrostrictive element is in a range of about 1:20 to 1:400.

5. The less-dust-generative matrix-type piezoelectric/electrostrictive device according to claim 1, wherein straightness of an axial line of the piezoelectric/electrostrictive element having the pillar shape is about 30 μm or less.

6. The less-dust-generative matrix-type piezoelectric/electrostrictive device according to claim 1, further comprising: positional deviation inhibition means which holds accuracy of a position of the piezoelectric/electrostrictive element.

7. The less-dust-generative matrix-type piezoelectric/electrostrictive device according to claim 6, wherein the positional deviation inhibition means is a member disposed in at least a tip end of the piezoelectric/electrostrictive member constituting at least one of the piezoelectric/electrostrictive elements disposed adjacent to each other among the plurality of piezoelectric/electrostrictive elements set up on the ceramic substrate.

8. The less-dust-generative matrix-type piezoelectric/electrostrictive device according to claim 7, wherein the piezoelectric/electrostrictive element includes a stair-like member in a root of the piezoelectric/electrostrictive member.

9. A guide-attached matrix type piezoelectric/electrostrictive device comprising:
a thick ceramic substrate;
a plurality of piezoelectric/electrostrictive elements which are set up in a matrix form on the ceramic substrate and each of which includes a piezoelectric/electrostrictive member and at least one pair of electrodes formed on side surfaces of the piezoelectric/electrostrictive member to have a pillar shape and which are integrally formed with the ceramic substrate; and
positional deviation inhibition means which holds accuracy of a position of the piezoelectric/electrostrictive element.

10. The guide-attached matrix-type piezoelectric/electrostrictive device according to claim 9, wherein the positional deviation inhibition means is a convex member disposed in at least a tip end of the piezoelectric/electrostrictive member constituting at least one of the piezoelectric/electrostrictive elements disposed adjacent to each other among the plurality of piezoelectric/electrostrictive elements set up on the ceramic substrate.

11. The guide-attached matrix-type piezoelectric/electrostrictive device according to claim 9, wherein the piezoelectric/electrostrictive element includes a stair-like member in a root of the piezoelectric/electrostrictive member.

12. The less-dust-generative piezoelectric/electrostrictive device according to claim 1, wherein the side surfaces of the piezoelectric/electrostrictive device on which the electrodes are formed have a homogenous surface.

13. A less-dust-generative piezoelectric/electrostrictive device comprising:
    a thick ceramic substrate; and
    a plurality of pillar shaped piezoelectric/electrostrictive elements which are formed integrally with the ceramic substrate and which extend upwardly from the ceramic substrate to form at least a 2×2 matrix, each of said piezoelectric/electrostrictive elements comprising a piezoelectric/electrostrictive member and at least one pair of electrodes formed on side surfaces of the piezoelectric/electrostrictive member,
    wherein the side surfaces of the piezoelectric/electrostrictive member on which the electrodes are formed are fired, but unprocessed faces, and the piezoelectric/electrostrictive elements are wired via a through hole or a via hole formed in the ceramic substrate.

14. A less-dust-generative piezoelectric/electrostrictive device comprising:
    a thick ceramic substrate; and
    a plurality of pillar shaped piezoelectric/electrostrictive elements which are formed integrally with the ceramic substrate and which extend upwardly from the ceramic substrate to form at least a 2×2 matrix, each of said piezoelectric/electrostrictive elements comprising two or more layers of piezoelectric/electrostrictive members and electrodes formed on opposite outer surfaces of the two or more layers of piezoelectric/electrostrictive members and between two or more layers of piezoelectric/electrostrictive members,
    wherein the surfaces of the piezoelectric/electrostrictive members on which the electrodes are formed are fired, but unprocessed faces.

* * * * *